(12) United States Patent
Von Känel

(10) Patent No.: US 11,367,747 B2
(45) Date of Patent: Jun. 21, 2022

(54) ELECTROMAGNETIC RADIATION DETECTOR BASED ON WAFER BONDING

(71) Applicant: G-ray Switzerland SA, Hauterive (CH)

(72) Inventor: Hans Von Känel, Wallisellen (CH)

(*) Notice: Subject to any disclaimer, the term of this patent is extended or adjusted under 35 U.S.C. 154(b) by 0 days.

(21) Appl. No.: 16/487,457

(22) PCT Filed: Mar. 1, 2018

(86) PCT No.: PCT/IB2018/000166
§ 371 (c)(1),
(2) Date: Aug. 21, 2019

(87) PCT Pub. No.: WO2018/158631
PCT Pub. Date: Sep. 7, 2018

(65) Prior Publication Data
US 2019/0371853 A1 Dec. 5, 2019

Related U.S. Application Data

(60) Provisional application No. 62/465,199, filed on Mar. 1, 2017.

(51) Int. Cl.
*H01L 27/146* (2006.01)
*G01N 23/046* (2018.01)
(Continued)

(52) U.S. Cl.
CPC ..... *H01L 27/14649* (2013.01); *G01N 23/046* (2013.01); *H01L 23/544* (2013.01); *H01L 27/1463* (2013.01); *H01L 27/1464* (2013.01); *H01L 27/1465* (2013.01); *H01L 27/1469* (2013.01); *H01L 27/14636* (2013.01); *H01L 27/14658* (2013.01); *H01L 27/14659* (2013.01); *H01L 27/14676* (2013.01); *H01L 27/14689* (2013.01); *H01L 27/14694* (2013.01); *H01L 27/14696* (2013.01); *H01L 31/028* (2013.01); *H01L 31/02966* (2013.01); *H01L 31/03046* (2013.01); *H01L 31/107* (2013.01); *H01L 31/1804* (2013.01); *H01L 31/1812* (2013.01); *H01L 31/1832* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 2001/0032934 | A1* | 10/2001 | Lee | G01T 1/2935 250/370.09 |
| 2017/0373110 | A1* | 12/2017 | Von Kanel | H01L 21/76251 |
| 2018/0166475 | A1* | 6/2018 | Chen | H01L 27/1463 |

OTHER PUBLICATIONS

Deptuch G W et al:"Vertically Integrated Circuits at Fermilab", IEEE Transactions on Nuclear Science, IEEE Service Center, New York, NY,US,vol. 57,No. 4, Aug. 1, 2010, p. 2178-2186.

* cited by examiner

*Primary Examiner* — Suberr L Chi
(74) *Attorney, Agent, or Firm* — Da Vinci Partners LLC; John Moetteli

(57) ABSTRACT

Monolithic pixel detectors, systems and methods for the detection and imaging of electromagnetic radiation with high spectral and spatial resolution comprise a Si wafer with a CMOS processed pixel readout bonded to an absorber wafer in wafer bonds comprising conducting bonds between doped, highly conducting charge collectors in the readout and highly conducting regions in the absorber wafer and poorly conducting bonds between regions of high resistivity.

38 Claims, 20 Drawing Sheets

(51) Int. Cl.
*H01L 31/107* (2006.01)
*H04N 5/378* (2011.01)
*H01L 23/544* (2006.01)
*H01L 31/028* (2006.01)
*H01L 31/0296* (2006.01)
*H01L 31/0304* (2006.01)
*H01L 31/18* (2006.01)

(52) U.S. Cl.
CPC ...... *H01L 31/1844* (2013.01); *H01L 31/1892* (2013.01); *H04N 5/378* (2013.01); *H01L 27/14634* (2013.01); *H01L 27/14638* (2013.01); *H01L 27/14661* (2013.01); *H01L 2223/54426* (2013.01); *H01L 2223/54493* (2013.01)

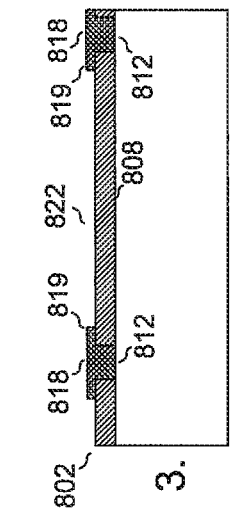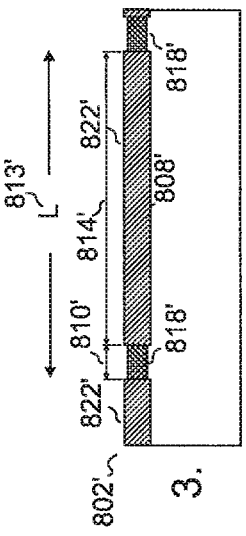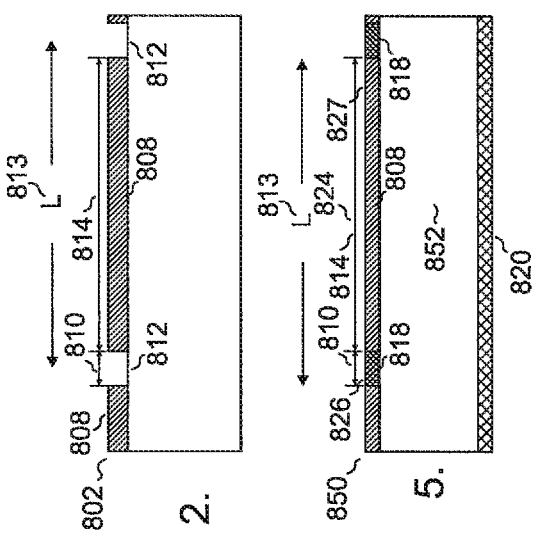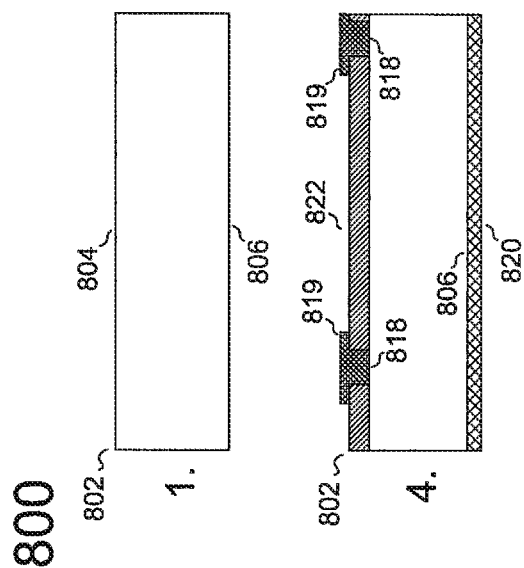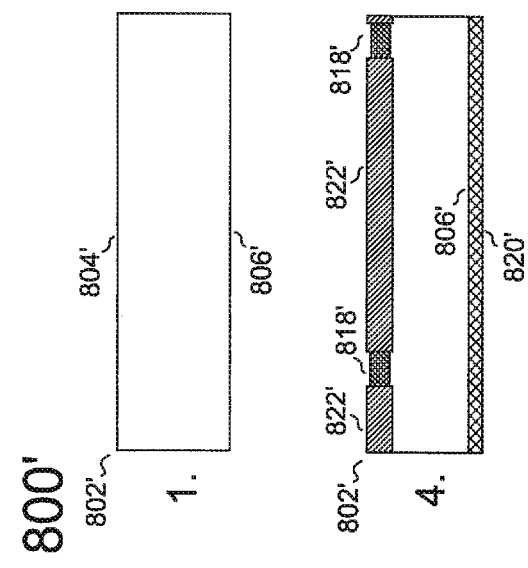
FIG. 7A
FIG. 7B

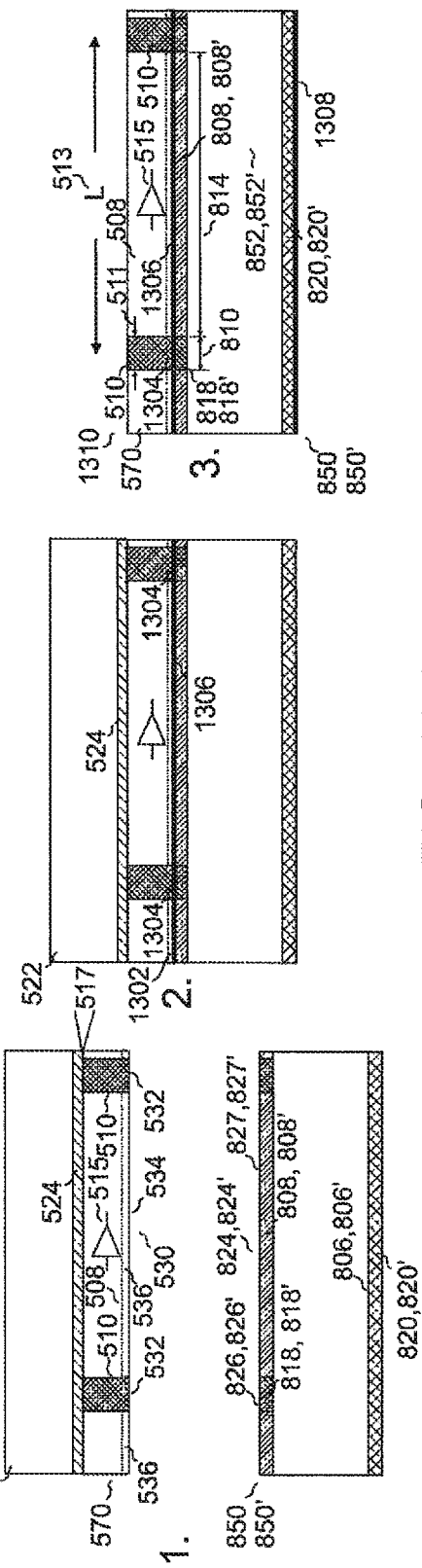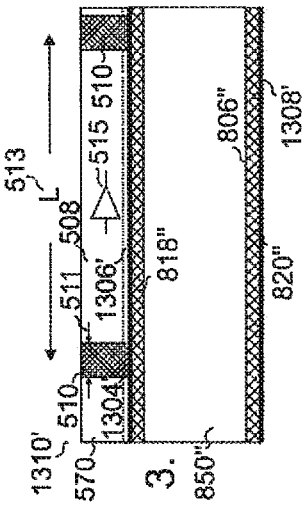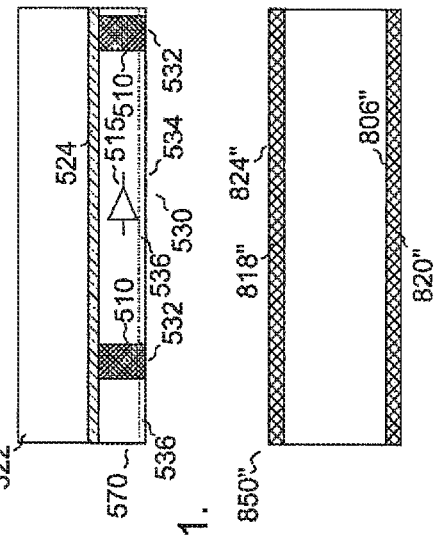
FIG. 12A
FIG. 12B

ELECTROMAGNETIC RADIATION DETECTOR BASED ON WAFER BONDING

CROSS REFERENCE TO RELATED APPLICATIONS

This application claims priority to and benefit of U.S. Provisional Application No. 62/465,199 filed 1 Mar. 2017, which is incorporated herein by reference and relied upon.

FIELD OF THE INVENTION

The invention relates to pixel detectors made from monolithic, Complementary Metal Oxide Semiconductor (CMOS) integrated structures for the detection and imaging of electromagnetic radiation, and to methods for forming such structures.

BACKGROUND OF THE INVENTION

Current digital imaging devices for electromagnetic radiation detection, also called pixel detectors, can be classified into two broad classes, distinguished by the way in which impacting photons are converted into electrical signals. Taking X-ray photons as an example, in the first one of these classes the conversion happens indirectly in the sense that X-ray photons are first down-converted in energy to visible photons in a scintillation layer. The visible photons are subsequently detected by an array of photodiodes, in which the optical generation of electron-hole pairs gives rise to electrical signals which are then further processed by a readout electronics and represented as an image on a computer screen. The two-stage conversion process of indirect X-ray imaging devices suffers from the drawback of limited conversion efficiency and spatial resolution because of losses and scattering occurring both during the conversion of X-rays into visible photons and in the detection of those. Typically about 25 electron-hole pairs are finally measured by the readout electronics per keV of incident X-ray energy.

In the second class of these pixel detectors semiconductor absorbers permit the direct conversion of X-rays into electron-hole pairs which can then be measured as an electrical signal by a readout electronics. In addition to superior sensitivity and higher spatial and temporal resolution compared to scintillator-based indirect conversion, such absorbers offer also spectral resolution, since the energy of an incident X-ray photon is proportional to the number of generated electron-hole pairs and thus measurable by a pulse height analysis. In silicon (Si), one needs on average 3.6 eV to create a single electron-hole pair (see for example R. C. Alig et al. in Phys. Rev. B 22, 5565 (1980); and R. C. Alig in Phys. Rev. B 27, 968 (1983), the entire disclosures of which are hereby incorporated by reference). On average this leads to 280 electron-hole pairs per keV of absorbed X-ray energy, from which it can be seen that the conversion efficiency exceeds that of a scintillator-photodiode combination by more than a factor of ten.

X-ray imaging detectors, or pixel sensors in general, employing direct conversion by means of semiconductor absorbers, can be implemented in different ways. One approach used in commercial flat panel fabrication is based on polycrystalline or amorphous materials directly deposited on the readout electronics made from thin film transistors. For example flat panel X-ray imaging detectors with amorphous selenium absorbers for medical applications are relatively inexpensive to make and offered in large sizes (see for example S. Kasap et al. in Sensors 11, 5112 (2011), the entire disclosure of which is hereby incorporated by reference). Materials in the form of single crystals offer, however, much better transport properties compared with their polycrystalline and amorphous counterparts. They therefore should provide improving detector performance. Single crystal absorbers are on the other hand incompatible with readout electronics comprising amorphous thin film transistors. They can in principle be epitaxially grown on CMOS processed readout wafers, but usually only at the expense of an intolerably high thermal budget, requiring special metallization schemes compatible with elevated process temperatures (see for example U.S. Pat. No. 8,237,126 to von Kanel, the entire disclosure of which is hereby incorporated by reference). Typically, with standard aluminium metallization, temperatures have to be kept below 450° C.

In order to be compatible with CMOS processed readout electronics, the electrical connections between absorber and readout wafers needed to process the electrical signal from every absorber pixel, have to be realized by a low-temperature wafer bonding process. The most common bonding technique is bump bonding, as used for example by the Medipix collaboration (medipix.web.cern.ch) or by Dectris A G (dectris.ch). Bump bonding of detector areas beyond a few $cm^2$ is not only a costly technique but also limits the pixel size typically to about 50 µm. The absorber can in principle consist of any semiconductor material suitable for energetic particle detection from which large single crystals can be grown, for example Si, Ge, GaAs and CdTe or CdZnTe alloys (see for example European Patent No. 0571135 to Collins et al., the entire disclosure of which is hereby incorporated by reference). Bump bonding for example with In micro-bumps is also used for the fabrication of infrared focal plane arrays, where a pixel size of 15 µm is in production and 10 µm or even smaller appears feasible. Typically, these arrays are much smaller in area than the ones used for X-ray imaging, hardly ever exceeding about 1 $cm^2$ (see for example P. Bensussan et al. in Proc. of SPIE, Vol. 7298, pp. 72982N-1-72982N-31 (2009), the entire disclosure of which is hereby incorporated by reference). For infrared imaging, additional absorber materials are in use, such as InGaAs alloys, InSb and HgCdTe alloys.

While for large X-ray detectors it is hard to push the pixel size to below about 50 µm with ordinary bump bonding, there are other bonding technologies potentially offering higher detector resolution. One of them is for example known from the vertical integration of integrated circuits, so-called 3D-IC technology. Here, bump bonding is replaced by fusion bonding, comprising oxide-to-oxide fusion bonding along with metal-to-metal bonding of metallic pads surrounded by oxide. The resulting structures are indistinguishable from genuine monolithic configurations (see for example G. W. Deptuch et al. in IEEE Trans. Nucl. Sci. 57, 2178 (2010), the entire disclosure of which is hereby incorporated by reference). For this reason we shall in the following consider heterostructures made by direct wafer bonding as monolithic as if they were fabricated for example in the form of epitaxial wafer stacks.

In yet another bonding technique, an electrically conductive, covalent semiconductor bond is formed at low temperature between the absorber wafer and the readout wafer. Covalent semiconductor bonding essentially leads again to a monolithic structure (see for example International Patent Application No. WO 2016/097850 to von Känel, the entire disclosure of which is hereby incorporated by reference). In contrast to the well-known hydrophobic and hydrophilic bonding techniques in which the surfaces are respectively hydrogen or oxide covered prior to the bonding, covalent semiconductor bonding requires the surfaces to be atomically clean, especially when silicon is one of the bonding partners. Covalent semiconductor bonding can therefore only be carried out in a high vacuum or even ultra-high vacuum tool. In an ideal situation, when two perfectly flat semiconductor wafers to be covalently bonded are very accurately aligned, neither with any mutual twist nor tilt, the dangling bonds on the two surfaces form covalent bonds that are indistinguishable from the bonds formed during epitaxial growth once the two wafers are brought into contact. Evidently, in practice such an ideal situation never occurs, and finite surface roughness and misalignment always lead to a finite number of interfacial defects, even when the two wafers are made from the same semiconductor material. Depending on the CMOS process used the pixel size can vary in a wide range for example of about 100-200 µm, 50-100 µm or 20-50 µm or even 5-20 µm.

In this bonding approach, charge carriers are generated by backside illumination, wherein the absorber wafer is bonded on the thinned Si substrate of the readout wafer on the opposite side of the CMOS stack consisting of metal and dielectric layers. The charges then have to cross the covalently bonded semiconductor interface in order to be collected by charge collectors on the readout wafer. The electric field required to separate electron-hole pairs excited by electromagnetic radiation in the absorber is thereby generated by a reverse-biased p-n junction present between the readout wafer and the absorber wafer both of which are lightly doped and of opposite doping type. Examples of prior art may be seen in FIGS. 1A-1C showing three different embodiments 10, 20 and 30 of covalently bonded detector structures (see for example International Patent Application No. PC171B2017/001032 to von Kanel, the entire disclosure of which is hereby incorporated by reference). The silicon layer 12, 22, 32 with the CMOS processed pixel readout electronics is indicated schematically in these figures while the CMOS stack on top of it, comprising multiple oxide and metal layers, is not shown. The Si substrate of the readout wafer has to be thinned to typically 10-20 µm in order to facilitate its depletion along with that of absorber wafer 14, 24, 34 when a reverse voltage 17, 27, 37 is applied across p-n junction 16, 26, 36 so that charges stemming from electron-hole pairs generated by X-ray absorption can cross bonded interfaces 18, 28, 38 in order to be collected by charge collectors 19, 29, 39 and processed by the readout electronics. In order to permit the thinning of the Si substrate of the readout wafer, the CMOS stack on its front side is first planarized and bonded to a carrier wafer (also called handling wafer). After this mechanical stabilization step, the backside of the Si substrate can then be thinned to the required thickness (see for example International Patent Application No. PCT/IB2017/001032 to von Kanel, the entire disclosure of which is hereby incorporated by reference). The pixel size of the detector is given by the spacing of charge collectors 19, 29, 39, only one of which is shown in FIGS. 1A-1C. In embodiments 10-30, the p-n junction is located right at the bonded interface (FIG. 1A, FIG. 1C) or either in the readout (FIG. 1B) or in the absorber wafer. Therefore, the bonded interface necessarily lies in the depletion region of the reverse biased p-n junction. Even under optimal conditions, the bonded interface contains defects, such as dislocations arising from slight wafer misalignment (see for example T. Akatsu et al. in J. Mat. Sci. 39, 3031 (2004), the entire disclosure of which is hereby incorporated by reference). Interfacial defects may cause potential barriers which negatively affect charge transport across a bonded interface (see for example S. Bengtsson et al. in J. Appl. Phys. 66, 1231 (1989), the entire disclosure of which is hereby incorporated by reference). Moreover, crystal defects are usually associated with electronic states in the band gap. If they are for example located within the depletion region of a p-n junction, they may act as generation-recombination centers which enhance reverse leakage currents (see for example W. Shockley et al. in Phys. Rev. 87, 835 (1952), the entire disclosure of which is hereby incorporated by reference). Such defects are generated also during the removal of the surface oxide of the bonding partners by sputtering, causing their surfaces to be amorphized, which in turn results in a thin amorphous layer at the bonded interface (see for example C. Flotgen et al. in ECS Transactions 64, 103 (2014), the entire disclosure of which is hereby incorporated by reference). The electronic states associated with such defects may be passivated to some extent by hydrogen (see for example A. Loshachenko et al. in Phys. Status Solidi C 10, 36 (2013) and International Publication No. WO 2017/141103 to von Kanel, the entire disclosures of which are hereby incorporated by reference). It is neither certain, however, that hydrogen passivation will cause fully unimpeded charge transport across the bonded interface between lightly doped bonding partners, nor is there a guarantee for long term stability of the passivation under detector operation.

There is hence a need for covalently bonded detector structures which do not suffer from increased leakage currents generated by defect related states in the band gap. There is a need for structures and processes capable of minimizing the effect of generation/recombination currents generated by defect states created during surface activation and wafer bonding.

SUMMARY OF THE INVENTION

A monolithic CMOS integrated pixel detector is provided for the detection of electromagnetic radiation configured for backside illumination. The detector is made up of a silicon readout wafer, and an absorber wafer. The silicon readout wafer is made from silicon of a first doping type, comprising CMOS pixel readout electronics processed in a thin silicon layer and including highly conducting doped regions of a second doping type acting as charge collectors spaced at the pixel size which communicate with the readout electronics, and at least one wafer alignment feature. The readout wafer is made up of wafer bonds. The absorber wafer is made from at least one single crystal semiconductor material. The absorber wafer also comprises highly conducting doped regions, and at least one wafer alignment feature. The monolithic CMOS integrated pixel detector consists of the readout wafer bonded, in an aligned manner, to the absorber wafer. The wafer bonds comprise conducting bonds between the readout wafer and the absorber wafer and poorly conducting bonds between the readout wafer and the absorber wafer, the poorly conducting bonds electrically isolating neighboring pixels to force charges generated in the absorber wafer to cross the conducting bonds and to be received by the charge collectors for processing by the pixel readout electronics when the detector is in operation.

It is an object of the invention to provide a monolithic CMOS integrated pixel sensor suitable for electromagnetic radiation detection and imaging.

It is another object of the invention to provide a monolithic pixel sensor suitable for electromagnetic radiation detection and imaging, wherein the readout electronics and a single crystalline absorber are juxtaposed on opposite sides of a CMOS processed silicon wafer.

It is yet another object of the invention to provide a monolithic CMOS integrated pixel sensor suitable for electromagnetic radiation detection and imaging which is fabricated by low temperature direct wafer bonding of readout and absorber wafers.

It is a further object of the invention to provide a monolithic pixel sensor suitable for the detection and imaging of infrared, visible, ultraviolet or soft X-ray radiation which is fabricated by bonding a thin absorber layer onto a CMOS processed wafer with the readout electronics.

It is a further object of the invention to provide a monolithic pixel sensor suitable for high-energy X-ray detection and imaging which is fabricated by bonding a CMOS processed wafer with the readout electronics onto a high-Z absorber layer.

It is yet a further object of the invention to provide a monolithic pixel sensor suitable for energy-resolved X-ray detection and imaging.

It is yet another object of the invention to provide a monolithic pixel sensor capable of single-photon detection.

It is yet a further object of the invention to provide simple processes for the fabrication of monolithic pixel detectors comprising a thin readout wafer covalently bonded to an absorber wafer of the opposite conduction type (i.e. opposite effective doping type).

It is an object of the invention to provide covalently bonded pixel sensors in which defects present at or near the bonding interface do not affect detector leakage.

The invention teaches the structure and fabrication methods of monolithic pixel detectors for electromagnetic radiation. The pixel detectors comprise a thin. Si wafer with CMOS processed readout electronics communicating with a single crystalline absorber forming a monolithic unit. This monolithic unit is formed by wafer bonding a thinned, CMOS processed Si readout wafer onto an absorber wafer to collect and process the electrical signals generated by electromagnetic radiation incident on the absorber. These and other objects of the invention are described in the drawings, specification and claims.

In the description of this invention, the terms "pixel detector" and "pixel sensor" are considered as synonyms describing the detector as a whole. Likewise, the terms "absorber wafer" and "sensor wafer" are considered synonyms of the detector part in which electromagnetic radiation is absorbed.

BRIEF DESCRIPTION OF THE DRAWINGS

FIG. 7A is the process flow of the invention for the fabrication of an absorber wafer of the invention comprising implants and oxide regions for pixel isolation.

FIG. 7B is the process flow of the invention for the fabrication of an absorber wafer of the invention comprising metal regions along with oxide regions for pixel isolation.

DETAILED DESCRIPTION OF THE PREFERRED EMBODIMENTS

Figure 1A:
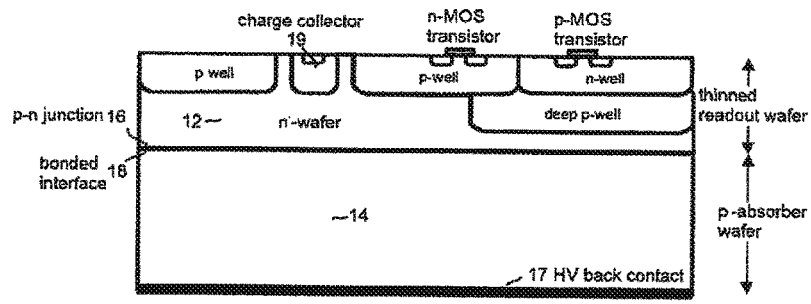
FIG. 1A is a cross-section of a monolithic pixel detector of the invention with the p-n junction between $n^-$-doped readout wafer and $p^-$-doped absorber wafer at the bonded interface.
Figure 1B:
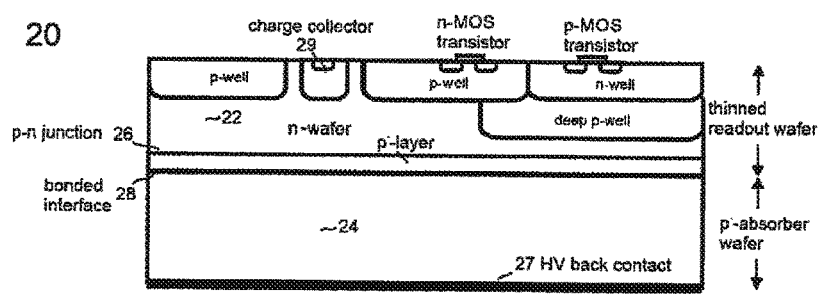
FIG. 1B is a cross-section of a monolithic pixel detector of the invention with the p-n junction inside the $n^-$-doped readout wafer which is bonded to a $p^-$-doped absorber wafer.
Figure 1C:
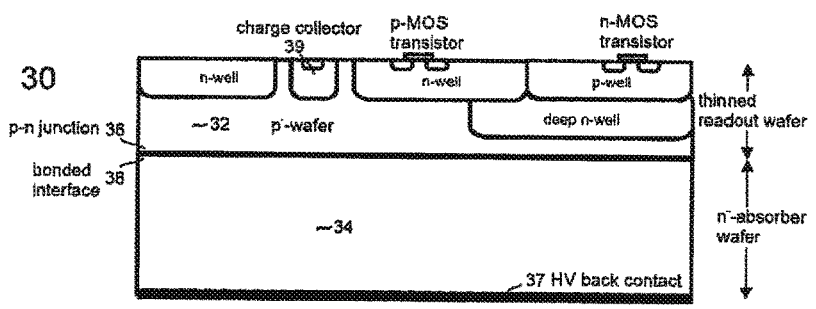
FIG. 1C is a cross-section of a monolithic pixel detector of the invention with the p-n junction between $p^-$-doped readout wafer and $n^-$-doped absorber wafer at the bonded interface.

It is the aim of this invention to provide simple structures and methods for the fabrication of sensitive pixel detectors for the detection of electromagnetic radiation, such as for example flat panel X-ray detectors with sizes up to about 20×20 cm$^2$ or even about 40×40 cm$^2$ and high-resolution detectors for the detection of infrared radiation. The detectors are composed of a readout unit processed in a thin CMOS wafer the backside of which is bonded to an absorber wafer, also called sensor wafer. These detectors are all configured for backside illumination, where electromagnetic radiation is incident on the absorber from the opposite side of the CMOS stack. The bonding happens on a wafer scale, and at least the bonds serving for charge collection are made between electrically highly conducting regions of the readout wafer and the absorber wafer, such as for example covalent semiconductor bonds between heavily doped semiconductors. The readout electronics is processed for example in an epitaxial Si layer with a thickness of about 10-30 µm or preferably about 5-10 µm or even 3-5 µm and a resistivity above about 500 Ωcm or preferably about 1-2 kΩ cm or more preferably 2-5 kΩ cm or even above 5 kΩ cm, for example 5-50 kΩ cm, the resistivity being due to a low doping level in between about $10^{11}$ to $10^{13}$ cm$^{-3}$ of a first conduction type (for example p-conduction induced by p-doping). For ease of detector manufacturing it may be advantageous to use silicon-on-insulator (SOI) wafers for the CMOS processing of the readout electronics. The detectors can detect electromagnetic radiation in a single photon detection mode. The sensor material can comprise any semiconductor available in the form of high purity wafers or in the form of epitaxial layers grown on a substrate, whereby the substrate can for example be Si, Ge, GaAs, CdTe, a CdZnTe alloy or InSb, which may optionally be removed during detector fabrication. The thickness and the material used for the sensor strongly depend on the energy of the electromagnetic radiation which is to be detected. For the detection of low energy radiation from about one tenth of an eV up to a few keV, covering a spectral range from infrared to visible, ultraviolet and soft X-rays, a thickness on the order of µm or even less may be sufficient. There are many II/VI, III/V and group IV semiconductors covering this energy range, such as for example HgCdTe alloys, InSb, InGaAs alloys, Ge, Si, SiGe alloys, InP, GaAs, InGaN alloys, GaN, C (diamond) in the order of increasing bandgap. As an example, for near infrared detection a Ge layer as thin as 0.5-1.5 µm or even 0.3-0.5 µm may be sufficient for efficient sensing. Wafer bonding may therefore have to be combined with wafer thinning, for example by hydrogen implantation and exfoliation (see for example I. P. Ferain et al., in J. Appl. Phys. 107, 054315 (2010), the entire disclosure of which is hereby incorporated by reference). The sensitivity of infrared detectors may be further enhanced by incorporating an avalanche charge multiplication region communicating with the absorption region of the absorber wafer. In the region between soft X-ray to hard X-ray detection, for example a SiC sensor with a thickness of about 3.5, 332 and 2310 µm may absorb 90% of incident photons with energies of 2, 10 and 20 keV, respectively. A Si sensor with a thickness of about 3.9, 334 and 2330 µm may absorb 90% of incident photons with energies of 2, 10 and 20 keV, respectively. For a Ge or GaAs sensor, the thickness necessary to absorb 90% of the incident photons with energy of 20, 30 and 40 keV is about 105, 320 and 710 µm, respectively. For example a $Si_{0.2}Ge_{0.8}$ alloy would have to be about 25% thicker for the same absorption at these photon energies. Even harder X-rays of 40, 60 and 80 keV are absorbed to the same extent by a CdTe sensor or a CdZnTe alloy sensor whose thickness amounts to about 210, 610 and 1310 µm, respectively (NIST X-ray attenuation data base, nist-.gov/pml/data/ffast). The room temperature resistivity of intrinsic Ge is about 47 Ωcm and that of a $Si_{0.25}Ge_{0.75}$ alloy approximately 6×10$^4$ Ωcm (see for example virginiasemi-.com/pdf/generalpropertiesSi62002.pdf). X-ray detectors comprising Ge or SiGe absorbers therefore need to be cooled in order to lower dark leakage currents to acceptable levels for example of 1 nA per pixel or even between 10-100 pA. With respect to Ge and SiGe sensors, GaAs sensors have the advantage of much higher resistivity on the order of 10$^9$ Ωcm (see for example M. C. Veale in Nucl Instr. Meth. Phys. Res, A 752, 6 (2014), the entire disclosure of which is hereby incorporated by reference). The same order of resistivity applies to CdTe sensors and even a higher one for CdZnTe alloy sensors (see for example S. Del Sordo et al. in Sensors 2009, 9, 3491-3526, the entire disclosure of which is hereby incorporated by reference).

The structures and methods of the invention refer to industrial scale wafers. High vacuum bonding equipment for 200 mm wafers is manufactured for example by EV Group (see for example C. Flotgen et al. in ECS Transactions 64, 103 (2014), the entire disclosure of which is hereby incorporated by reference).

By construction, the monolithic pixel detectors of the invention are expected to offer single-photon detection. The monolithic X-ray pixel detectors of the invention are therefore suitable also for energy discrimination, whereby the energy of photons incident on the absorber can be measured by analysing the height of the electrical pulses processed by the readout electronics.

In contrast to prior art approaches (see for example International Patent Application No. WO 2016/097850 to von Kanel, and International Patent Application No. PCT/

IB2017/001032 to von Känel, the entire disclosures of which are hereby incorporated by reference) in the present invention charge carriers do not cross a bonding interface between lightly doped materials prior to arriving at charge collectors communicating with the readout electronics. The charges are instead channelled through bonding interfaces between electrically highly conducting regions where minority carrier generation and recombination does not occur. In all the following embodiments, the pixel detectors are configured for backside illumination, wherein electromagnetic radiation is incident on the absorber bonded on the backside of a thin silicon CMOS substrate with the CMOS stack on the opposite side.

Figure 1D:
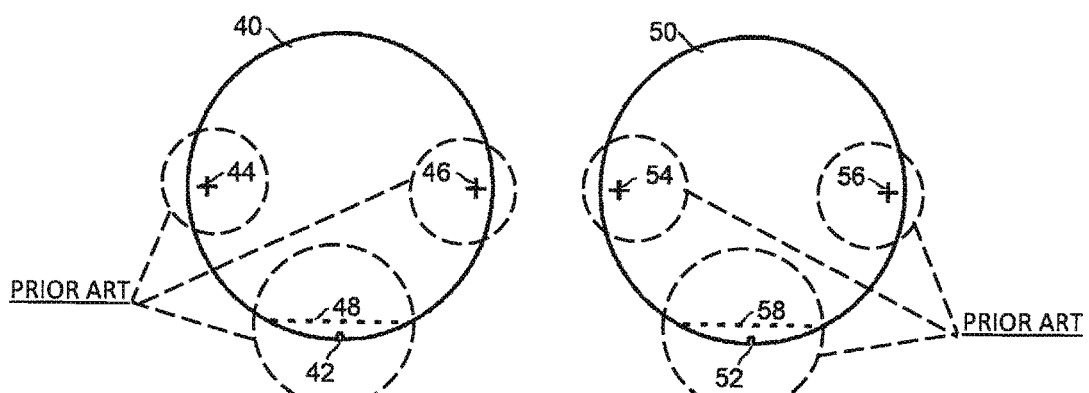
FIG. 1D is a plan-view of a top wafer and a bottom wafer with alignment features.
Figure 2A:
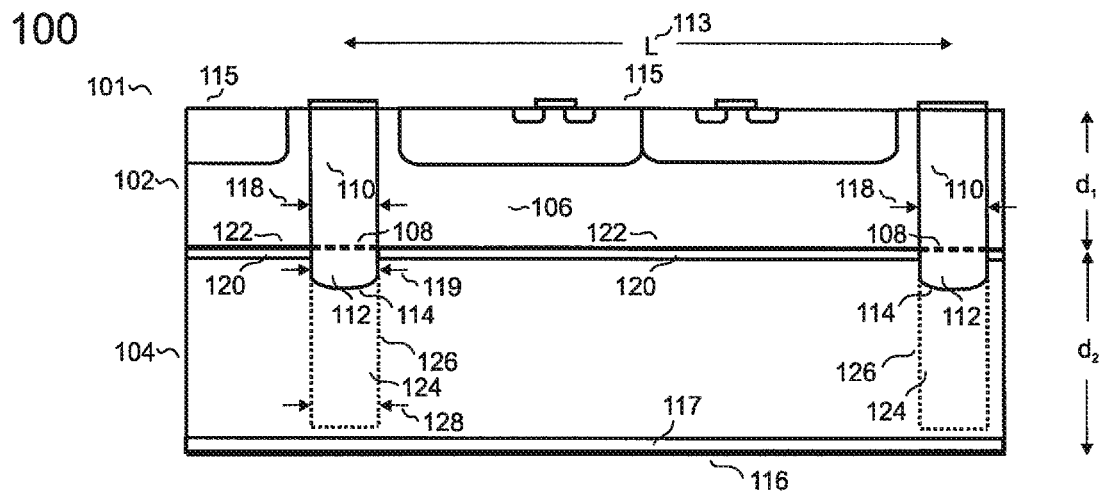
FIG. 2A is a cross-section of a monolithic pixel detector of the invention with charge collection through covalent semiconductor bonds between $n^+$-doped regions in readout and absorber wafer and oxide-to-oxide bonds for pixel isolation.

Referring now to FIG. 2A, first exemplary embodiment 100 of monolithic pixel detector 101 adapted to the detection of X-rays comprises a bonding interface between thin readout wafer 102 of thickness $d_1$ and absorber wafer 104 of thickness $d_2$. The readout wafer is preferably fabricated for example by CMOS processing a weakly p-doped substrate 106 with a resistivity preferably of about 1-2 kΩ cm or even 2-5 kΩ cm which is thinned to a thickness of about 10-30 µm or preferably about 5-10 µm or even 3-5 µm after all the processing has been completed. The thinning requires the planarization of the CMOS stack and the bonding of a carrier wafer before substrate 106 can be thinned The bonding interface consists of conducting covalent semiconductor bond 108 between structures resembling silicon-through-vias 110 but filled with highly conducting $n^+$-doped semiconductor material forming an $n^+$-p junction with weakly p-doped substrate 106. In the following, these $n^+$-doped vias, extending through substrate 106 will simply be called plugs 110. Plugs 110 form ohmic contacts with highly conducting $n^+$-doped regions 112 in highly resistive p-conducting absorber wafer 104, which may for example be heavily doped implants. The doping level of highly conducting plugs 110 may for example be between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, corresponding to a resistivity between about 5-20 mΩ cm, 0.7-5 mΩ cm and 0.2-0.7 mΩ cm, respectively. Highly conducting regions 112 may have similar doping levels. Heavily doped plugs 110 may be formed for example by etching holes in lightly p-doped substrate 106 and their filling with $n^+$-material in a subsequent epitaxy step known in the art. In another aspect of embodiment 100 a similar epitaxy process instead of implants 112 may result in heavily doped columns 124 doped to similar levels extending through most or all of absorber wafer 104. Optionally, absorber wafer 104 may further comprise heavily p-doped layer 117, facilitating ohmic contact formation with metallic back contact 116. Heavily doped plugs 110 bonded to heavily doped implants 112 or columns 124 serve as charge collectors, collecting electrons from electron-hole pairs which are generated by electromagnetic radiation incident on absorber wafer 104 and separated in the electric field of the reverse biased p-n junction 114, 126, formed by $n^+$-doped regions 112, 124 and highly resistive p-conducting absorber wafer 104, upon applying a voltage to back contact 116 on absorber wafer 104. Minority carriers (electrons) thus never move across a bonding interface between low-doped wafers where trapping and recombination might occur. The charge collectors 110 communicate with the pixel readout electronics 115 of readout wafer 102 wherein the charge pulses generated by electromagnetic radiation are processed and forwarded to the off-pixel part of the readout electronics. The detector pixels are defined by the heavily doped plugs/regions 110/112, 110/124 the width 118, 119, 128 of which may for example range within about 0.5-2.5 µm or preferably about 1-1.5 µm. Width 118 of heavily doped plugs 110 in readout wafer 102 and width 119, 128 of heavily doped regions 112, 124 in absorber wafer 104 do not need to be equal but preferably at least one of them is in the range of at least 1-1.5 µm to facilitate accurate alignment of wafers 102, 104 for bonding. In order to permit accurate alignment thin readout wafer 40, 102 and absorber wafer 50, 104 are both equipped with at least two special wafer alignment features (FIG. 1D) in the form of alignment marks 44, 46; 54, 56 positioned for example close to the wafer edges on opposite sides. With the help of superimposing such alignment marks the rotational misalignment of 200 mm wafers may be kept within about $(2-5)\times10^4$ degrees and the lateral misalignment within about 0.5-1 µm. Similar accuracy may be obtained in case of smaller wafer bonding. For example EVGroup offers an alignment tool with an accuracy below 1 µm (see, e.g., https://www.evgroup.com/fileadminimedia/products/bonding/Permanent_Bonding/combond/EVG_ComBond_Brochure.pdf, the entire disclosure of which is hereby incorporated by reference). The distance L between doped plugs 110 contacting regions 112/124 defines the pixel size 113 which can vary in a wide range within about 100-200 µm, 50-100 µm or 20-50 µm or even 5-20 µm. Using doped columns 124 instead of implants 112 has the advantage of easier depletion of absorber 104 at lower voltages applied to back contact 116 when the pixel size is smaller than the absorber thickness $d_2$. Heavily doped implants 112 in absorber wafer 104 are surrounded by highly resistive regions 120 the resistivity of which is higher than that of implants 112 by at least a factor of $10^4$-$10^6$. Regions 120 may even be insulating regions, such as oxide regions and form poorly conducting or electrically insulating semiconductor-to-oxide or oxide-to-oxide bond 122 between readout and absorber wafer the resistance of which is higher by at least a factor of $10^3$-$10^4$, or preferably $10^4$-$10^6$, or even more preferably $10^6$-$10^8$ than that of bond 108. These highly resistive regions hence insulate the low-doped regions of readout wafer 102 (i.e. substrate 106) from low-doped, highly resistive absorber wafer 104, such that the only electrical connection between the two wafers is made between heavily doped regions 110 and 112, 124. At the same time regions 120 isolate adjacent pixels electrically from each other.

The pixel detector according to embodiment 100 is designed for detecting electrons from the electron-hole pairs generated by X-rays in absorber wafer 104. In an aspect of the embodiment the detector may be designed for hole collection by reversing the doping signs. The doping levels of p-doped regions may be about the same as the doping levels of n-doped regions discussed above. Somewhat higher doping by a factor of about 1.5 is needed for similar resistivity levels as for the n-doping case.

According to FIG. 2A, embodiment 100 requires precise mutual alignment of readout wafer 40, 102 and absorber wafer 50, 104 in order to form electrical contacts between heavily doped plugs 110 and heavily doped regions 112, 124.

Figure 2B:
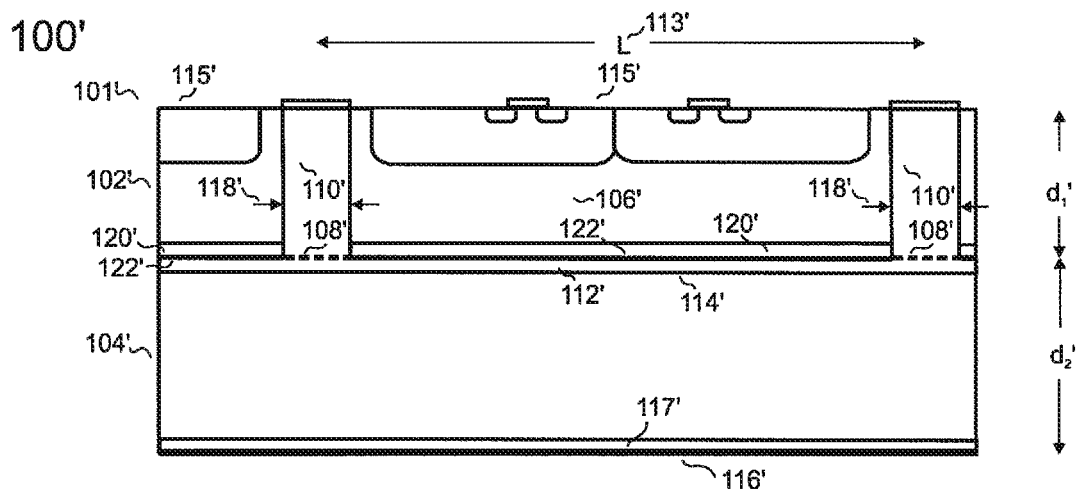
FIG. 2B is a cross-section of a monolithic pixel detector of the invention with charge collection through covalent semiconductor bonds between $n^+$-doped regions in readout and absorber wafer and non-conducting bonds for pixel separation.

Referring now to FIG. 2B, second embodiment 100' of monolithic pixel detector 101' adapted to the detection of X-rays may comprise a bonding interface between thin readout wafer 102' of thickness $d_1$' and absorber wafer 104' of thickness $d_2$'. The readout wafer may have been fabricated for example by CMOS processing a weakly p-doped substrate 106' with a resistivity preferably of about 1-2 kΩ cm or even 2-5 kΩ cm which has a thickness $d_1$' of about 10-30 µm or preferably about 5-10 µm or even 3-5 µm. The thinning to such thicknesses may first require the planarization of the CMOS stack and the bonding of a carrier wafer to substrate 106'. Readout wafer 102' may contain highly conducting n+-doped plugs 110', extending through substrate 106' enclosed by highly resistive or insulating regions 120' the resistivity of which is higher than that of highly doped regions 110', 112' by at least a factor of $10^4$-$10^6$. Highly resistive regions 120' may for example have been formed by local amorphization or local oxidation of wafer 102' before its bonding to highly resistive p-conducting absorber wafer 104'. Alternatively, for a resistivity of readout wafer 102' above about 2 kΩ cm, highly resistive regions 120' may not need to be especially formed. The doping level of highly conducting plugs 110' may for example be between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, corresponding to a resistivity between about 5-20 mΩ cm, 0.7-5 mΩ cm and 0.2-0.7 mΩ cm, respectively. Heavily doped plugs 110' may be formed for example by etching holes in lightly p-doped substrate 106' and their filling with n+-material in a subsequent epitaxy step known in the art. Absorber wafer 104' preferably contains heavily doped, highly conducting and unstructured surface layer 112', formed for example by ion implantation, which may have a similar doping type and doping level as plugs 110'. Optionally, absorber wafer 104' may further comprise heavily p-doped layer 117', facilitating ohmic contact formation with metallic back contact 116'. Heavily doped plugs 110' form ohmic contacts with heavily doped surface regions 112' of absorber wafer 104'. On the other hand, conducting surface layer 112' forms p-n junction 114' with the high resistivity, p-conducting bulk region of absorber wafer 104'. Heavily doped plugs 110' bonded to heavily doped regions 112' by conducting covalent semiconductor bonds 108', providing said ohmic contacts, serve as charge collectors, collecting electrons from electron-hole pairs which are generated by electromagnetic radiation incident on absorber wafer 104' and separated in the electric field of the reverse biased p-n junction 114', formed by heavily n-doped surface region 112' and p-conducting bulk region of absorber wafer 104', upon applying a voltage to back contact 116' on absorber wafer 104'. Electrons substantially do not, however, cross poorly conducting bonding interface 122' between highly resistive regions 120' of readout wafer 102' and doped regions 112' of absorber wafer 104' because its resistance exceeds that of conducting bonds by at least a factor of $10^3$-$10^4$, or preferably $10^4$-$10^6$, or even more preferably $10^6$-$10^8$. Minority carriers (electrons) thus never move across a bonding interface between low-doped wafers where trapping and recombination might occur. Regions 120' therefore lead to pixel isolation and prevent the n-wells of the p-MOS transistors in pixel readout electronics 115' from acting as charge collectors along with n-doped plugs 110' which alone pick up the electrons generated by electromagnetic radiation in absorber wafer 104'. The charge collectors 110' communicate with the pixel readout electronics 115' of readout wafer 102' wherein the charge pulses generated by electromagnetic radiation are processed and forwarded to the off-pixel part of the readout electronics. The detector pixels are exclusively defined by the heavily doped plugs 110' in readout wafer 102', while absorber wafer 104' is unpatterned. The width 118' of plugs 110' should be substantially smaller than the pixel size 113' (for example by a factor of 5-10), the latter ranging within about 100-200 μm, 50-100 μm or 20-50 μm or even 5-20 μm. Width 118' may for example range within about 0.1-2.5 μm.

The pixel detector according to embodiment 100' is designed for detecting electrons from the electron-hole pairs generated by X-rays in absorber wafer 104'. In an aspect of the embodiment the detector may be designed for hole collection by reversing appropriate doping signs. The doping levels of p-doped regions may be about the same as the doping levels of n-doped regions discussed above. Somewhat higher doping by a factor of about 1.5 is needed for similar resistivity levels as for the n-doping case.

According to its design (see FIG. 2B), comprising unpatterned absorber wafer 104', embodiment 100' does not require any precise alignment of readout wafer 40, 102' and absorber wafer 50, 104' in the bonding tool. It is sufficient to use approximate alignment as offered by superimposing wafer alignment features such as notches 42, 52 or flats 48, 58 supplied by wafer manufacturers which permit to keep the rotational misalignment of the two wafers within about 0.1 to 0.2 degrees, and the lateral displacement within about 200-400 μm, as offered for example by the alignment and flipper module of the EVG580 ComBond tool. Embodiment 100' does not therefore require any additional alignment marks on readout and absorber wafer.

Figure 2C:
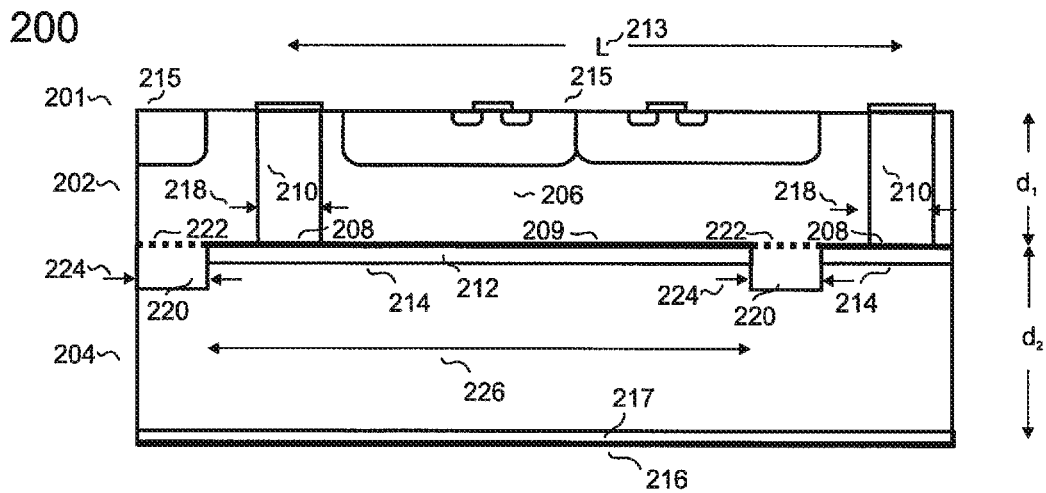
FIG. 2C is a cross-section of a monolithic pixel detector of the invention with charge collection through covalent semiconductor bonds between $n^+$-doped regions in readout and absorber wafer and non-conducting bonds between oxide regions of the absorber wafer and the readout wafer for pixel separation.

Referring now to FIG. 2C, third embodiment 200 of monolithic pixel detector 201 adapted to the detection of X-rays may comprise a bonding interface between thin readout wafer 202 and absorber wafer 204. The readout wafer may have been fabricated for example by CMOS processing a weakly p-doped substrate 206 with a high resistivity preferably of about 1-2 kΩ cm or even 2-5 kΩ cm which is thinned to a thickness of about 10-30 μm or preferably about 5-10 μm or even 3-5 μm after all the processing has been completed. The thinning may require the planarization of the CMOS stack and the bonding of a carrier wafer before substrate 206 can be thinned. Absorber wafer 204 is preferably highly resistive, lightly p-doped and may comprise highly conducting n+-doped regions 212 which may be a heavily doped implants or a heavily doped epitaxial layers. The doping level of highly conducting regions 212 may for example be between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, corresponding to a resistivity between about 5-20 mΩ cm, 0.7-5 mcg cm and 0.2-0.7 mΩ cm, respectively. Optionally, absorber wafer 204 may further comprise heavily p-doped layer 217, facilitating ohmic contact formation with metallic back contact 216. The bonding interface may consist of conducting covalent semiconductor bond 208 between highly conducting n+-doped plugs 210 with similar doping levels extending through substrate 206 and conducting n+-doped regions 212 of the absorber wafer, thereby forming an ohmic contact, and poorly conducting covalent semiconductor bond 209 between the part of heavily doped regions 212 of the absorber wafer facing regions of low doped substrate 206. Poorly conducting covalent semiconductor bonds 209 have at least a $10^3$-$10^4$, or preferably $10^4$-$10^6$, or even more preferably $10^6$-$10^8$ times higher resistivity than ohmic conducting bonds 208. Heavily doped plugs 210 may be formed for example by etching holes in lightly p-doped substrate 206 and their filling with n+-material in a subsequent epitaxy step known in the art. Heavily doped plugs 210 bonded to heavily n-doped regions 212 serve as charge collectors, collecting electrons from electron-hole pairs which are generated by electromagnetic radiation incident on absorber 204 and separated in the electric field of the reverse biased p-n junction 214 between n-doped regions 212 and the lightly p-doped bulk of wafer 204, upon applying a voltage to back contact 216 on absorber wafer 204. Minority carriers (electrons) thus never move across a poorly conducting bonding interface between low-doped wafers where trapping and recombination might occur. The charge collectors 210 communicate with the pixel readout electronics 215 of readout wafer 202 wherein the charge pulses generated by electromagnetic radiation are processed and forwarded to the off-pixel part of the readout electronics. The detector pixels are defined by the heavily doped plugs 210 the width 218 of which may for example range within about 0.5-2 µm or preferably about 0.5-1 µm. The distance L between plugs 210 defines the pixel size 213 which can vary in a wide range within about 100-200 µm, 50-100 µm or 20-50 µm or even 5-20 µm. Heavily doped regions 212 in absorber wafer 204 are surrounded by insulating oxide regions 220 forming substantially an electrically insulating semiconductor-to-oxide or oxide-to-oxide bond 222 between readout and absorber wafer with a resistance exceeding that of bond 208 by at least a factor of $10^3$-$10^4$, or preferably $10^4$-$10^6$, or even more preferably $10^6$-$10^8$. The purpose of these oxide regions is to electrically isolate adjacent pixels from each other. Their width 224 may be smaller, equal or larger than width 226 of heavily doped regions 212 of absorber wafer 204, depending on the desired speed of pixel detector 200, which in turn depends on the size of the capacitor plate defined by width 226 of heavily doped region 212. Since width 226 of heavily doped regions 212 is preferably chosen to be larger that width 218 of heavily doped plugs 210, for example twice or three times as large or even as large as for example 90% of pixel size 213, the requirements for bonding alignment are more relaxed than in embodiment 100.

The pixel detector according to embodiment 200 is designed for detecting electrons from the electron-hole pairs generated by X-rays in absorber wafer 204. In an aspect of the embodiment the detector may be designed for hole collection by reversing the doping signs. The doping levels of p-doped regions may be about the same as the doping levels of n-doped regions discussed above. Somewhat higher doping by a factor of about 1.5 is needed for similar resistivity levels as for the n-doping case.

Figure 2D:
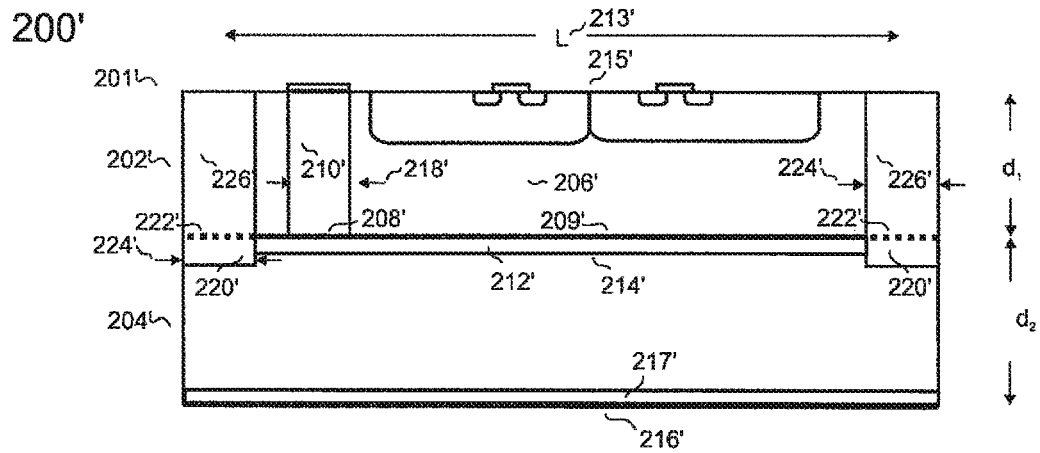
FIG. 2D is a cross-section of a monolithic pixel detector of the invention with charge collection through covalent semiconductor bonds between $n^+$-doped regions in readout and absorber wafer, covalent $p^-$-$n^+$ bonds and trench isolation for pixel separation.

According to its design (see FIG. 2C), embodiment 200 requires precise mutual alignment of readout wafer 40, 202 and absorber wafer 50, 204 because oxide regions 220 in absorber wafer 204 are essentially spaced at pixel size 213 and serve as additional pixel isolation. Furthermore, heavily doped plugs 210 and heavily doped regions 212 need to be aligned in the bonding tool. In order to permit accurate alignment thin readout wafer 202 and absorber wafer 204 are both equipped with at least two special wafer alignment features in the form of alignment marks 44, 46; 54, 56 positioned for example close to the wafer edges on opposite sides. With the help of superimposing such alignment marks the rotational misalignment of 200 mm wafers may be kept below about $5\times10^{-4}$ degrees and the lateral misalignment below 1 µm. Similar accuracy may be obtained in case of smaller wafer bonding. Referring now to FIG. 2D, fourth embodiment 200' of monolithic pixel detector 201' adapted to the detection of X-rays may comprise a bonding interface between thin readout wafer 202' and absorber wafer 204'. The readout wafer may have been fabricated for example by CMOS processing a weakly p-doped substrate 206' with a resistivity preferably of about 1-2 kΩ cm or even 2-5 kΩ cm which is thinned to a thickness of about 10-30 µm or preferably about 5-10 µm or even 3-5 µm after all the processing has been completed. The thinning may require the planarization of the CMOS stack and the bonding of a carrier wafer before substrate 206' can be thinned. Absorber wafer 204' may comprise highly conducting n⁺-doped regions 212' which may be a heavily doped implants or a heavily doped epitaxial layers. The doping level of highly conducting regions 212' may for example be between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, corresponding to a resistivity between about 5-20 mil cm, 0.7-5 mil cm and 0.2-0.7 mΩ cm, respectively. Optionally, absorber wafer 204' may further comprise heavily p-doped layer 217', facilitating ohmic contact formation with metallic back contact 216'. The bonding interface may consist of conducting covalent semiconductor bond 208' between highly conducting n⁺-doped plugs 210' extending through substrate 206' and conducting n⁺-doped regions 212' of absorber wafer 204'. The doping level of plugs 210' is similar to that of regions 212', guaranteeing and ohmic contact between the two. The bonding interface between wafers 202', 204' furthermore comprises poorly conducting covalent semiconductor bond 209' between the portion of heavily doped regions 212' of the absorber wafer facing regions of low doped substrate 206'. Poorly conducting covalent semiconductor bonds 209' have at least a $10^3$-$10^4$, or preferably $10^4$-$10^6$, or even more preferably $10^6$-$10^8$ times higher resistivity than ohmic conducting bonds 208'. Heavily doped plugs 210', only one of which is shown in FIG. 2D, may be formed for example by etching holes in lightly p-doped substrate 206' and their filling with n⁺-material in a subsequent epitaxy step known in the art. Heavily doped plugs 210' bonded to heavily doped regions 212' form an ohmic contact between the two and serve as charge collectors, collecting electrons from electron-hole pairs which are generated by electromagnetic radiation incident on absorber 204' and separated in the electric field of the reverse biased p-n junction 214' between highly n-doped regions 212' and lightly p-doped substrate 206', upon applying a voltage to back contact 216' on absorber wafer 204'. Minority carriers (electrons) thus never move across a poorly conducting bonding interface between low-doped wafers where trapping and recombination might occur. The charge collectors 210' communicate with the pixel readout electronics 215' of readout wafer 202' wherein the charge pulses generated by electromagnetic radiation are processed and forwarded to the off-pixel part of the readout electronics. The detector pixels are defined by the heavily doped plugs 210' the width 218' of which may for example range within about 0.5-2 µm or preferably about 0.5-1 µm. The distance L between plugs 210' defines the pixel size 213' which can vary in a wide range within about 100-200 µm, 50-100 µm or 20-50 µm or even 5-20 µm. Heavily doped regions 212' in absorber wafer 204' are surrounded by oxide regions 220' of width 224' which may for example range within about 0.5-2 µm or preferably about 0.5-1 µm. Oxide regions 220' form electrically insulating oxide-to-oxide bonds 222' between absorber wafer 204' and oxide filled trenches 226' extending through readout wafer 202'. The width trenches 226' is preferably about the same as that of oxide regions 220'. Oxide regions 220', 226' isolate adjacent pixels from each other, and their spacing corresponds again to the pixel size L. Similar to embodiment 200 bonding alignment is facilitated here since heavily doped regions 212' cover most of pixel size 213'.

The pixel detector according to embodiment 200' is designed for detecting electrons from the electron-hole pairs generated by X-rays in absorber wafer 204'. In an aspect of the embodiment the detector may be designed for hole collection by reversing the appropriate doping signs. The doping levels of p-doped regions may be about the same as the doping levels of n-doped regions discussed above. Somewhat higher doping by a factor of about 1.5 is needed for similar resistivity levels as for the n-doping case.

According to its design (see FIG. 2D) embodiment 200' requires precise mutual alignment of readout wafer 40, 202' and absorber wafer 50, 204' for bonding, because oxide regions 220' in absorber wafer 204' and insulating oxide regions 226' of readout wafer 202' are essentially spaced at pixel size 213' and have to match during forming bonding interface 222'. Heavily doped plugs 210' and heavily doped regions 212' equally need to be aligned to form an ohmic contact at bonding interface 208'. In order to permit accurate alignment thin readout wafer 202' and absorber wafer 204' are both equipped with at least two special wafer alignment features in the form of alignment marks 44, 46; 54, 56 positioned for example close to the wafer edges on opposite sides. With the help of superimposing such alignment marks the rotational misalignment of 200 mm wafers may be kept within about $(2-5) \times 10^{-4}$ degrees and the lateral misalignment within about 0.5-1 µm. Similar accuracy may be obtained in case of smaller wafer bonding.

Figure 2E:
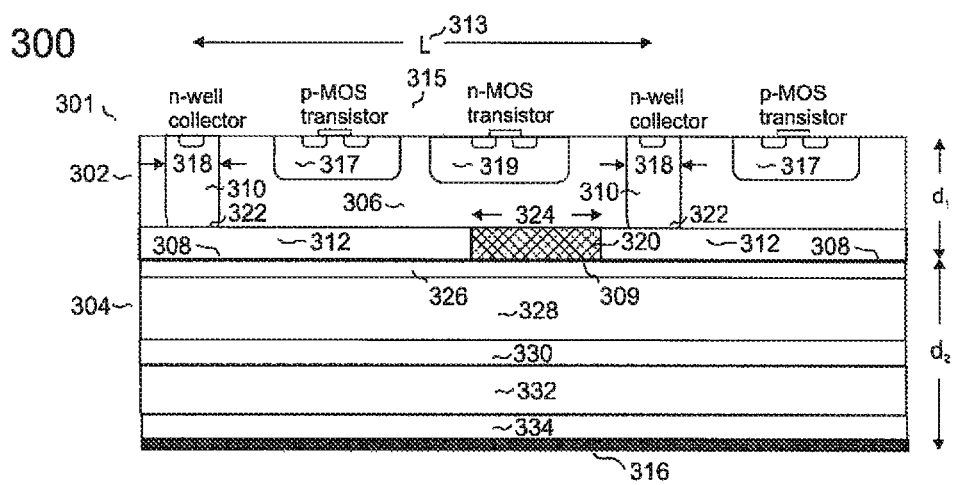
FIG. 2E is a cross-section of a monolithic pixel detector of the invention with charge collection through covalent semiconductor bonds between $n^+$-doped regions in readout and absorber wafer and non-conducting bonds between highly resistive regions of the readout wafer and $n^+$-doped regions in the absorber wafer, wherein the absorber wafer contains a region for charge multiplication.

Referring now to FIG. 2E, fifth embodiment 300 of monolithic pixel detector 301 adapted to the detection of infrared radiation may comprise a bonding interface between thin readout wafer 302 and absorber wafer 304. The readout wafer may have been fabricated for example by CMOS processing p-doped substrate 306 with a resistivity between about 0.1-1 kΩ cm. Readout wafer 302 is thinned to a thickness of about 10-30 µm or preferably about 5-10 µm or even more preferably about 3-5 µm after the processing of pixel electronics 315, comprising for example p-MOS transistors in n-wells 317 and n-MOS transistors in p-wells 319, has been completed. The thinning may require the planarization of the CMOS stack and the bonding of a carrier wafer before substrate 306 can be thinned. Preferably, readout wafer 302 contains heavily n-doped, highly conducting regions 312 enclosed by highly resistive regions 320, the latter serving for mutual electrical pixel isolation. The doping of regions 312 may for example be between $1 \times 10^{18}$-$1 \times 10^{19}$ cm$^{-3}$ or preferably $1 \times 10^{19}$-$1 \times 10^{20}$ cm$^{-3}$ or even $1 \times 10^{20}$-$5 \times 10^{20}$ cm$^{-3}$, corresponding to a resistivity between about 5-20 mΩ cm, 0.7-5 mil cm and 0.2-0.7 mΩ cm, respectively. The resistivity of highly resistive regions 320 is higher by at least a factor of about $10^3$-$10^4$, or preferably $10^4$-$10^6$, or even more preferably $10^6$-$10^8$ with respect to that of highly conducting regions 312. Regions 312 and 320 may for example be formed by ion implanting thin SOI wafers by dopants or oxygen, respectively, before the low doped substrate 306 is epitaxially grown by chemical vapour deposition. Alternatively, heavily doped regions 312 and high resistivity regions 320 may also be formed by backside processing after thinning of readout wafer 302. Heavily doped regions 312 may form ohmic contacts 322 with highly conducting n$^+$-doped plugs 310 which have similar doping levels and extend through low doped substrate 306. Absorber wafer 304 may optionally comprise unpatterned, highly conducting n$^+$-doped layer 326, which may be a heavily doped implant or a heavily doped epitaxial layer, forming conducting covalent semiconductor bond 308 with heavily doped regions 312 of readout wafer 302. The doping level of doped layer 326 may for example be between $1 \times 10^{18}$-$1 \times 10^{19}$ cm$^{-3}$ or preferably $1 \times 10^{19}$-$1 \times 10^{20}$ cm$^{-3}$ or even $1 \times 10^{29}$-$5 \times 10^{20}$ cm$^{-3}$. The part of layer 326 facing highly resistive regions 320 may either form a poorly conducting covalent semiconductor or a semiconductor-to-insulator bond 309, depending on whether regions 320 are highly resistive semiconductor regions or insulator regions, such as for example oxide regions. In any case the resistance of bond 309 exceeds that of bond 308 by at least a factor of $10^3$-$10^4$, or preferably $10^4$-$10^6$, or even more preferably $10^6$-$10^8$. Absorber 304 may further comprise low-doped infrared absorption layer 328 next to layer 326 and a stack of layers comprising a p-i-n diode or avalanche diode with n-doped charge region 330, intrinsic or highly resistive doped charge multiplication layer 332 and heavily p-doped anode region 334.

In the design of embodiment 300, doped plugs 310 contacting doped regions 312 serve as charge collectors, collecting electrons generated for example by avalanche breakdown, when holes produced by infrared radiation incident on absorption layer 328 give rise to an avalanche current in charge multiplication layer 332 while the detector is in operation and a reverse bias above the breakdown voltage $V_B$ is applied to transparent or pixelated back contact 316. The doping levels of layers 328, 330, 332 and 334 is preferably chosen to assure the highest electric field to be present in charge multiplication layer 332, while the field in absorption layer 328 is just large enough to cause holes to drift into the charge multiplication region. Hence the doping of layer 328 may for example be $10^{14}$-$10^{15}$ cm$^{-3}$, that of layer 330 about $5 \times 10^{16}$-$5 \times 10^{17}$ cm$^{-3}$, that of layer 332 about $5 \times 10^{14}$-$5 \times 10^{15}$ cm$^{-3}$, and finally that of layer 334 about $10^{19}$-$10^{20}$ cm$^{-3}$. Similar to the embodiments adapted for X-ray detection charge collectors 310 communicate with the pixel readout electronics 315 of readout wafer 302 which further comprises quenching circuits designed for lowering the bias below $V_B$ (see for example F. Zappa et al. in Sensors and Actuators A 140,103 (2007), the entire enclosure of which is hereby incorporated by reference). The detector pixels are defined by the heavily doped plugs 310 the width 318 of which may for example range within about 0.1-2 µm or preferably about 0.5-1 µm. The distance L between plugs 310 defines the pixel size 313 which can for example vary in a range within about 2-40 µm or preferably about 5-30 µm or even more preferably about 10-20 µm.

In the design of embodiment 300, absorption layer 328 is a semiconductor layer with a lower bandgap with respect to the one of charge multiplication layer 332. Layer 328 may for example be nearly intrinsic Ge layer or a low doped layer with a doping density preferably below about $10^{15}$ cm$^{-3}$ and a thickness of about 1 µm. Charge region 330 may be an n-doped GaAs layer with a doping density in the range of about $1-5 \times 10^{17}$ cm$^{-3}$ and a thickness around 0.1 µm. Multiplication layer 332 may be a low n-doped GaAs layer with a doping density of about $10^{15}$ cm$^{-3}$ and a thickness in the range of 0.5-2 µm. Layer 334 may finally be a heavily p-doped GaAs layer with a doping level of about $5 \times 10^{19}$ cm$^{-3}$ and a thickness of 0.5-1 µm. An absorber wafer comprising such a layer stack can for example advantageously be made by growing the GaAs layers epitaxially on a Ge substrate wafer to which they are very closely lattice matched. Before forming wafer bonds 308, 309 the Ge substrate wafer has to be thinned, for example by first bonding the epitaxial GaAs surface to a carrier wafer, and then thinning the Ge substrate wafer by grinding and chemical mechanical planarization (CMP) or by layer splitting as known in the art (see for example I. P. Ferain et al. in J. Appl. Phys. 107, 054315 (2010), the entire disclosure of which is hereby incorporated by reference).

According to its design (see FIG. 2E), comprising unpatterned absorber wafer 304, the infrared detector embodiment 300 does not require any precise alignment of readout wafer 40, 302 and absorber wafer 50, 304 in the bonding tool similar to embodiment 100' for a pixel detector adapted to X-ray detection. It is sufficient to use approximate alignment as offered by superimposing wafer alignment features such as notches 42, 52 or flats 48, 58 supplied by wafer manufacturers which permit to keep the rotational misalignment of the two wafers within about 0.1 to 0.2 degrees, and the lateral displacement within about 200-400 µm, as offered for example by the alignment and flipper module of the EVG580 ComBond tool. Embodiment 300 does not therefore require any additional alignment marks on readout and absorber wafer. Similar to the X-ray detectors of embodiments 100-200' the infrared detector of embodiment 300 may have single photon detection capability when it is operated in Geiger mode (see for example F. Zappa et al. in Sensors and Actuators A 140,103 (2007), the entire enclosure of which is hereby incorporated by reference).

The pixel detector according to embodiment 300 is designed for detecting electrons from the electron-hole pairs in avalanche layer 332. In an aspect of the embodiment the detector may be designed for hole collection by reversing the appropriate doping signs. The doping levels of p-doped regions may be about the same as the doping levels of n-doped regions discussed above. Somewhat higher doping by a factor of about 1.5 is needed for similar resistivity levels as for the n-doping case.

Figure 2F:
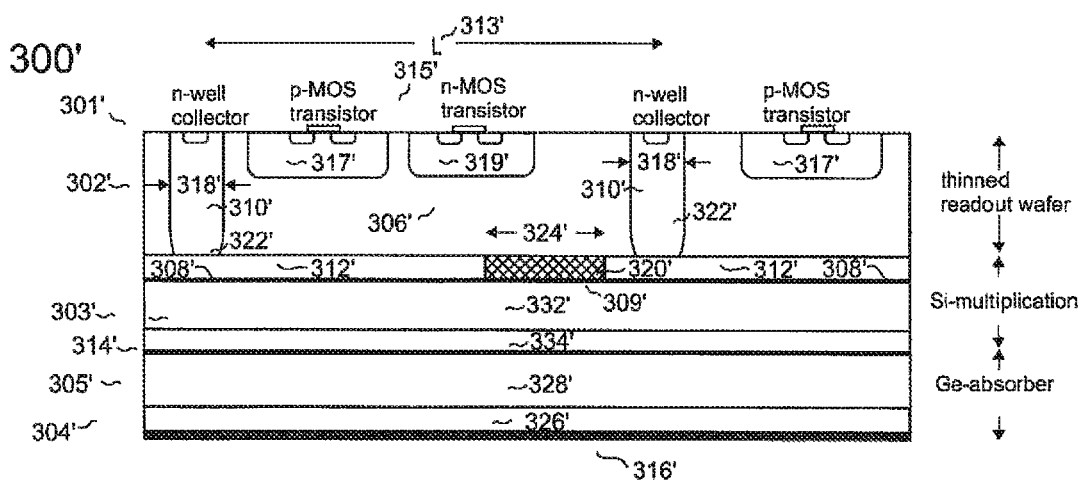
FIG. 2F is a cross-section of a monolithic pixel detector of the invention with charge collection through a first covalent semiconductor bond between $n^+$-doped regions in a readout wafer and the charge multiplication region of a silicon wafer, and a second covalent semiconductor bond between the silicon wafer and an absorber wafer.

Referring now to FIG. 2F, sixth embodiment 300' of monolithic pixel detector 301' adapted to the detection of infrared radiation may comprise two bonding interfaces. First bonding interface 308' lies between thin Si readout wafer 302' and second thin Si wafer 303', comprising Si multiplication layer 332'. Second bonding interface 314' lies between second thinned Si wafer 303' and absorber layer stack 305' which together form absorber wafer 304'.

The readout wafer may have been fabricated for example by CMOS processing p-doped substrate 306' with a resistivity between about 0.1-1 kΩ cm. Readout wafer 302' is thinned to a thickness of about 10-30 µm or preferably about 5-10 µm or even more preferably about 3-5 µm after the processing of pixel electronics 315', comprising for example p-MOS transistors in n-wells 317' and n-MOS transistors in p-wells 319', has been completed. The thinning may require the planarization of the CMOS stack and the bonding of a carrier wafer before substrate 306' can be thinned. Likewise, the thinning of second Si wafer 303' may require carrier wafer bonding before the thinning, unless a layer splitting technique is used after forming first bonding interface 308'. Preferably, readout wafer 302' contains heavily n-doped, highly conducting regions 312' enclosed by highly resistive regions 320' the latter serving for mutual electrical pixel isolation. The doping of regions 312' may for example be between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, corresponding to a resistivity between about 5-20 mΩ cm, 0.7-5 mΩ cm and 0.2-0.7 mΩ cm, respectively. The resistivity of highly resistive regions 320' is higher by at least a factor of about $10^3$-$10^4$ or $10^4$-$10^6$, or even $10^6$-$10^8$ with respect to that of highly conducting regions 312' and the resistance of bond 309' exceeds that of bond 308' by at least a factor of $10^3$-$10^4$, or preferably $10^4$-$10^6$, or even more preferably $10^6$-$10^8$. Regions 312' and 320' may for example be formed by ion implanting thin SOI wafers before the low doped substrate 306' is epitaxially grown by chemical vapour deposition by dopant atoms or oxide atoms, respectively. Heavily doped regions 312' may form ohmic contacts 322' with the highly conducting regions of n$^+$-doped plugs 310' which have similar doping levels and extend through low doped substrate 306'. Covalent semiconductor bond 314' is formed between infrared absorption layer 328' of absorber layer stack 305' and charge layer 334' of second thinned Si wafer 303'. A silicon p-i-n or avalanche diode is formed between heavily doped regions 312' of readout wafer 302' which is bonded to highly resistive, intrinsic or very low doped charge multiplication region 332' of second, thin Si wafer 303' in conducting covalent semiconductor bond 308', and p-doped charge layer 334'. In an aspect of the embodiment the entire Si charge multiplication region may be part of readout wafer 302'. In this aspect of the embodiment, first regions 312', 320', 332', 334' may be formed by processing a Si wafer, for example by epitaxial growth and/or ion implantation. Subsequently, epitaxial layer 306' may be grown by CVD and then CMOS processed to create pixel readout electronics 315' along with charge collectors 318'. In this case bonding of thin Si wafer 303' is not required. There is in this case only one single covalent semiconductor bond 314' present between Si readout wafer 302' and infrared absorption layer 328' of absorber layer stack 305'. In the design of embodiment 300', doped plugs 310' contacting doped regions 312' serve as charge collectors, collecting electrons generated for example by avalanche breakdown, when electrons produced by infrared radiation incident on absorption layer 328' give rise to an avalanche current in multiplication layer 332' while the detector is in operation and a reverse bias above the breakdown voltage $V_B$ is applied to transparent or pixelated back contact 316'. The doping levels of layers 328', 332' and 334' is preferably chosen to assure the highest electric field to be present in multiplication layer 332', while the field in absorption layer 328' is just large enough to cause electrons to drift into the charge multiplication region. Hence the doping of absorption layer 328' may for example be $10^{14}$-$10^{15}$ cm$^{-3}$, that of charge layer 334' about $5\times10^{16}$-$5\times10^{17}$ cm$^{-3}$, that of charge multiplication layer 332' about $5\times10^{14}$-$5\times10^{15}$ cm$^{-3}$, and finally that of layer 334 about $10^{19}$-$10^{20}$ cm$^{-3}$. Similar to the embodiments adapted for X-ray detection charge collectors 310' communicate with the pixel readout electronics 315' of readout wafer 302' which further comprises quenching circuits designed for lowering the bias below $V_B$ (see for example F. Zappa et al. in Sensors and Actuators A 140,103 (2007), the entire enclosure of which is hereby incorporated by reference). The detector pixels are defined by the heavily doped plugs 310' the width 318' of which may for example range within about 0.1-2 µm or preferably about 0.5-1 µm. The distance L between plugs 310' defines the pixel size 313' which can for example vary in a range within about 2-40 µm or preferably about 5-30 µm or even more preferably about 10-20 µm.

In the design of embodiment 300', absorption layer 328' is a semiconductor layer with a lower bandgap with respect to the one of Si multiplication layer 332'. Layer 328' may for example be nearly intrinsic Ge layer or a low doped layer with a doping density preferably below about $10^{15}$ cm$^{-3}$ and a thickness of about 1 µm. Charge layer 334' may have a doping density in the range of about 1-5$\times10^{17}$ cm$^{-3}$ and a thickness around 0.1 µm. The Si multiplication layer 332' may have a doping density of about $10^{15}$ cm$^{-3}$ and a thickness in the range of 0.5-2 µm. Optional layer 326' of absorber wafer 304' may finally be a heavily p-doped Ge layer with a doping level of about $1\times10^{19}$-$1\times10^{20}$ cm$^{-3}$ and a thickness of 0.5-1 µm facilitating ohmic contact formation with back contact 316'. Preferably, second thinned Si wafer 303' is made from an SOI wafer, which facilitates its thinning after bonding to thinned readout wafer 302'. Ge absorption wafer 304' may on the other hand be thinned after bonding by grinding and CMP or by layer splitting as known in the art (see for example I. P. Ferain et al. in J. Appl. Phys. 107, 054315 (2010), the entire disclosure of which is hereby incorporated by reference). The process of forming wafer bonds 308', 309', 314', or single wafer bond 314' in case of an aspect of the embodiment, before wafer thinning has the advantage that no carrier wafer bonding is needed for carrying out these steps.

According to its design (see FIG. 2F), comprising the bonding of unpatterned Si wafer 303' to thin readout wafer 302', infrared detector embodiment 300' does not require any precise alignment of these wafers in the bonding tool. Neither does absorber layer stack 305' need to be precisely aligned with thinned Si wafer 303' for bonding. It is sufficient to use approximate alignment as offered by superimposing wafer alignment features such as notches 42, 52 or flats 48, 58 supplied by wafer manufacturers which permit to keep the rotational misalignment of the two wafers within about 0.1 to 0.2 degrees, and the lateral displacement within about 200-400 µm, as offered for example by the alignment and flipper module of the EVG580 ComBond tool. Embodiment 300' does not therefore require any additional alignment marks on readout and absorber wafer. Similar to embodiment 300 embodiment 300' may provide single photon detection capability when it is operated in Geiger mode (see for example F. Zappa et al. in Sensors and Actuators A 140,103 (2007), the entire enclosure of which is hereby incorporated by reference).

Figure 2G:
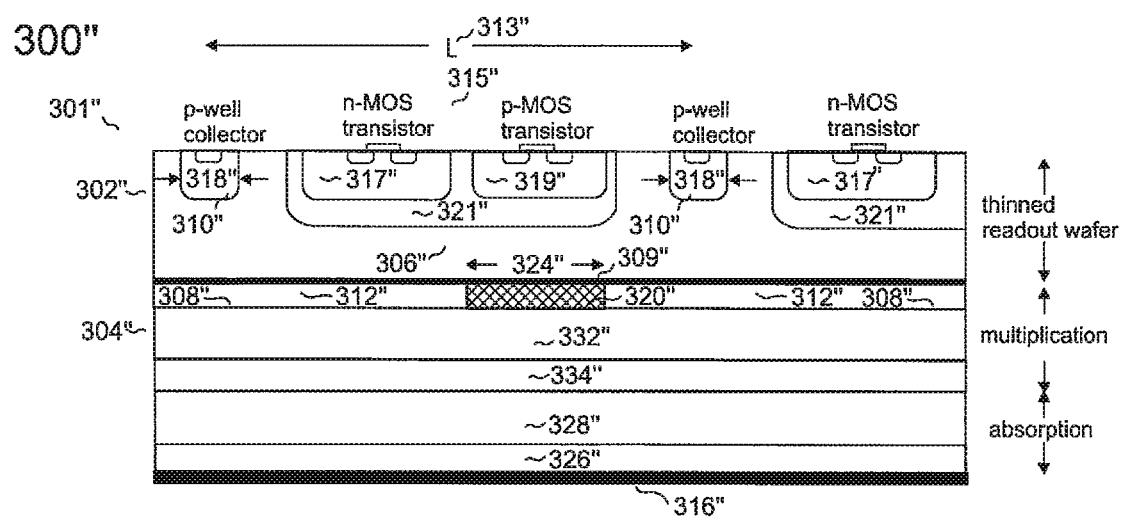
FIG. 2G is a cross-section of a monolithic pixel detector of the invention with charge collection through covalent semiconductor bonds between weakly p-doped regions of a readout wafer and $p^+$-doped regions of an absorber wafer, non-conducting bonds between highly resistive regions of the absorber wafer and a weakly p-doped region of the readout wafer, wherein the absorber wafer contains a region for charge multiplication.

Referring now to FIG. 2G, embodiment 300" of monolithic pixel detector 301" adapted to the detection of infrared radiation may comprise a bonding interface between thin readout wafer 302" and absorber wafer 304".

The readout wafer may have been fabricated for example by CMOS processing p-doped substrate 306" with a resistivity between about 0.1-1 kΩ cm. Readout wafer 302" is thinned to a thickness of about 10-30 µm or preferably about 5-10 µm or even more preferably about 3-5 µm after the processing of pixel electronics 315", comprising for example p-MOS transistors in n-wells 317" and n-MOS transistors in p-wells 319" and additional deep n-wells 321", has been completed. The thinning may require the planarization of the CMOS stack and the bonding of a carrier wafer before substrate 306" can be thinned. Readout wafer 302" may contain highly conducting, heavily p-doped implants 310" adapted for hole collection. In contrast to the electron collectors 310, 310' of embodiments 300, 300', hole collectors 310" do not need to extend through the whole thickness of the readout wafer. Deep n-wells 321" prevent p-wells 319" from collecting holes. The doping of implants 310" may for example be between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, corresponding to a resistivity between about 5-20 mΩ cm, 0.7-5 mΩ cm and 0.2-0.7 ma cm, respectively. The bonding interface between readout wafer 302" and absorber wafer 304" may consist of covalent semiconductor bond 308" between low p-doped Si substrate 306" and highly conducting, heavily p-doped layer 312" and of bond 309", which may be a poorly conducting covalent semiconductor or a semiconductor-to-insulator bond depending on whether regions 320", which electrically isolate neighbouring pixels, are highly resistive semiconductor regions or insulator regions, such as for example oxide regions. In any case, the resistivity of highly resistive regions 320" is higher by at least a factor of about $10^3$-$10^4$, or even $10^4$-$10^6$, or as much as $10^6$-$10^8$ with respect to that of highly conducting regions 312" leading to a resistance of bond 309" exceeding that of bond 308" by at least a factor of $10^3$-$10^4$, or preferably $10^4$-$10^6$, or even more preferably $10^6$-$10^8$. Absorber wafer 304" may further comprise very weakly n-doped or intrinsic charge multiplication layer 332" and more highly n-doped charge layer 334". A p-i-n or avalanche diode is thereby formed between heavily p-doped regions 312", intrinsic or very low doped charge multiplication region 332" and n-doped charge layer 334". Adjacent to said p-i-n diode absorber wafer 304" may further comprise intrinsic or preferably lightly p-doped absorption layer 328" and finally optional heavily doped layer 326", which facilitates ohmic contact formation with back contact 316".

In the design of embodiment 300", p-doped implants 310" may hence serve as hole collectors generated for example by avalanche breakdown, when holes produced by infrared radiation incident on absorption layer 328" give rise to an avalanche current in multiplication layer 332", when the detector is in operation and a reverse bias above the breakdown voltage $V_B$ is applied to transparent or pixelated back contact 316". The doping levels of layers 328", 332" and 334" are preferably chosen to assure the highest electric field to be present in multiplication layer 332", while the field in absorption layer 328" is just large enough to cause holes to drift into the multiplication region. Similar to the embodiments 300, 300' charge collectors 310" communicate with the pixel readout electronics 315" of readout wafer 302" which further comprises quenching circuits designed for lowering the bias below $V_B$ (see for example F. Zappa et al. in Sensors and Actuators A 140,103 (2007), the entire enclosure of which is hereby incorporated by reference). The detector pixels are defined by the heavily doped implants 310" the width 318" of which may for example range within about 0.1-2 µm or preferably about 0.5-1 µm. The distance L between implants 310" defines the pixel size 313" which can for example vary in a range within about 2-40 µm or preferably about 5-30 µm or even more preferably about 10-20 µm.

In the design of embodiment 300", absorption layer 328" is a semiconductor layer with a lower bandgap with respect to the semiconductor from which charge multiplication layer 332" and layers 312", 334" are made. Layer 328" may for example be nearly intrinsic Ge layer or a low doped layer with a doping density preferably below about $10^{15}$ cm$^{-3}$ and a thickness of about 1 µm. Charge layer 334", multiplication layer 332" and heavily p-doped layer 312" may for example be GaAs layers. Layers 312" may for example be doped to a level between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$. Charge layer 334" may have an n-doping density in the range of about $1$-$5\times10^{17}$ cm$^{-3}$ and a thickness around 0.1 µm. Multiplication layer 332" may have a n$^-$-doping density of about $10^{15}$ cm$^{-3}$ and a thickness in the range of 0.5-2 µm. Optional layer 326" of absorber wafer 304" may finally be a heavily p-doped Ge layer with a doping level of about $5\times10^{19}$ cm$^{-3}$ and a thickness of 0.5-1 µm facilitating ohmic contact formation with back contact 316". An absorber wafer comprising such a layer stack can for example advantageously be made by growing the GaAs layers epitaxially on a Ge substrate wafer to which they are very closely lattice matched. Ge absorption wafer 304" may be thinned after bonding by grinding and CMP or by layer splitting as known in the art (see for example I. P. Ferain et al. in J. Appl. Phys. 107, 054315 (2010), the entire disclosure of which is hereby incorporated by reference). The process of forming wafer bonds 308', 309' before wafer thinning has the advantage that no carrier wafer bonding is needed for carrying out these steps.

According to its design (see FIG. 2G), embodiment 300" requires precise mutual alignment of readout wafer 40, 302" and absorber wafer 50, 304" for bonding, because insulating regions 320" in absorber wafer 304" are essentially spaced at pixel size 313" and have to be positioned between implants 310" during wafer bonding. In order to permit accurate alignment thin readout wafer 302″ and absorber wafer 304″ are both equipped with at least two special wafer alignment features in the form of alignment marks 44, 46; 54, 56 positioned for example close to the wafer edges on opposite sides. With the help of superimposing such alignment marks the rotational misalignment of 200 mm wafers may be kept within about $(2\text{-}5) \times 10^{-4}$ degrees and the lateral misalignment within about 0.5-1 µm. Similar accuracy may be obtained in case of smaller wafer bonding.

Similar to embodiment 300, embodiment 300″ may provide single photon detection capability when it is operated in Geiger mode (see for example F. Zappa et al. in Sensors and Actuators A 140,103 (2007), the entire enclosure of which is hereby incorporated by reference).

Figure 3A:
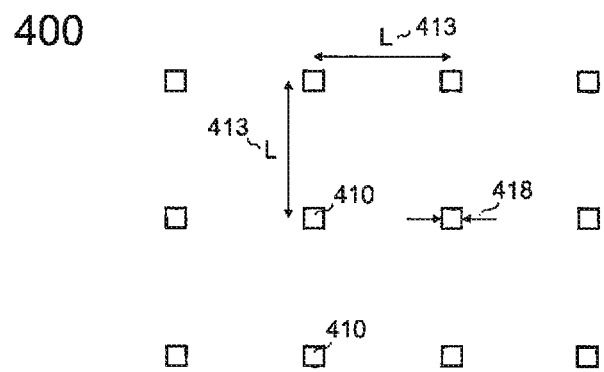
FIG. 3A is a plan-view of the charge collectors of a monolithic pixel detector of the invention.
Figure 3B:
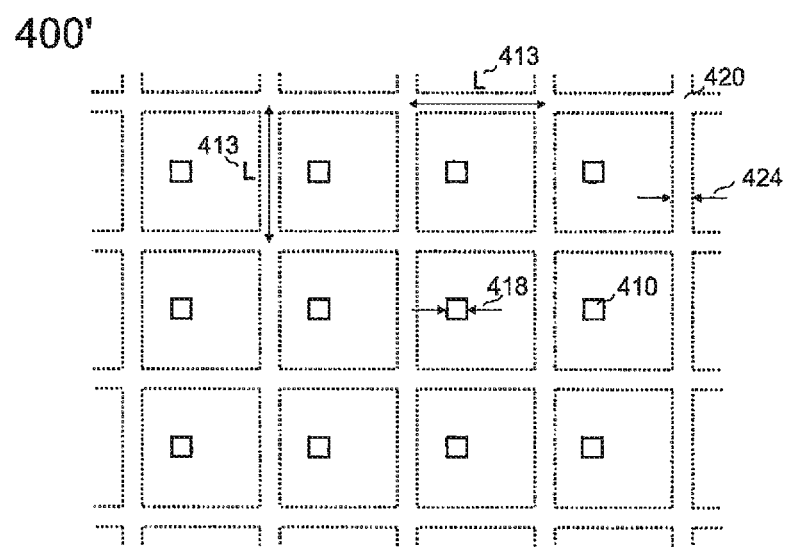
FIG. 3B is a plan-view of the charge collectors and the oxide regions surrounding the pixels of a monolithic pixel detector of the invention.

Referring now to FIG. 3A, charge collectors 410 of width 418 communicating with the pixel readout electronics may be arranged for example on a square grid of mesh size L defining the pixel size 413 according to top view 400. Top view 400′ of FIG. 3B shows an example of high resistivity or oxide regions 220, 320, 320′, 320″ of embodiments 200, 300, 300′, 300″ which form buried, substantially insulating square mesh 420 acting as pixel isolation. Depending on the pixel size 413, the width 418 of charge collectors 410 and the width 424 of the insulating mesh may be substantially exaggerated in the drawings of FIGS. 2A-2G.

Figure 4:
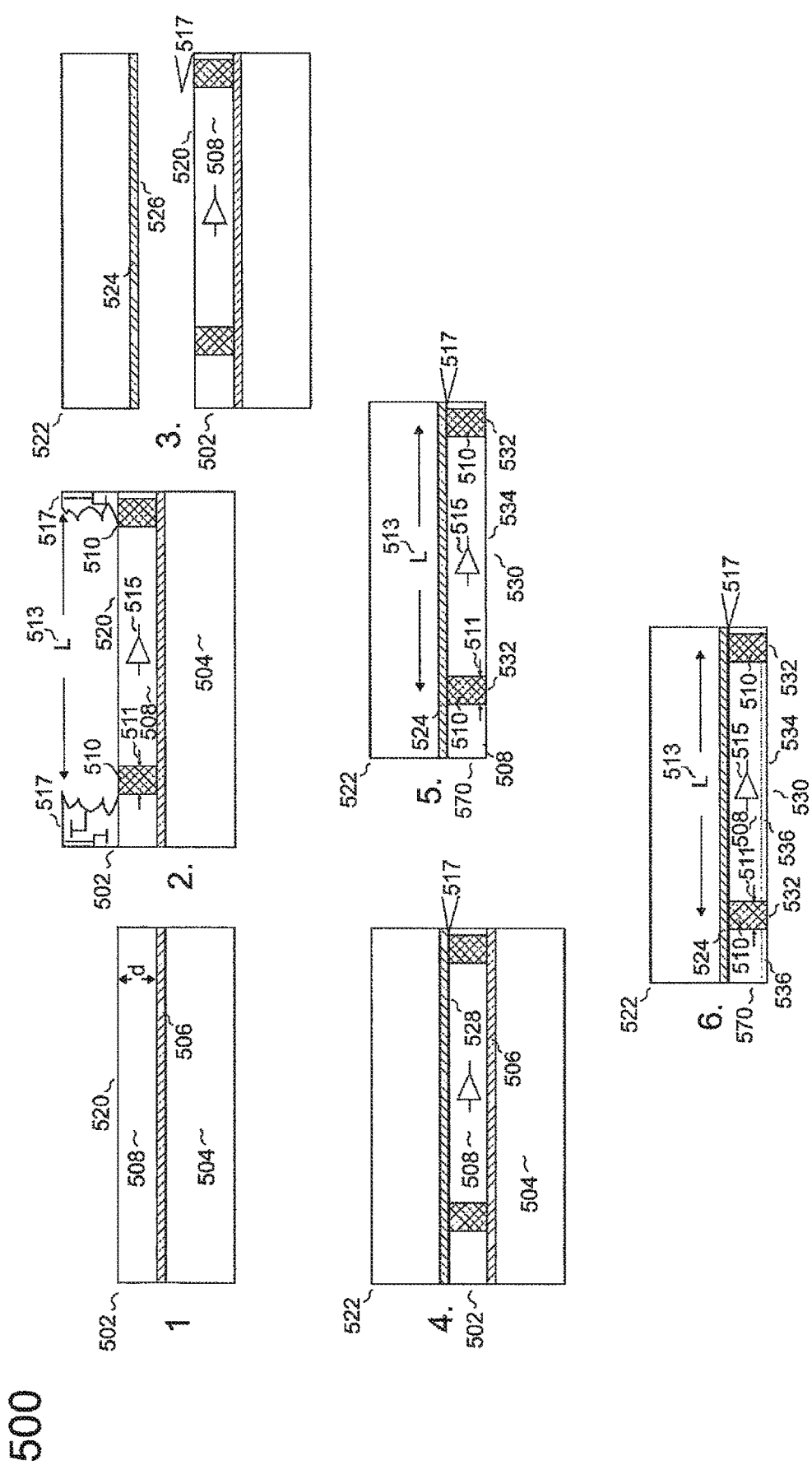
FIG. 4 is the process flow of the invention for the fabrication of a thin readout wafer of the invention with highly doped charge collector plugs.

Referring now to FIG. 4, the realization of first embodiment 500 of a thin readout wafer may comprise the following fabrication steps:

1. Providing wafer 502, which may preferably be a SOI wafer with Si substrate 504, oxide box 506 and Si layer 508 with surface 520. The thickness d of Si layer 508 should preferably be in the range of about 5-40 µm or preferably 10-30 µm or even more preferably about 5-10 µm or even about 3-5 µm. It should be low-doped with a resistivity above about 500 Ωcm, preferably at least 1-2 kΩ cm or even more, preferably at least 2-5 kΩ cm. Si layer 508 may for example be an epitaxial layer.

2. Processing Si layer 508 of wafer 502, including the formation of highly conducting regions of heavily doped plugs 510 of width 511 serving as charge collectors, the spacing 513 of which corresponds to the pixel size L, and which communicate with CMOS processed pixel readout electronics 515. When adapted for X-ray detection, the pixel size L may range within 100-200 µm, 50-100 µm or 20-50 µm or even 5-20 µm. When adapted for infrared detection, the pixel size L may range within about 2-40 µm or preferably about 5-30 µm or even more preferably about 10-20 µm. Optionally forming at least two special wafer alignment features in the form of alignment marks 44, 46 on wafer 502, spaced far apart, for example close to its edges on opposite sides. When high resistivity Si layer 508 is weakly p-doped, charge collectors 510 are provided n⁺-doped with a resistivity of about 5-20 mΩ cm, or preferably about 0.7-5 mil cm or even 0.2-0.7 mΩ cm (doping levels of about $1 \times 10^{18}\text{-}1 \times 10^{19}$ cm$^{-3}$, $1 \times 10^{19}\text{-}1 \times 10^{20}$ cm$^{-3}$ and $1 \times 10^{20}\text{-}5 \times 10^{20}$ cm$^{-3}$, respectively) to be suitable for electron collection. Charge collector plugs 510 may be formed for example by etching holes through Si layer 508 which are then filled with heavily n-doped material for example in a chemical vapour deposition (CVD) step. Their width 511 may for example be in the range of 0.5-2.5 µm or preferably about 1-1.5 µm. In general the CMOS processing additionally results in CMOS stack 517 of multiple oxide and metal layers on top of Si surface 520 of wafer 502 which is only partly shown here and just indicated by number in the following in order not to overload the figures. It is understood that to allow for hole collection the conduction type of layer 508 and of charge collectors 510 should be inverted.

3. Planarizing the surface of CMOS 517 stack on processed wafer 502 for example by CMP to make it flat and smooth, keeping the root mean square (RMS) surface roughness below about 0.5 nm, for oxide-to-oxide bonding, and activating the planarized surface by a plasma activation step. Providing handling wafer 522 with oxide layer 524 and activating surface 526 of oxide layer 524 by a similar plasma activating step.

4. Bonding the activated surfaces of planarized CMOS 517 stack and handling wafer 522 by low-temperature oxide-to-oxide fusion bonding thereby providing oxide bonding interface 528.

5. Providing thinned readout wafer 570 by removing Si substrate 504 of CMOS processed wafer 502 for example by a combination of mechanical grinding and reactive ion etching (RIE). Oxide box 506 may thereby act as an etch stop and can subsequently be removed for example in a modified reactive ion etching (RIE) step in which exposed surface 530 of Si layer 508 may in turn act as an etch stop. Surface 530 of resulting thinned readout wafer 570, consists of conducting surface 532 of heavily doped charge collectors and substantially insulating surface 534 of high resistivity layer 508.

6. Providing surface of high resistivity Si layer 508 with optional layer 536 of even higher resistivity, for example by amorphizing the surface region or by implanting oxygen or carbon. Surface 530 consisting of conducting surface 532 of heavily doped charge collectors and substantially insulating surface 534 of high resistivity layer 508, 536 may optionally be subjected to CMP in order to make it flat and smooth for wafer bonding with an RMS surface roughness below about 0.5 nm. After an additional surface activation step of surface 530, for example by wet chemical cleaning and plasma activation, thinned readout wafer 570 is ready for covalent wafer bonding to an absorber wafer.

Figure 5:
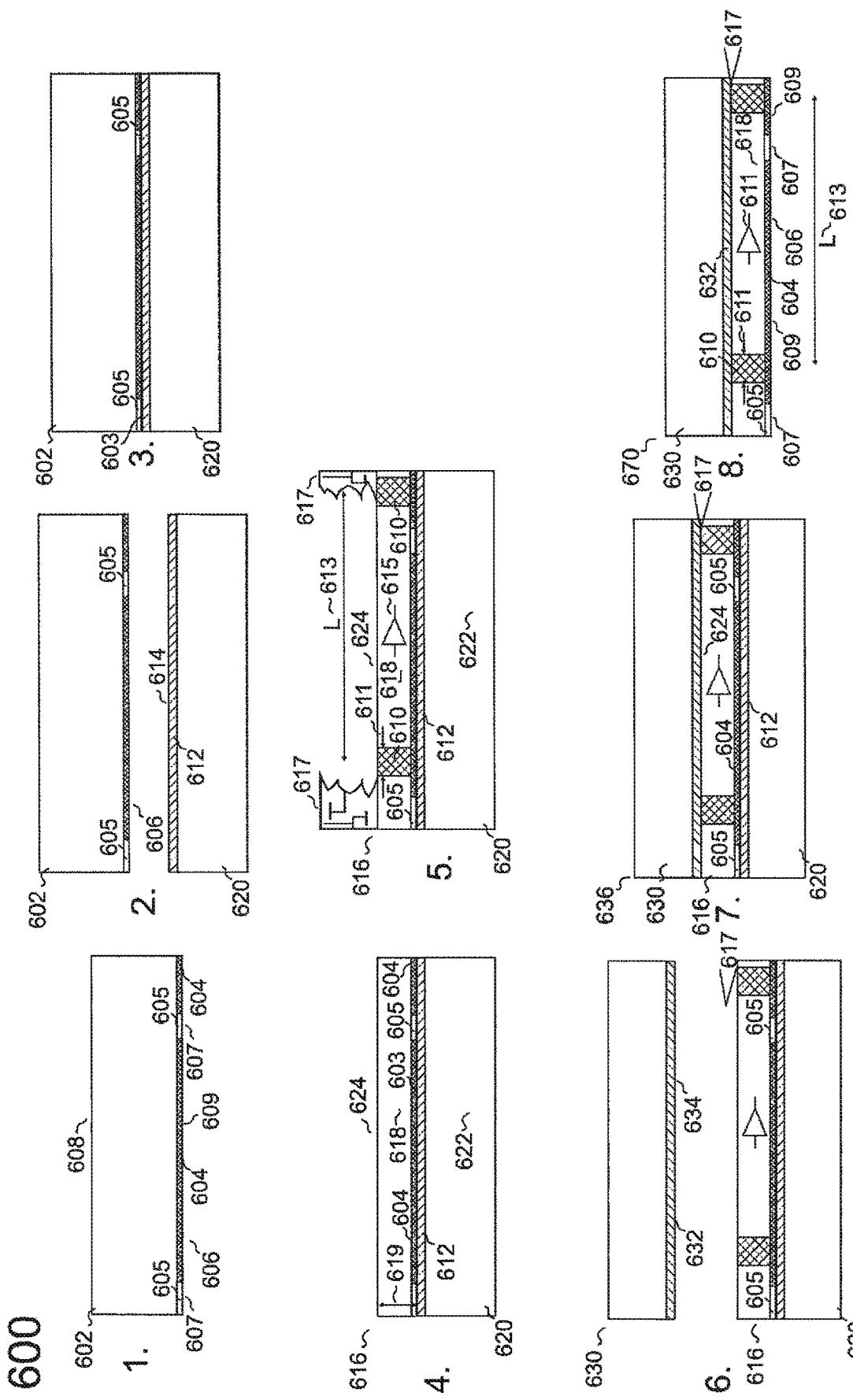
FIG. 5 is the process flow of the invention for the fabrication of a thin readout wafer of the invention with highly doped charge collector plugs and implants.

Referring now to FIG. 5, the realization of second embodiment 600 of a thin readout wafer may comprise the following fabrication steps:

1. Providing highly resistive Si wafer 602 with lower surface 606 and upper surface 608 and implant lower surface 606 with highly conducting regions 604 which are heavily doped. Lower surface 606 thereby consists of substantially insulating surface region 607 of low doped (high resistivity) wafer 602 and conducting surface 609 of heavily doped implants 604. Optionally the resistivity of surface regions 607 may be further increased, for example by locally amorphizing or oxidizing thin layer 605. When high resistivity Si wafer 602 is weakly p-doped, heavily doped regions 604 are preferably n⁺-doped with a resistivity of about 5-20 mΩ cm, or preferably about 0.7-5 mΩ cm or even 0.2-0.7 mΩ cm (doping levels of about $1 \times 10^{18}\text{-}1 \times 10^{19}$ cm$^{-3}$, $1 \times 10^{19}\text{-}1 \times 10^{20}$ cm$^{-3}$ and $1 \times 10^{20}\text{-}5 \times 10^{20}$ cm$^{-3}$, respectively) to be suitable for electron collection.

2. Providing Si handling wafer 620 with oxide layer 612 and activating surface 614 of oxide layer 612 by a plasma activation step to make it ready for low-temperature oxide-to-oxide fusion bonding. Optionally subjecting surface 606 of implanted wafer 602 to CMP, then let it oxidize and activate in a plasma activation step to make it ready for low-temperature oxide-to-oxide fusion bonding.

3. Bonding wafers 602 and 620 together by low-temperature oxide-to-oxide fusion bonding thereby forming oxide bond 603.

4. Thinning bonded wafer 602 to wafer 618 with thickness 619 of about 5-40 μm or preferably 10-30 μm or even more preferably about 5-10 μm or even about 3-5 μm, giving rise to SOI wafer 616 consisting of substrate 622, oxide box 612 and Si layer 618 with surface 624. Si layer 618 comprises heavily doped regions 604 adjacent to box 612.

5. CMOS processing Si layer 618 of SOI wafer 616, including forming highly conducting regions of heavily doped plugs 610 of width 611 spaced at a distance 613 defining the pixel size L and communicating with CMOS processed pixel readout electronics 615. When adapted for X-ray detection, the pixel size L may range within 100-200 μm, 50-100 μm or 20-50 μm or even 5-20 μm. When adapted for infrared detection, the pixel size L may range within about 2-40 μm or preferably about 5-30 μm or even more preferably about 10-20 μm. Optionally including forming of at least two special wafer alignment features in the form of alignment marks 44, 46 on wafer 616 spaced far apart, for example close to its edges on opposite sides. Plugs 610 serve as charge collectors together with implants 604 to which they are electrically connected by ohmic contacts. If high resistivity Si wafer 602 is weakly p-doped, charge collectors 610 are preferably n$^+$-doped with a resistivity of about 0.2-10 mΩ cm, or preferably about 0.2-1 mΩ cm (doping levels of about $5 \times 10^{18}$-$5 \times 10^{20}$ cm$^{-3}$ or preferably about $5 \times 10^{19}$-$5 \times 10^{20}$ cm$^{-3}$) to be suitable for electron collection. Charge collector plugs 610 may be formed for example by etching holes through Si layer 618 down to heavily doped regions 604 which are then filled with heavily n-doped material for example in a CVD step to contact highly doped regions 604, thereby increasing the effective area of charge collection to the size of implants 604. The width 611 of plugs 610 may for example be in the range of 0.5-2.5 μm or preferably about 1-1.5 μm. In general the CMOS processing additionally results in CMOS stack 617 of multiple oxide and metal layers on top of Si surface 624 of wafer 616 which is only partly shown here and just indicated by number in the following in order not to overload the figures. It is understood that to allow for hole collection the conduction type of wafer 602 and of heavily doped regions 604 and charge collectors 610 should be inverted.

6. Planarizing the surface of CMOS stack 617 on top of Si surface 624 of processed wafer 616 for example by CMP to make it flat and smooth for oxide-to-oxide bonding with an RMS surface roughness below about 0.5 nm, and activating the planarized surface of the CMOS stack by a plasma activation step. Providing handling wafer 630 with oxide layer 632 and activating surface 634 of oxide layer 632 by a similar plasma activating step to make it ready for oxide-to-oxide bonding.

7. Bonding the activated surface of the planarized CMOS stack 617 on top of Si surface 624 of processed wafer 616 and activated surface 634 of handling wafer 630 by low-temperature oxide-to-oxide fusion bonding thereby forming bonded wafer stack 636.

8. Providing thinned readout wafer 670 by removing handling wafer 620 from CMOS processed wafer 616 for example by a combination of mechanical grinding and reactive ion etching (RIE). Oxide box 612 may thereby act as an etch stop and can subsequently be removed for example in a modified RIE step in which exposed surface 606, consisting of substantially insulating surface 607 of low doped wafer 602 and conducting surface 609 of heavily doped implant 604 may in turn act as an etch stop. Surface 606 may optionally be subjected to CMP in order to make thinned readout wafer 670 flat and smooth with an RMS surface roughness below about 0.5 nm for covalent bonding with an absorber wafer.

Figure 6:
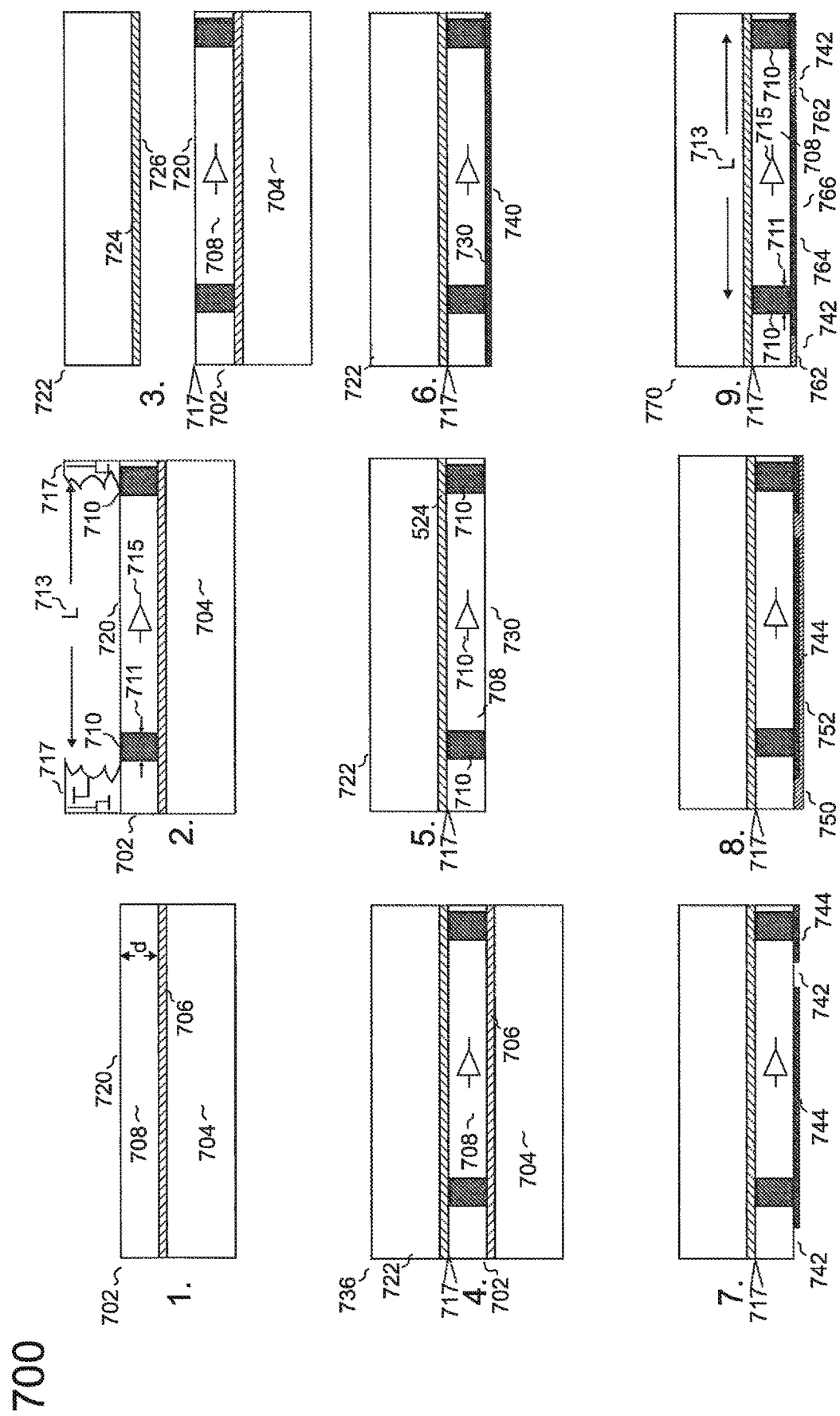
FIG. 6 is the process flow of the invention for the fabrication of a thin readout wafer of the invention with metallic charge collector plugs and metal layers.

Referring now to FIG. 6, the realization of third embodiment 700 of a thin readout wafer may comprise the following fabrication steps:

1. Providing wafer 702, which may preferably be a SOI wafer with Si substrate 704, oxide box 706 and Si layer 708 with surface 720. The thickness d of Si layer 708 should preferably be in the range of about 5-40 μm or preferably 10-30 μm or even more preferably about 5-10 μm or even about 3-5 μm. It should be low-doped with a resistivity above about 500 Ωcm, preferably at least 1-2 kΩ cm or even more preferably at least 2-5 kΩ cm. Si layer 708 may for example be an epitaxial layer. Processing Si layer 708 of wafer 702, including the formation of highly conducting regions of heavily doped plugs 710 acting as charge collectors of width 711 and spacing 713 corresponding to the pixel size L, the charge collectors communicating with CMOS processed pixel readout electronics 715. When adapted for X-ray detection, the pixel size L may range within 100-200 μm, 50-100 μm or 20-50 μm or even 5-20 μm. When adapted for infrared detection, the pixel size L may range within about 2-40 μm or preferably 5-30 μm or even more preferably about 10-20 μm. Optionally including the formation of at least two special wafer alignment features in the form of alignment marks 44, 46 on wafer 702 spaced far apart, for example close to its edges on opposite sides. When for example high resistivity Si layer 708 is weakly p-doped, charge collectors 710 are provided n$^+$-doped with a resistivity of about 5-20 mΩ cm, or preferably about 0.7-5 mΩ cm or even 0.2-0.7 mil cm (doping levels of about $1 \times 10^{18}$-$1 \times 10^{19}$ cm$^{-3}$, $1 \times 10^{19}$-$1 \times 10^{20}$ cm$^{-3}$ and $1 \times 10^{20}$-$5 \times 10^{20}$ cm$^{-3}$, respectively) to be suitable for electron detection. Charge collectors 710 may be formed for example by etching holes through Si layer 708 which are then filled with heavily n-doped material for example in a CVD step. Their width 711 may for example be in the range of 0.5-2 μm or preferably about 1-1.5 μm. In general the CMOS processing additionally results in CMOS stack 717 of multiple oxide and metal layers on top of Si surface 720 of wafer 702 which is only partly shown here and just indicated by number in the following in order not to overload the figures. It is understood that to allow for hole collection the conduction type of wafer 702 and of charge collectors 710 should be inverted.

3. Planarizing the surface of CMOS stack 717 on processed wafer 702 for example by CMP to make it flat and smooth for oxide-to-oxide bonding, keeping the RMS surface roughness below about 0.5 nm, and activating the planarized surface by a plasma activation step. Providing handling wafer 722 with oxide layer 724 and activating surface 726 of oxide layer 724 by a similar plasma activating step.

4. Bonding the activated surfaces of planarized CMOS 717 stack on wafer 702 and handling wafer 722 by low-temperature oxide-to-oxide fusion bonding thereby forming bonded wafer stack 736.

5. Removing substrate 704 of CMOS processed wafer 702 for example by a combination of mechanical grinding and reactive ion etching (RIE). Oxide box 706 may thereby act as an etch stop and can subsequently be removed for example in a modified RIE step in which exposed surface 730 of Si layer 708 may in turn act as an etch stop.

6. Metallizing surface 730 of the thinned readout wafer bonded to handling wafer 722, preferably with metal layer 740 forming a Schottky barrier with low-doped Si layer 708 and forming an ohmic contact with heavily doped charge collectors 710. Optionally, metal layer 740 may be deposited in a lift-off process whereby part of surface 730 remains uncoated leaving openings 742 for pixel isolation. Thus patterned metal layer 740 forming an ohmic contact with heavily doped plugs 710 thereby increases the effective area for charge collection.

7. Optionally patterning metal layer 740 in case that it has been deposited as a continuous layer in step 6, forming openings 742 for pixel isolation separating highly conducting regions of metal patches 744. Thus optionally patterned metal layer 740 forming an ohmic contact with heavily doped plugs 710 thereby increases the effective area for charge collection.

8. Depositing oxide layer 750 to fill openings 742 for example in a low-temperature plasma-enhanced chemical vapour deposition (PECVD) process by means of which also metal patches 744 may be covered with oxide 752.

9. Providing thinned readout wafer 770 by planarizing oxide layer 750 for example in a CMP step, thereby leaving oxide with surface 762 only in openings 742 while leaving conducting metal surface 764 bare of oxide. With these steps third embodiment of thinned readout wafer 770 with flat and smooth surface 766 with an RMS roughness below about 0.5 nm, consisting of insulating oxide surface 762 and conducting metal surface 764 is now ready for low-temperature bonding to an absorber wafer.

Referring now to FIG. 7A, the realization of first embodiment 800 of an absorber wafer 850 may comprise the following fabrication steps, the order of some of which may be interchanged:

1. Providing absorber wafer 802 with upper surface 804 and lower surface 806. Optionally forming at least two special wafer alignment features in the form of alignment marks 54, 56 on upper surface 804 of wafer 802 spaced far apart, for example close to its edges on opposite sides. Wafer 802 may be a single crystal Si, Ge, diamond, SiC, GaAs, CdTe or CdZnTe alloy wafer of high purity which, when adapted for X-ray detection, is preferably undoped or doped only to the extent necessary to assure the highest possible resistivity. A Si wafer may for example have a resistivity of 10-20 k$\Omega$ cm, a Ge wafer a resistivity of about 50 $\Omega$cm, SiC about $10^7$-$10^9$ $\Omega$cm, GaAs about $10^9$ $\Omega$cm, CdTe about $10^9$ $\Omega$cm and CdZnTe alloys about $10^{10}$ $\Omega$cm. High resistivity wafer 802 may be weakly n-conducting or weakly p-conducting. Wafer 802 does not necessarily need to consist of a single, uniform material. It can be an epitaxial wafer with an epitaxial layer on a single crystal substrate wafer. When adapted for X-ray detection, the epitaxial layer may for example be CdTe or $Cd_{1-x}Zn_xTe$ with x for example in the range of 5-15%, or preferably of about 10% and a thickness for example of 200-500 μm. The substrates may for example be Si or Ge wafers or preferably wafers from III-V semiconductors, such as GaAs and InSb, in order to avoid antiphase domains to form during the epitaxial growth. For epitaxial growth on lattice mismatched substrates it may be advantageous to use compositional grading to lower the dislocation density. Since for example ZnSe is closely lattice matched to GaAs and Ge (lattice parameters of 0.567 nm and 0.565 nm, respectively), grading up to the lattice parameter of CdTe of 0.648 nm can be realized for example by first grading $ZnSe_{1-x}Te_x$ from x=0 to x=1 (pure ZnTe with lattice parameter of ZnTe=0.610 nm), and subsequently grading $Cd_xZn_{1-x}$Te to pure CdTe or any desirable Zn content. When InSb substrates are used on the other hand CdTe need not be graded because it is both very well lattice matched as well as thermally matched (equal thermal expansion coefficients). When adapted for infrared detection, absorber wafer 802 may be a single crystal group IV semiconductor wafer, for example consisting of Si, Ge, SiGe alloys or SiGeSn alloys, or a single crystal III/V semiconductor wafer, for example consisting of InAs, InGaAs alloys or InSb, or a single crystal II/VI semiconductor wafer, for example consisting of HgCdTe alloys. Absorber wafer 802 may also be an epitaxial wafer optionally comprising any of these materials in the form of a thin epitaxial layer on a single crystal substrate for example of Si, Ge, GaAs, CdTe or a CdZnTe alloy. Absorber wafer 802 may further comprise any combination of these materials in a more complicated structure including differently doped layers according to embodiments 300, 300', and 300".

2. Providing wafer 802 with patterned, electrically insulating dielectric mask 808 with mask openings (windows) 812 on upper surface 804. Dielectric mask 808 is preferably a silicon dioxide ($SiO_2$) mask in which case regions 808 are oxide regions. The minimum width 810 of mask openings 812 may approximately correspond to widths 511, 611, 711 of charge collectors 510, 610, 710 on thinned readout wafers 570, 670, 770. The total width 813 of mask openings and patch size 814 equals pixel size 113, 213, 313, 413, 513, 613, 713 of the readout electronics.

3. Filling mask openings 812 with homo-epitaxial absorber material 818 which is heavily doped during the epitaxial growth, for example to a level between $1\times10^{18}$-$1\times10^{19}$ $cm^{-3}$ or preferably $1\times10^{19}$-$1\times10^{20}$ $cm^{-3}$ or even $1\times10^{20}$-$5\times10^{20}$ $cm^{-3}$, and thereby electrically highly conducting. Material 818 may thereby cover part of dielectric mask 808 by lateral epitaxial overgrowth, resulting in corrugated surface 822. The filling may be accomplished for example by selective epitaxial growth into mask openings 812. The filling material 818 may for example be of the opposite conduction (doping) type to that of high resistivity wafer 802.

4. Optionally providing heavily doped layer 820, for example doped to a level between $5\times10^{18}$-$5\times10^{19}$ $cm^{-3}$ or even $5\times10^{19}$-$5\times10^{20}$ $cm^{-3}$, on lower surface 806 of absorber wafer 802 adapted to act as a back contact of the detector. Layer 820 is thereby for example of a doping type opposite to that of epitaxial material 818. Doped layer 820 may be provided for example by homo-epitaxially growing absorber material and doping during growth. Alternatively, heavily doped layer 820 may be provided by ion implantation of lower absorber surface 806.

5. Providing absorber wafer 850 by planarizing corrugated surface 822 of absorber wafer 802 coated with epitaxial material 818 and dielectric 808 for example by CMP to provide flat and smooth surface 824 with an RMS roughness below about 0.5 nm consisting of semiconductor surfaces 826 and insulating oxide surfaces 827. After an additional surface activation step of surface 824 absorber wafer 850 comprising X-ray absorption layer 852 is ready for bonding to thinned readout wafer 570, 670, and 770.

It is understood that by construction absorber wafer 850 needs to be accurately aligned with readout wafer 570, 670, and 770 in the bonding tool, because the spacing of highly conducting material 818 is substantially equal to that of charge collector plugs 510, 610, and 710 which defines pixel size 813.

In an aspect of embodiment 800 absorber wafer 850 may be realized by implantation steps, wherein poorly conducting or insulating regions 808 are formed for example by amorphization or oxygen or carbon implantation, and regions with highly conducting material 818 by dopant implantation.

Referring now to FIG. 7B, the realization of second embodiment 800' of an absorber wafer 850' may comprise the following alternative fabrication steps, the order of some of which may be interchanged:

1. Providing absorber wafer 802' with upper surface 804' and lower surface 806'. Optionally forming at least two special wafer alignment features in the form of alignment marks 54, 56 on upper surface 804' of wafer 802' spaced far apart, for example close to its edges on opposite sides. Wafer 802', which, when adapted for X-ray detection, may for example be a group IV semiconductor wafer, such as a single crystal Si, Ge, SiC, or diamond wafer, or a III/V semiconductor wafer, such as a GaAs wafer, or a II/VI semiconductor wafer, such as a CdTe or CdZnTe alloy wafer, all of which should be of high purity and preferably undoped or doped only to the extent necessary to assure the highest possible resistivity of each constituent material. A Si wafer may for example have a resistivity of 10-20 k$\Omega$ cm, a Ge wafer a resistivity of about 50 $\Omega$cm, SiC about $10^7$-$10^9$ $\Omega$cm, GaAs about $10^9$ $\Omega$cm, CdTe about $10^9$ $\Omega$cm and a CdZnTe alloy wafer about $10^{10}$ $\Omega$cm. High resistivity wafer 802' may be weakly n-conducting or weakly p-conducting. Wafer 802' does not necessarily need to consist of a single, uniform material. It can be an epitaxial wafer with an epitaxial layer on a single crystal substrate wafer. When adapted for X-ray detection, the epitaxial layer may for example be CdTe or $Cd_{1-x}Zn_xTe$ with x for example in the range of 5-15%, or preferably of about 10% and a thickness for example of 200-500 μm. The substrates may for example be single crystal Si or Ge wafers or preferably single crystal wafers from III-V semiconductors, such as GaAs and InSb, in order to avoid antiphase domains to form during the epitaxial growth. For epitaxial growth on lattice mismatched substrates it may be advantageous to use compositional grading to lower the dislocation density. Since for example ZnSe is closely lattice matched to GaAs and Ge (lattice parameters of 0.567 nm and 0.565 nm, respectively), grading up to the lattice parameter of CdTe of 0.648 nm can be realized for example by first grading $ZnSe_{1-x}Te_x$ from x=0 to x=1 (pure ZnTe with lattice parameter of ZnTe=0.610 nm), and subsequently grading $Cd_xZn_{1-x}Te$ to pure CdTe or any desirable Zn content. When InSb substrates are used on the other hand CdTe need not be graded because it is both very well lattice matched as well as thermally matched (equal thermal expansion coefficients). When adapted for infrared detection, absorber wafer 802' may be a single crystal group IV semiconductor wafer, for example consisting of Si, Ge, SiGe alloys or SiGeSn alloys, or a single crystal MN semiconductor wafer, for example consisting of InAs, InGaAs alloys or InSb, or a single crystal II/VI semiconductor wafer, for example consisting of HgCdTe alloys. Absorber wafer 802' may also be an epitaxial wafer optionally comprising any of these materials in the form of a thin epitaxial layer on a single crystal substrate for example of Si, Ge, GaAs, CdTe or a CdZnTe alloy. Absorber wafer 802' may further comprise any combination of these materials in a more complicated structure including differently doped layers according to embodiments 300, 300', and 300".

2. Providing upper surface 804' of wafer 802' heavily doped, highly conducting layer 817', for example doped to a level between $1 \times 10^{18}$-$1 \times 10^{19}$ cm$^{-3}$ or preferably $1 \times 10^{19}$-$1 \times 10^{20}$ cm$^{-3}$ or even $1 \times 10^{20}$-$5 \times 10^{20}$ cm$^{-3}$, for example by ion implantation or by homo-epitaxial growth of absorber material. Layer 817' may be provided in the form of a continuous film with surface 821'. Layer 817' may for example be of the opposite conduction (doping) type to that of high resistivity wafer 802'.

3. Patterning layer 817' into heavily doped regions 818' of width 810' separated by electrically insulating oxide regions 808' of width 814'. The minimum width 810' of doped regions 818' may approximately correspond to widths 511, 611, 711 of charge collectors 510, 610, 710 on thinned readout wafers 570, 670, 770. The total width of doped regions 818' and oxide regions 808' equals pixel size 113, 213, 313, 413, 513, 613, 713, 813, 813' of the readout electronics. The patterning of layer 817' may be accomplished for example by selective oxidation by means of which its regions 808' of width 814' are completely oxidized through and thereby made electrically insulating resulting in corrugated surface 822' of wafer 202'.

4. Optionally providing heavily doped layer 820', for example doped to a level between $5 \times 10^{18}$-$5 \times 10^{19}$ cm$^{-3}$ or even $5 \times 10^{19}$-$5 \times 10^{20}$ cm$^{-3}$, on lower surface 806' of absorber wafer 802' adapted to act as a back contact of the detector. Layer 820' is thereby of a doping type opposite to that of epitaxial material 818'. Doped layer 820' may be provided for example by ion implantation of lower absorber surface 806'. Alternatively, heavily doped layer 820' may be provided by homo-epitaxially growing absorber material and doping during growth.

5. Providing absorber wafer 850' by planarizing corrugated patterned surface 822' of absorber wafer 802' coated with doped regions 818' and oxide regions 808' for example by CMP to provide flat and smooth surface 824' with an RMS roughness below about 0.5 nm, consisting of semiconductor surfaces 826' and oxide surfaces 827' ready for bonding with thinned readout wafer 570, 670 and 770. After an additional surface activation step of surface 824' absorber wafer 850' comprising X-ray absorption layer 852' is ready for bonding to thinned readout wafer 570, 670, and 770. By construction absorber wafer 850' of embodiment 800' needs to be accurately aligned with readout wafer 570, 670, 770, because the spacing of doped regions 818' is substantially equal to that of charge collector plugs 510, 610, 710 which defines pixel size 813'.

Figure 7C:
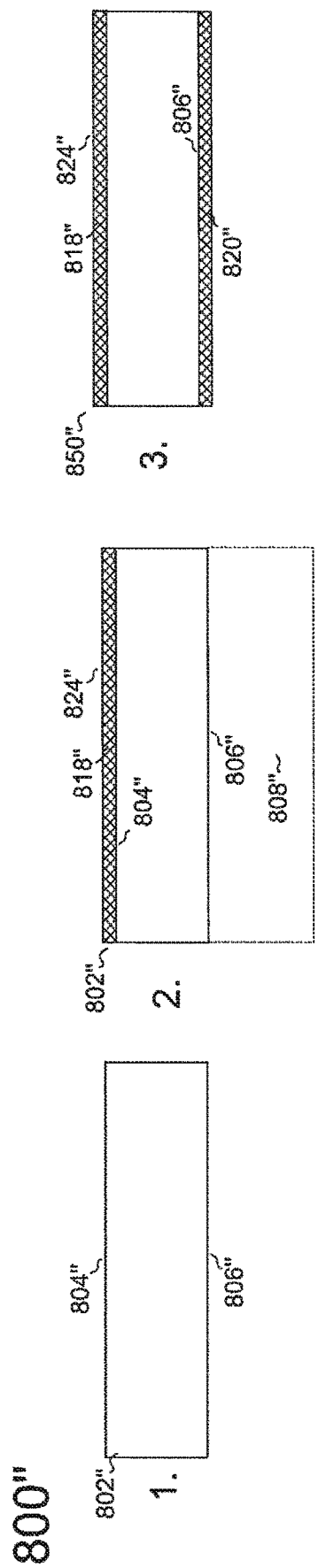
FIG. 7C is the process flow of the invention for the fabrication of an unpatterned absorber wafer of the invention.

Referring now to FIG. 7C, the realization of third embodiment 800" of an absorber wafer 850" may comprise the following alternative fabrication steps, the order of some of which may be interchanged:

1. Providing absorber wafer 802" with upper surface 804" and lower surface 806". Optionally forming at least two special wafer alignment features in the form of alignment marks 54, 56 on upper surface 804" of wafer 802" spaced far apart, for example close to its edges on opposite sides. Wafer 802", which, when adapted for X-ray detection, may for example be a group IV semiconductor wafer, such as a single crystal Si, Ge, SiC, or diamond wafer, or a III/V semiconductor wafer, such as a GaAs wafer, or a II/VI semiconductor wafer, such as a CdTe or a CdZnTe alloy wafer, all of which should be of high purity and preferably undoped or doped only to the extent necessary to assure the highest possible resistivity of each constituent material. A Si wafer may for example have a resistivity of 10-20 k$\Omega$ cm, a Ge wafer a resistivity of about 50 $\Omega$cm, SiC about $10^7$-$10^9$11 cm, GaAs about $10^9$ $\Omega$cm, CdTe about $10^9$ $\Omega$cm and CdZnTe alloy about $10^{10}$ $\Omega$cm. High resistivity wafer 802" may be weakly n-conducting or weakly p-conducting. Wafer 802" does not necessarily need to consist of a single, uniform material. It can be an epitaxial wafer with an epitaxial layer on a single crystal substrate wafer. When adapted for X-ray detection, the epitaxial layer may for example be CdTe or $Cd_{1-x}Zn_xTe$ with x for example in the range of 5-15%, or preferably of about 10% and a thickness for example of 200-500 μm. The substrates may for example be single crystal Si or Ge wafers or preferably single crystal wafers from III-V semiconductors, such as GaAs and InSb, in order to avoid antiphase domains to form during the epitaxial growth. For epitaxial growth on lattice mismatched substrates it may be advantageous to use compositional grading to lower the dislocation density. Since for example ZnSe is closely lattice matched to GaAs and Ge (lattice parameters of 0.567 nm and 0.565 nm, respectively), grading up to the lattice parameter of CdTe of 0.648 nm can be realized for example by first grading $ZnSe_{1-x}Te_x$ from x=0 to x=1 (pure ZnTe with lattice parameter of ZnTe=0.610 nm), and subsequently grading $Cd_xZn_{1-x}Te$ to pure CdTe or any desirable Zn content. When InSb substrates are used on the other hand CdTe need not be graded because it is both very well lattice matched as well as thermally matched (equal thermal expansion coefficients). When adapted for infrared detection, absorber wafer 802" may be a single crystal group IV semiconductor wafer, for example consisting of Si, Ge, SiGe alloys or SiGeSn alloys, or a single crystal III/V semiconductor wafer, for example consisting of InAs, InGaAs alloys or InSb, or a single crystal II/VI semiconductor wafer, for example consisting of HgCdTe alloys. Absorber wafer 802" may also be an epitaxial wafer optionally comprising any of these materials in the form of a thin epitaxial layer on a single crystal substrate for example of Si, Ge, GaAs, CdTe or a CdZnTe alloy. Absorber wafer 802" may further comprise any combination of these materials in a more complicated structure including differently doped layers according to embodiments 300, 300', and 300".

2. Providing upper surface 804" of wafer 802" with layer 818", which may be heavily doped for example to a level above about $10^{18}$ cm$^{-3}$ or between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, for example by ion implantation or by homo-epitaxial growth of absorber material. Layer 818" may be provided in the form of a continuous film with surface 824". Preferably, layer 818" is of the opposite conduction (doping) type to that of the bulk of high resistivity wafer 802" or to the doping type of the adjacent layer in case that wafer 802" consists of a layer stack adapted for infrared detection according to embodiments 300, 300', 300". Optionally, lower surface 806" may be bonded to carrier wafer 808" before optionally subjecting surface 824" of layer 818" to CMP in order for its roughness to be low enough for covalent semiconductor bonding. An RMS roughness below 0.5 nm has for example been found to be satisfactory.

3. In the absence of carrier wafer 808" optionally providing lower surface 806" of absorber wafer 802" with highly conducting layer 820" for example doped to a level between $5\times10^{18}$-$5\times10^{19}$ cm$^{-3}$ or even $5\times10^{19}$-$5\times10^{20}$ cm$^{-3}$, to facilitate ohmic behaviour of the metallic back contact of the detector.

By construction of absorber wafer 850" of embodiment 800", no precise alignment is required with readout wafer 570, 670, 770 in the covalent bonding tool.

Figure 8:
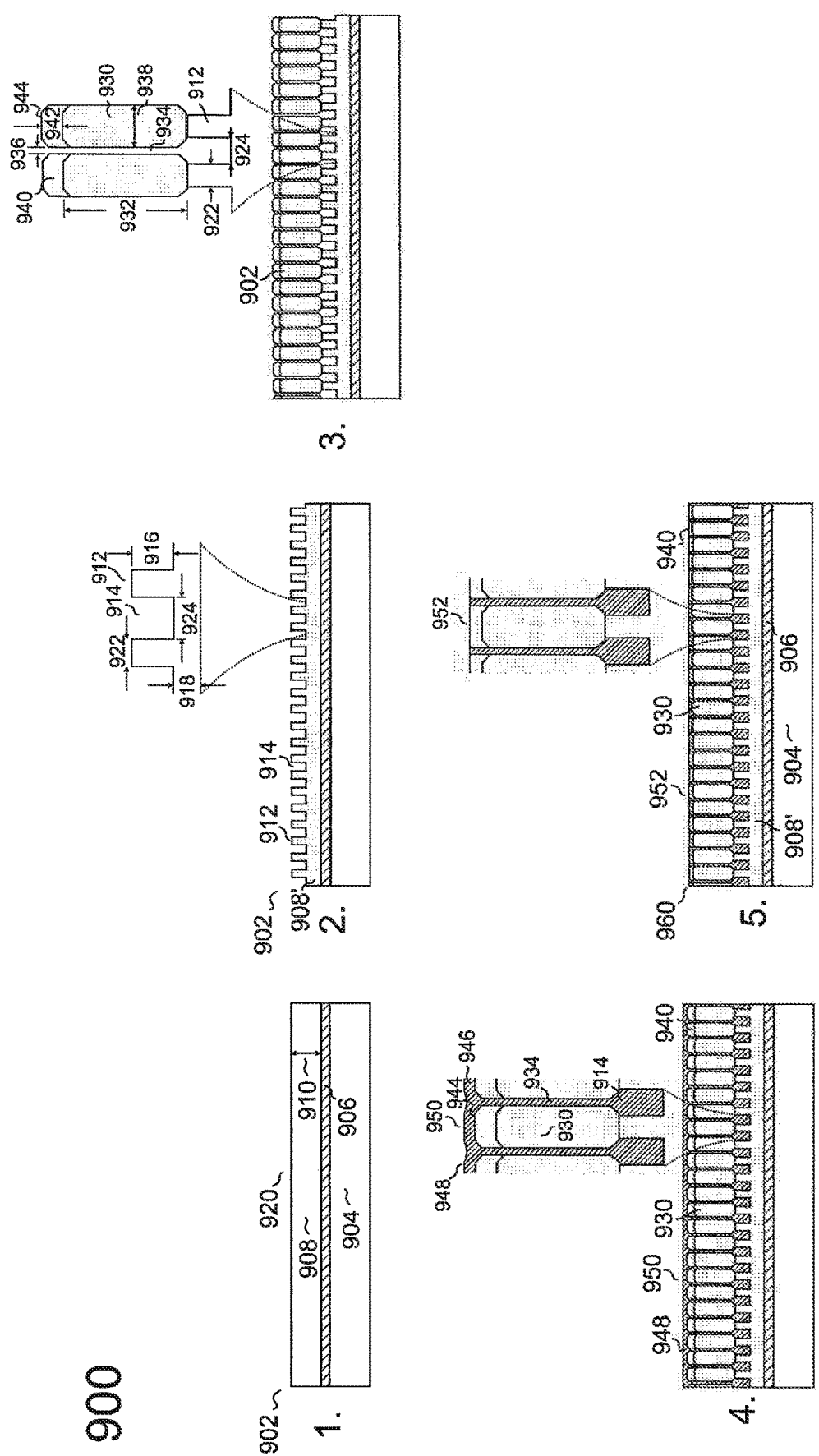
FIG. 8 is the process flow of the invention for the fabrication of an absorber wafer of the invention comprising epitaxial pillars with highly doped caps.

Referring now to FIG. 8, the realization of fourth embodiment 900 of an absorber wafer adapted to the special case of an epitaxial SiGe alloy or pure Ge layer in the form of space-filling crystals of the kind described for example in International Patent Application No. WO 2016/097850 to von Kanel, the entire disclosure of which is hereby incorporated by reference, may comprise the following fabrication steps:

1. Providing wafer 902, which may preferably be a SOI wafer with Si substrate 904, oxide box 906 and Si layer 908. The thickness 910 of Si layer 908 should preferably be in the range of about 10-30 μm or more preferably about 15-25 μm. Preferably, Si layer 908 is heavily p-doped with a resistivity in the range of about 1-10 m$\Omega$ cm. Alternatively, wafer 902 may be for example a p-doped Si wafer with a standard thickness for example of about 700 μm and with a similar resistivity as Si layer 908 of an SOI wafer.

2. Providing a patterned substrate 908' for SiGe epitaxy by patterning Si layer 908 in the form of pillars 912 separated by trenches 914 for example by RIE. Si pillars 912 may have a height 916 of around 6-10 μm, leaving Si thickness 918 unetched. The pillars may have a width 922 in the range of about 2-50 μm, the exact choice depending on the extent to which SiGe crystals grown on top are desired to be dislocation-free. Widths 922 of about 2-5 μm may result in SiGe crystals free from threading dislocations (see for example C. V. Falub et al. in Science 335, 1330 (2012), the entire disclosure of which is hereby incorporated by reference) or even entirely dislocation-free for alloys with compositional grading at a suitable low rate (see for example F. Isa et al. in Acta Materialia 114, 97-105 (2016), the entire disclosure of which is hereby incorporated by reference). The width 924 of trenches 914 is preferably chosen to be in the range of about 2-5 μm or more preferably of about 3-4 μm. Pillars 912 are preferably under-etched in order to enhance elastic stress relaxation and increase the width of dislocation-free SiGe crystals (see for example F. Isa et al., in Appl. Phys. Lett. 109, 182112 (2016), the entire disclosure of which is hereby incorporated by reference). If alternatively wafer 902 is for example just a p-doped Si wafer, it may be patterned in a similar way as Si layer 908 of an SOI wafer to act as a substrate 908' for SiGe epitaxy.

3. Epitaxially growing optionally graded $Si_{1-x}Ge_x$ alloy crystals 930, preferably with a final Ge content x in the range of 0.6≤x≤1 and even more preferably in the range of 0.7≤x≤0.9 on top of Si pillars 912. Growing crystals 930 to a height 932 of about 20-50 μm, or preferably about 50-100 μm, or even more preferably about 100-300 μm for example by low-energy plasma-enhanced chemical vapour deposition (LEPECVD), thereby avoiding neighbouring crystals to coalesce by leaving open gaps 934. Widths 936 of gaps 934 may for example be as small as a few tens of nanometers, such that the width 938 of SiGe crystals 930 becomes approximately the sum of Si pillar width 922 and trench width 924. Epitaxial SiGe crystals 930 are preferably not intentionally doped but capped with highly conducting, preferably heavily n-doped cap 940, for example doped to a level between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, with a thickness 942 of about 0.5-5 μm or preferably about 1-2 μm.

4. Filling Si trenches 914 and gaps 934 between SiGe crystals 930 with insulating material 946. Filling material 946 is preferably an oxide or a combination of oxides and may for example be inserted by atomic layer deposition (ALD). Filling material may also cover surface 944 of SiGe crystals 930, forming continuous insulating layer 948 with surface 950.

5. Providing SiGe absorber wafer 960 by planarizing surface 950 of layer 948 for example by CMP, thereby removing insulating layer 948 from surface 944 of SiGe crystals 930, to provide flat and smooth surface 952 with an RMS roughness below about 0.5 nm suitable for wafer bonding with thinned readout wafer 670, 770.

By construction of absorber wafer 960 of embodiment 900, no precise alignment is required with readout wafer 570, 670, 770 for covalent semiconductor bonding in the bonding tool.

Figure 9:
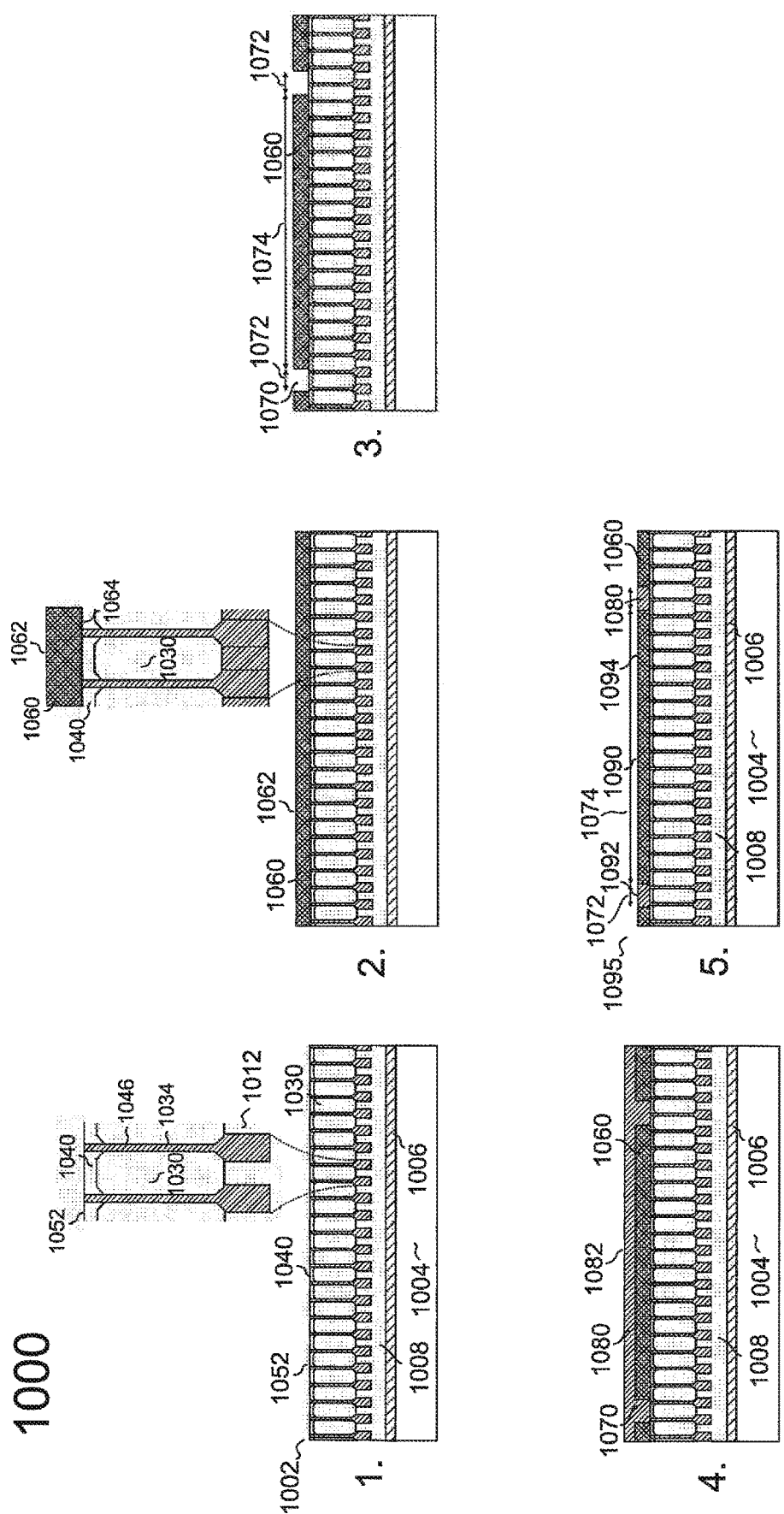
FIG. 9 is the process flow of the invention for the fabrication of an absorber wafer of the invention comprising epitaxial pillars with highly doped caps, epilayer and oxide regions for pixel isolation.

Referring now to FIG. 9, the realization of fifth embodiment 1000 of an absorber wafer adapted to the special case of an epitaxial SiGe alloy or pure Ge layer in the form of space-filling crystals of the kind described for example in PCT No. WO 2016/097850 to von Känel, the entire disclosure of which is hereby incorporated by reference, may comprise the following fabrication steps:

1. Providing wafer 1002, which may be an SOI wafer with Si substrate 1004, oxide box 1006 and Si layer 1008, having undergone all the processing steps of fourth embodiment 900 (see FIG. 8) to exhibit planarized surface 1052 consisting of heavily doped regions 1040, for example doped to a level between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, on top of SiGe crystals 1030 with gaps 1034 filled with insulating material 1046. Alternatively, wafer 1002 may be a Si wafer with a standard thickness of about 700 μm, having undergone all the processing steps of the alternative wafer of fourth embodiment 900 to act as a patterned substrate for SiGe epitaxy.

2. Providing conducting cap layer 1060 with surface 1062 on planarized surface 1052. Cap layer 1060 may for example be a heavily doped epitaxial SiGe layer deposited by thermal CVD or LEPECVD, for example doped to a level between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$. Alternatively, layer 1060 may be a metal layer, forming ohmic contact 1064 with heavily doped regions 1040 on top of SiGe crystals 1030.

3. Providing openings 1070 of width 1072 in layer 1060 preferably by photolithography and dry etching, leaving conducting patches of width 1074. The sum of widths 1072 and 1074 thereby defines pixel size 113, 213, 313, 413, 513, 613, 713, 813, and 1013. Optionally, this patterning step 3 and deposition step 2 can be interchanged for example when a lift-off process is being used.

4. Providing electrically insulating layer 1080 which is preferably an oxide such as $SiO_2$ with surface 1082 on layer 1060, thereby filling gaps 1070.

5. Providing absorber wafer 1095 by planarizing insulating layer 1080 to obtain smooth bondable surface 1090 with an RMS roughness below about 0.5 nm consisting of surface regions 1092 of insulator 1080, such as oxide regions, and surface regions 1094 of conducting cap layer 1060.

By construction of absorber wafer 1095 of fifth embodiment 1000, precise alignment is required with readout wafer 570, 670, 770 for covalent semiconductor bonding in the bonding tool. In order to permit accurate alignment absorber wafer 1095 may be equipped with at least two special wafer alignment features in the form of alignment marks 54, 56 positioned for example close to the wafer edges on opposite sides. With the help of superimposing such alignment marks the rotational misalignment of 200 mm wafers may be kept within about $(2-5)\times10^4$ degrees and the lateral misalignment within about 0.5-1 μm. Similar accuracy may be obtained in case of smaller wafer bonding.

In an aspect of the embodiment, the patterning and gap filling in steps 3 and 4 may be omitted. This has the advantage that absorber wafer 1095 and wafer 570, 670, 770 again do not have to be accurately aligned for covalent semiconductor bonding in the bonding tool.

Figure 10:
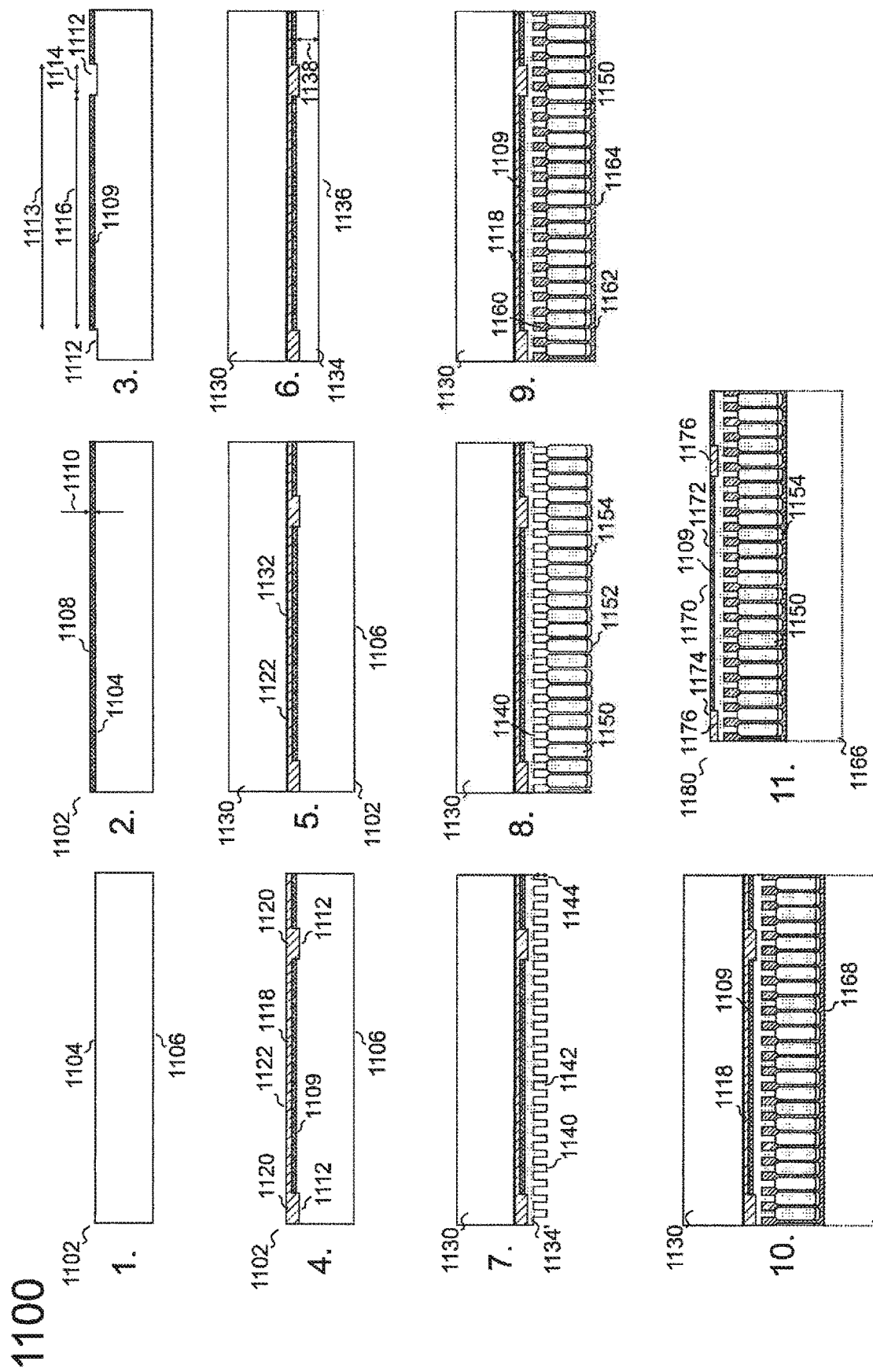
FIG. 10 is the process flow of a variant of the invention for the fabrication of an absorber wafer comprising epitaxial pillars with highly doped caps, metal layer and oxide regions for pixel isolation.

Referring now to FIG. 10, the realization of sixth embodiment 1100 of an absorber wafer adapted to the special case of an epitaxial SiGe alloy or pure Ge layer in the form of space-filling crystals of the kind described for example in International Patent Application No. WO 2016/097850 to von Kanel, the entire disclosure of which is hereby incorporated by reference, may comprise the following fabrication steps:

1. Providing highly resistive Si wafer 1102 with upper surface 1104 and lower surface 1106. Wafer 1102 has preferably a resistivity of at least 1-2 kΩ cm, or, more preferably, of at least 2-5 kΩ cm, or even more preferably of at least 5-20 kΩ cm.

2. Providing highly conducting layer 1108 on upper surface 1104 of wafer 1102. Layer 1108 may for example be a heavily doped Si layer, for example doped to a level between $1\times10^{18}$-$1\times10^{19}$ cm$^{-3}$ or preferably $1\times10^{19}$-$1\times10^{29}$ cm$^{-3}$ or even $1\times10^{20}$-$5\times10^{20}$ cm$^{-3}$, formed for example by CVD or by ion implantation followed by an implantation anneal. Alternatively, layer 1108 may be a metal layer forming a Schottky barrier with highly resistive wafer 1102. Layer 1108 may have a thickness 1110 of about 0.2-0.5 µm or preferably about 0.5-1 µm.

3. Patterning layer 1108 by opening windows 1112 of width 1114, for example by photolithography and RIE. The sum of widths 1114 of windows 1112 and remaining heavily doped, conducting regions 1109 of width 1116 of conductive layer 1108 thereby defines pixel size 113, 213, 313, 413, 513, 613, 713, 813, 1013, 1113 of the pixel detector.

4. Providing insulating layer 1118 on top of conducting layer regions 1109, thereby also filling windows 1112 and creating insulating regions 1120. Insulating layer 1118 consists preferably of $SiO_2$, deposited for example by PECVD. Preferably, surface 1122 of insulating layer 1118 is subjected to CMP to make it plane and smooth with an RMS roughness below about 0.5 nm for subsequent wafer bonding. There are several options to create conducting regions 1109 separated by oxide regions 1120. A preferred one may be selective thermal oxidation of wafer 1102 to form oxide regions 1120 along with ion implantation to create conducting regions 1109, preferably followed by a CMP to make surface 1122 ready for bonding.

5. Bonding oxidized handling wafer 1130 onto surface 1122 of wafer 1102, thereby forming oxide-to-oxide bond 1132.

6. Thinning wafer 1102 from lower surface 1106 to obtain thinned wafer 1134 with lower surface 1136 and thickness 1138 preferably in the range of about 10-30 µm or more preferably about 15-25 µm.

7. Patterning lower surface 1136 of thinned wafer 1134 in the form of pillars 1140 separated by trenches 1142 for example by RIE. Si pillars 1140 may have a height 1144 of around 6-10 µm, leaving a Si thickness of about 5-15 µm unetched. The pillars may have a width in the range of about 2-50 µm, the exact choice depending on the Substitute specification SHEET 45 clean copy extent to which SiGe crystals grown on top of this patterned substrate 1134' are desired to be dislocation-free. Widths of about 2-5 µm may result in SiGe crystals free from threading dislocations (see for example C. V. Falub et al. in Science 335, 1330 (2012), the entire disclosure of which is hereby incorporated by reference) or even entirely dislocation-free for alloys with compositional grading at a suitable low rate (see for example F. Isa et al. in Acta Materialia 114, 97-105 (2016), the entire disclosure of which is hereby incorporated by reference). The width of Si trenches 1142 is preferably chosen to be in the range of about 2-5 µm or more preferably of about 3-4 µm. Pillars 1140 may preferably be under-etched in order to enhance elastic stress relaxation and increase the width of dislocation-free SiGe crystals (see for example F. Isa et al., in Appl. Phys. Lett. 109, 182112 (2016), the entire disclosure of which is hereby incorporated by reference).

8. Epitaxially growing $Si_{1-x}Ge_x$ alloy crystals 1150, preferably with a Ge content x in the range of $0.6 \leq x \leq 1$ and even more preferably in the range of $0.7 \leq x \leq 0.9$ on top of Si pillars 1140. Growing crystals 1150 to a height of about 20-50 µm, or preferably about 50-100 µm, or even more preferably about 100-300 µm for example by LEPECVD, thereby avoiding neighbouring crystals to coalesce by leaving open gaps in between. The widths of these gaps may for example be as small as a few tens of nanometers, such that the width of SiGe crystals 1150 becomes approximately equal to the sum of the Si pillar width and the trench width. Epitaxial SiGe crystals 1150 are preferably not intentionally doped but may optionally be capped with heavily doped cap 1154, for example doped to a level between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$, with a thickness of about 0.5-5 µm or preferably about 1-2 µm to facilitate later contact formation on surface 1152.

9. Filling Si trenches 1142 and the gaps between SiGe crystals 1150 with insulating material 1160. Filling material 1160 is preferably an oxide or a combination of oxides and may for example be inserted by atomic layer deposition (ALD). Filling material may also cover surface 1152 of SiGe crystals 1150, forming continuous insulating layer 1162 with surface 1164. Optionally, a thicker oxide layer may be added on surface 1164 of insulating layer 1162 for example by PECVD.

10. Optionally improving the mechanical stability of the structure by planarizing surface 1164 of insulating layer 1162 and bonding handling wafer 1166 in low temperature oxide-to-oxide bond 1168.

11. Providing SiGe absorber wafer 1180 by removing handling wafer 1130 for example by RIE followed by CMP, thereby completely removing insulating layer 1118 on top of conducting regions 1109 to provide flat and smooth surface 1170 with an RMS roughness below about 0.5 nm consisting of surface 1172 of electrically conducting regions 1109 and surface 1174 of electrically insulating regions 1176 suitable for wafer bonding.

By construction of absorber wafer 1180 of sixth embodiment 1100, precise alignment is required with readout wafer 570, 670, 770 for covalent semiconductor bonding in the bonding tool. In order to permit accurate alignment absorber wafer 1180 may be equipped with at least two special wafer alignment features in the form of alignment marks 54, 56 positioned for example close to the wafer edges on opposite sides. With the help of superimposing such alignment marks the rotational misalignment of 200 mm wafers may be kept within about $(2-5)\times10^{4}$ degrees and the lateral misalignment within about 0.5-1 µm. Similar accuracy may be obtained in case of smaller wafer bonding. In an aspect of the embodiment, the patterning and gap filling in steps 3 and 4 may be omitted and highly conducting layer 1108 instead subjected to an optional CMP. This has the advantage that absorber wafer 1180 and wafer 570, 670, 770 again do not have to be accurately aligned for covalent semiconductor bonding in the bonding tool.

Figure 11:
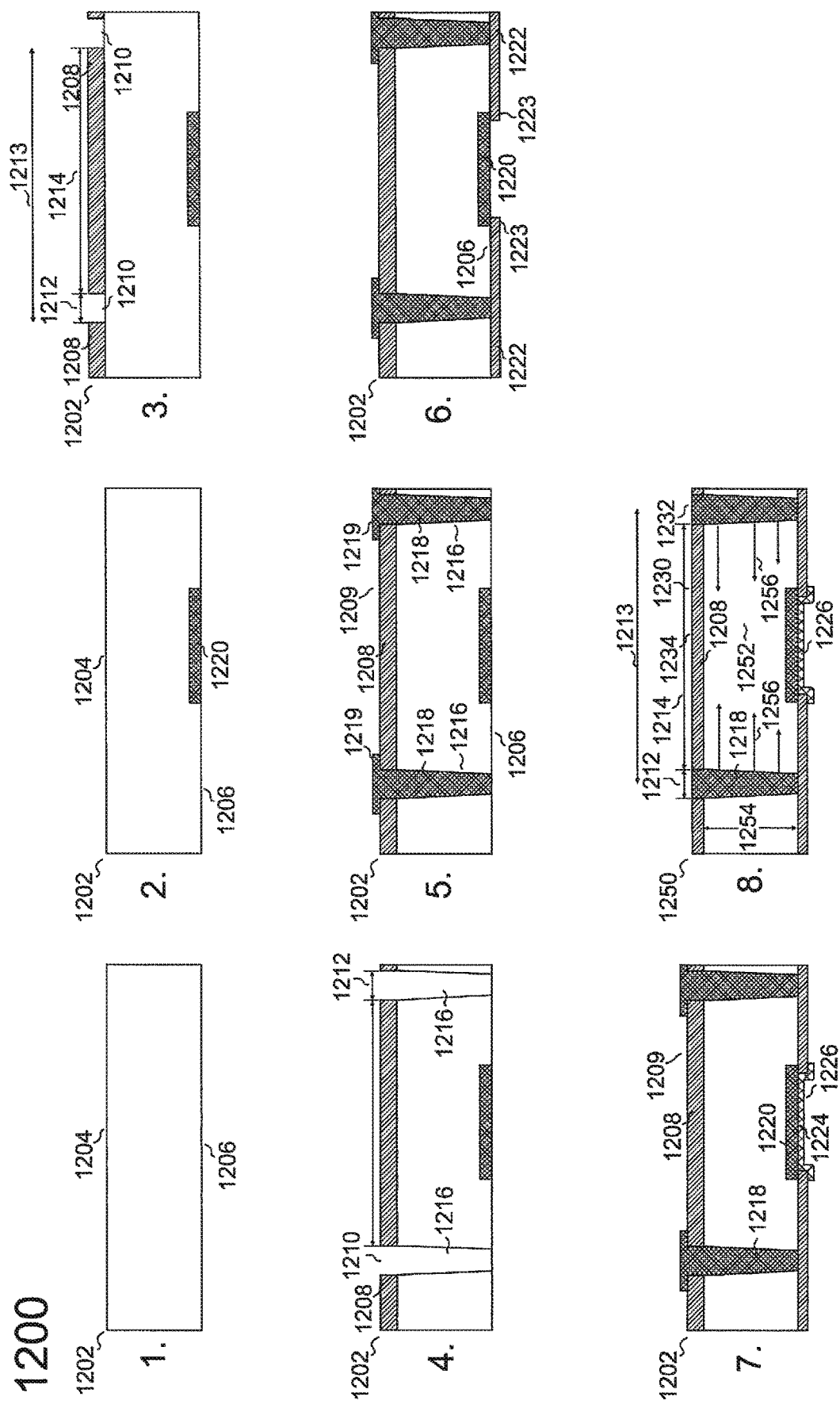
FIG. 11 is the process flow of the invention for the fabrication of an absorber wafer of the invention with holes filled with epitaxial material.

Referring now to FIG. 11, the realization of seventh embodiment 1200 of an absorber wafer may comprise the following fabrication steps, the order of some of which may be interchanged:

1. Providing absorber wafer 1202 with upper surface 1204 and lower surface 1206 which may be a Si, Ge, SiC, GaAs, CdTe or a CdZnTe alloy wafer or any other wafer of II/VI or III/V semiconductors of high purity which is preferably undoped or doped only to the extent necessary to assure the highest possible resistivity. A Si wafer may for example have a resistivity of 10-20 kΩ cm, a Ge wafer a resistivity of about 50 Ωcm, SiC about $10^{7}$-$10^{9}$ Ωcm, GaAs about $10^{9}$ Ωcm, CdTe about $10^{9}$ Ωcm and a CdZnTe alloy about $10^{10}$ Ωcm. High resistivity wafer 1202 may be weakly n-conducting or weakly p-conducting.

2. Optionally providing heavily doped region 1220, for example doped to a level between $5\times10^{18}$-$5\times10^{19}$ cm$^{-3}$ or even $5\times10^{19}$-$5\times10^{20}$ cm$^{-3}$, on lower surface 1206 of absorber wafer 1202. Region 1220 may preferably be of the same conduction type as that of high resistivity wafer 1202. Doped region 1220 may be provided for example by ion implantation of lower absorber surface 1206. Alternatively, heavily doped region 1220 may be provided by homo-epitaxially growing absorber material and doping during growth for example in windows of a dielectric mask patterned on lower surface 1206 of wafer 1202. The dielectric mask is thereby preferably a SiO$_2$ mask.

3. Providing upper surface 1204 of wafer 1202 with a coating by patterned, electrically insulating dielectric mask 1208 with mask openings 1210. Dielectric mask 1208 is preferably a SiO$_2$ mask. The minimum width 1212 of mask openings 1210 may be correspond about to widths 511, 611, 711 of charge collectors 510, 610, 710 on thinned readout wafers 570, 670, 770. The total width 1213 of mask openings 1210 plus size 1214 of mask patches equals pixel size 113, 213, 313, 413, 513, 613, 713 of the readout electronics.
4. Etching holes 1216 through mask openings 1210 of width 1212 for example by deep RIE.
5. Filling holes 1216 with homo-epitaxial absorber material 1218 which is heavily doped during the epitaxial growth, for example doped to a level between $1\times10^{18}$-$1\times10^{19}$ cm$^{-3}$ or preferably $1\times10^{19}$-$1\times10^{20}$ cm$^{-3}$ or even $1\times10^{20}$-$5\times10^{20}$ cm$^{-3}$. The filling may be accomplished for example by selective epitaxial growth into mask openings 1210 and may have extended portions 1219 on mask 1208 arising from lateral epitaxial overgrowth, whereby surface 1209 of wafer 1202 may become corrugated. The filling material 1218 is preferably of the opposite conduction (doping) type to that of high resistivity wafer 1202.
6. Optionally providing lower surface 1206 of absorber wafer 1202 with passivation layer 1222 to lower surface recombination of minority charge carriers and surface leakage. Layer 1222 may for example be a thermal oxide layer or a deposited oxide layer and may have portions 1223 extending above heavily doped regions 1220.
7. Optionally providing ohmic contact 1224 to heavily doped region 1220 for example by means of metal layer 1226 adapted to act as a back contact of the detector.
8. Providing absorber wafer 1250 by planarizing corrugated surface 1209 of coated wafer 1202 for example by CMP. Absorber wafer 1250 is thereby provided with flat and smooth surface 1230 with an RMS roughness below about 0.5 nm consisting of smoothed surface 1232 of heavily doped semiconductor material 1218 and smoothed surface 1234 of insulating mask 1208, thereby making surface 1230 ready for bonding with thinned readout wafer 570, 670, 770. The absorber wafer structure of embodiment 1200 has the advantage of easier absorber depletion at lower voltages during detector operation, especially when thickness 1254 of absorbing material 1252 is larger than pixel size 1213. Laterally spreading depletion zone 1256 may therefore lead to absorber depletion at lower reverse bias when the detector is in operation compared to the vertical depletion zone extension in planar configurations. A somewhat analogous situation may be found in super-junction field effect transistors (see for example U.S. Pat. No. 5,438,215 to J. Tihanyi, the entire disclosure of which is hereby incorporated by reference).

In an aspect of seventh embodiment 1200 thickness 1254 of absorbing material 1252 may be comparable or smaller than pixel size 1213. This is the configuration normally encountered in the detection of low energy electromagnetic radiation in the spectral range of infrared, visible, ultraviolet and soft X-ray region, corresponding for example to energies from a few tenths of eV to a few keV.

By construction of absorber wafer 1250 of seventh embodiment 1200, precise alignment is required with readout wafer 570, 670, 770 for covalent semiconductor bonding in the bonding tool. In order to permit accurate alignment absorber wafer 1250 may be equipped with at least two special wafer alignment features in the form of alignment marks 54, 56 positioned for example close to the wafer edges on opposite sides. With the help of superimposing such alignment marks the rotational misalignment of 200 mm wafers may be kept within about $(2-5)\times10^4$ degrees and the lateral misalignment within about 0.5-1 μm. Similar accuracy may be obtained in case of smaller wafer bonding.

Figure 12:
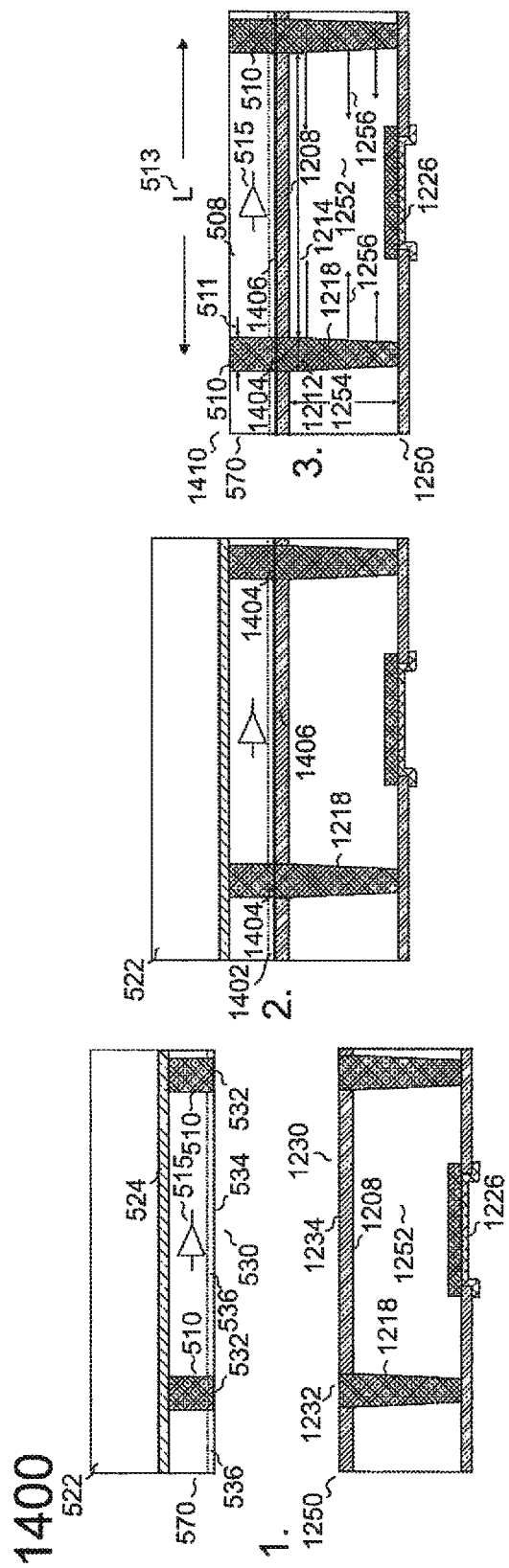
FIG. 12A is the process flow of the invention for the fabrication of a detector structure of the invention with a bonded absorber wafer.
FIG. 12B is the process flow of the invention for the fabrication of a detector structure of the invention with a bonded unpatterned absorber wafer.
FIG. 12C is the process flow of the invention for the fabrication of a detector structure of the invention with a bonded absorber wafer comprising holes filled with epitaxial material.

Referring now to FIG. 12A, realization of first embodiment 1300 of a monolithic X-ray or infrared detector 1310 may comprise the following fabrication steps, the order of some of which may optionally be interchanged:
1. Providing thinned readout wafer 570 bonded to handling wafer 522 and one of absorber wafers 850, 850', and subjecting lower surface 530 of readout wafer 570 and upper surface 824, 824' of absorber wafer 850, 850', both with an RMS roughness below about 0.5 nm, to a surface activation step, for example by a combination of wet chemical cleaning and plasma treatment, as a preparation for wafer bonding. Semiconductor surfaces 532 and 534 of readout wafer 570 thereby become oxide-free. Likewise, semiconducting surfaces 826, 826' of absorber wafers 850, 850' become oxide-free and ready for conducting covalent semiconductor bonding, while oxide surfaces 827, 827' become ready for insulating covalent semiconductor bonding or oxide-to-semiconductor bonding, depending on the material of poorly conducting or insulating regions 808, 808'.
2. Accurately aligning highly doped charge collectors of readout wafer 40, 570 with highly doped regions 818, 818' of one of absorber wafers 50, 850, 850' by bringing the special wafer alignment features in the form of alignment marks 44, 46; 54, 56 on the two wafers into superposition in the bonding tool, thereby keeping the rotational misalignment of 200 mm wafers within about $(2-5)\times10^4$ degrees and the lateral misalignment within about 0.5-1 μm, similar accuracy being used in case of smaller wafers. Providing low temperature wafer bond 1302 between readout wafer 570 and one of absorber wafers 850, 850', consisting of highly conducting covalent semiconductor bonds 1304 between heavily doped charge collectors 510 of readout wafer 570 and heavily doped regions 818, 828 of absorber wafer 850, 850', and of poorly conducting or electrically insulating semiconductor-to-semiconductor bonds or semiconductor-to-oxide bonds 1306 between high resistivity Si layer 508 of readout wafer 570 and poorly conducting or insulating dielectric layer 808, 808' of absorber wafer 850, 850'. Poorly conducting bonds 1306 serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1304.

3. Providing X-ray or infrared detector 1310, consisting of thin readout wafer 570 bonded to absorber wafer 850, 850' with X-ray absorption layer 852, 852', by partially or completely removing handling wafer 522 for example by grinding or RIE or a combination of the two, whereby oxide layer 524 may act as an etch stop.

Detector 1310 may subsequently undergo a number of additional processing steps, including for example planarizing lower surface 806, 806' of absorber wafer 850, 850' by CMP in the absence of optional layers 820, 820', optionally removing the substrate if absorber wafer 850, 850' is an epitaxial absorber wafer, for example by grinding or RIE or a combination of the two, forming metallic back contact 1308 comprising optional guard rings, opening contact pads on top of the CMOS stack for contacting by flip-chip or wire bonding techniques, dicing, attaching to a carrier board communicating with off-pixel readout electronics, and tiling to larger detector size, thereby avoiding dead zones between individual detectors upon stitching.

Referring now to FIG. 12B, realization of second embodiment 1300' of a monolithic X-ray or infrared detector 1310' may comprise the following fabrication steps, the order of some of which may optionally be interchanged:

1. Providing thinned readout wafer 570 bonded to handling wafer 522 and absorber wafer 850", and subjecting lower surface 530 of readout wafer 570 and upper surface 824" of absorber wafer 850", both with an RMS roughness below about 0.5 nm, to a surface activation step, for example by a combination of wet chemical cleaning and plasma treatment, as a preparation for wafer bonding. Semiconductor surfaces 532 and 534 of readout wafer 570 and surface 824" of absorber wafer 850" thereby become oxide-free and ready for covalent semiconductor bonding.
2. Bringing into superposition the wafer alignment features such as notches 42, 52 or flats 48, 58 supplied by the manufacturers of wafers 570, 850" in the bonding tool to keep the rotational misalignment of the two wafers within about 0.1 to 0.2 degrees, and the lateral displacement within about 200-400 μm. Providing low temperature wafer bond 1302' between readout wafer 570 and absorber wafer 850", consisting of highly conducting covalent semiconductor bonds 1304' between heavily doped charge collectors 510 of readout wafer 570 and highly doped layer 818" of absorber wafer 850", and of poorly conducting semiconductor-to-semiconductor bonds 1306' between high resistivity Si layer 508 of readout wafer 570 and layer 818". Poorly conducting bonds 1306' serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1304'.
3. Providing X-ray or infrared detector 1310', consisting of thin readout wafer 570 bonded to absorber wafer 850" by partially or completely removing handling wafer 522 for example by grinding or RIE or a combination of the two, whereby oxide layer 524 may act as an etch stop.

Detector 1310' may subsequently undergo a number of additional processing steps, including for example planarizing lower surface 806" of absorber wafer 850" by CMP in the absence of optional layer 820", optionally removing the substrate if absorber wafer 850" is an epitaxial absorber wafer, for example by grinding or RIE or a combination of the two, forming metallic back contact 1308' comprising optional guard rings, opening contact pads on top of the CMOS stack for contacting by flip-chip or wire bonding techniques, dicing, attaching to a carrier board communicating with off-pixel readout electronics, and tiling to larger detector size, thereby avoiding dead zones between individual detectors upon stitching.

Referring now to FIG. 12C, realization of third embodiment 1400 of a monolithic X-ray detector 1410 may comprise the following steps, the order of some of which may optionally be interchanged:

1. Providing thinned readout wafer 570 bonded to handling wafer 522 and absorber wafer 1250, and subjecting lower surface 530 of readout wafer 570 and smooth upper surface 1230 of absorber wafer 1250, both with an RMS roughness below about 0.5 nm, to a surface activation step, for example by a combination of wet chemical cleaning and plasma treatment, as a preparation for wafer bonding. Semiconductor surfaces 532 and 534 of readout wafer 570 thereby become oxide-free. Likewise, surface 1232 of absorber wafer 1250 become oxide-free and conducting, ready for conducting wafer bonding, while insulating oxide surfaces 1234 become ready for oxide-to-semiconductor bonding.
2. Accurately aligning highly doped charge collectors of readout wafer 40, 570 with smoothed surface 1232 of heavily doped semiconductor material 1218 of absorber wafer 50, 1250 by bringing the special wafer alignment features in the form of alignment marks 44, 46; 54, 56 on the two wafers into superposition in the bonding tool, thereby keeping the rotational misalignment of 200 mm wafers within about $(2\text{-}5) \times 10^{-4}$ degrees and the lateral misalignment within about 0.5-1 μm, similar accuracy being used in case of smaller wafers. Providing low temperature direct wafer bond 1402 between readout wafer 570 and absorber wafer 1250, consisting of electrically conducting covalent semiconductor bonds 1404 between heavily doped charge collectors 510 of readout wafer 570 and heavily doped material 1218 of absorber wafer 1250, and of poorly conducting or insulating semiconductor-to-oxide bonds 1406 between Si layer 508 of readout wafer 570 and insulating dielectric 1208 of absorber wafer 1250. Poorly conducting bonds 1406 serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1404. Preferably, wafer bond 1402 is formed at room temperature or at low temperatures not exceeding 200-300° C.
3. Providing X-ray detector 1410, consisting of thinned readout wafer 570 bonded to absorber wafer 1250 with X-ray absorption layer 1252, by partially or completely removing handling wafer 522 for example by grinding or RIE or a combination of the two, whereby oxide box 506 may act as an etch stop. X-ray detector 1410 may subsequently undergo a number of additional processing steps, including for example dicing, attaching to a carrier board communicating with off-pixel readout electronics, and tiling to larger detector size, thereby avoiding dead zones between individual detectors upon stitching.

Figure 13:
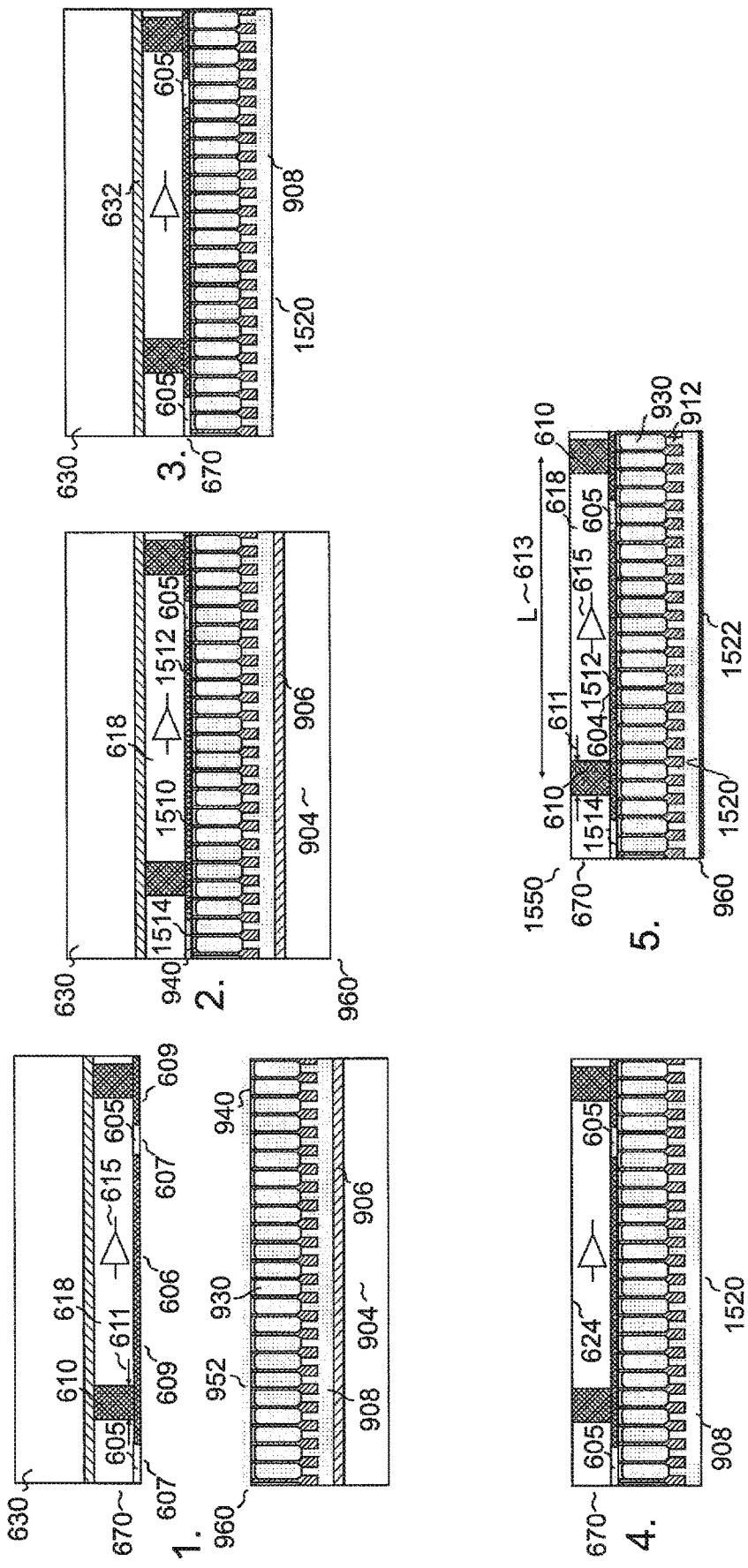
FIG. 13 is a detector structure of the invention with epitaxial pillars bonded to highly doped regions of a thin readout wafer.

Referring now to FIG. 13, realization of fourth embodiment 1500 of a monolithic X-ray detector 1550, comprising a SiGe absorber may comprise the following steps, the order of some of which may be interchanged:

1. Providing thinned readout wafer 670 bonded to handling wafer 630 and absorber wafer 960, and subjecting lower surface 606 of readout wafer 670, consisting of surfaces 607 and 609 with an RMS roughness below about 0.5 nm, and smooth upper surface 952 of absorber wafer 960 with an RMS roughness below about 0.5 nm to a surface activation step, for example by a combination of wet chemical cleaning and plasma treatment, as a preparation for wafer bonding. Surface 607 of high resistivity Si layer 605, 618 thereby becomes oxide-free and substantially insulating, and surface 609 of heavily doped implant 604 becomes oxide-free and conducting. Both surfaces 607 and 609 are now ready for covalent semiconductor bonding. Likewise, surface 952 of absorber wafer 960 becomes oxide-free and conducting and ready for covalent semiconductor bonding.

2. Bringing into superposition wafer alignment features such as notches 42, 52 or flats 48, 58 supplied by the manufacturers of wafers 670, 960 in the bonding tool to keep the rotational misalignment of the two wafers within about 0.1 to 0.2 degrees, and the lateral displacement within about 200-400 µm. Providing covalent semiconductor bond 1510 between readout wafer 670 and absorber wafer 960 consisting of highly conducting covalent semiconductor bonds 1512 between conducting surface 609 of heavily doped implants 604 and conducting surface 952 of heavily doped caps 940. In addition bond 1510 comprises poorly conducting or substantially insulating covalent semiconductor bonds 1514 between conducting heavily doped caps 940 of SiGe pillars 930 facing surface 607 of high resistivity layer 605, 618 of wafer 670. Poorly conducting bonds 1514 serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1512.

3. Removing Si substrate 904 for example by grinding or RIE or a combination of the two, whereby oxide box 906 may act as an etch stop. Oxide box 906 may subsequently be removed for example in a modified RIE step in which exposed surface 1520 of Si layer 908 may in turn act as an etch stop. In an aspect of the fourth embodiment 1500 of a monolithic X-ray detector Si layer 908 along with the defective region of SiGe crystals 930 close to the interface with Si pillars 912 may also be removed. Removing of about 2-10 µm of the SiGe crystals is considered to be sufficient for most relevant widths 938 of SiGe crystals 930. In case that wafer 902 is a Si wafer with standard thickness, said wafer may similarly be partially or completely removed, in the latter case preferably together with the defective region of SiGe crystals 930 close to the interface with Si pillars 912.

4. Partially or completely removing handling wafer 630 for example by grinding or RIE or a combination of the two, whereby oxide layer 632 may act as an etch stop. Oxide layer 632 may subsequently be removed for example in a modified RIE step to expose the surface of the CMOS stack on top of surface 624 of readout wafer 670.

5. Providing X-ray detector 1550 by metallizing surface 1520 of partially removed Si thick wafer 902, or Si layer 908 if wafer 902 is an SOI wafer, with metal layer 1522 adapted to act as a back contact. Alternatively, after complete removal of wafer 902 or Si layer 908 and the defective region of SiGe crystals 930, the exposed planarized surface of the latter may be metallized. X-ray detector 1550 may subsequently undergo a number of additional processing steps, including for example forming optional guard rings, dicing, attaching to a carrier board communicating with off-pixel readout electronics, and tiling to larger detector size, thereby avoiding dead zones between individual detectors upon stitching.

Figure 14:
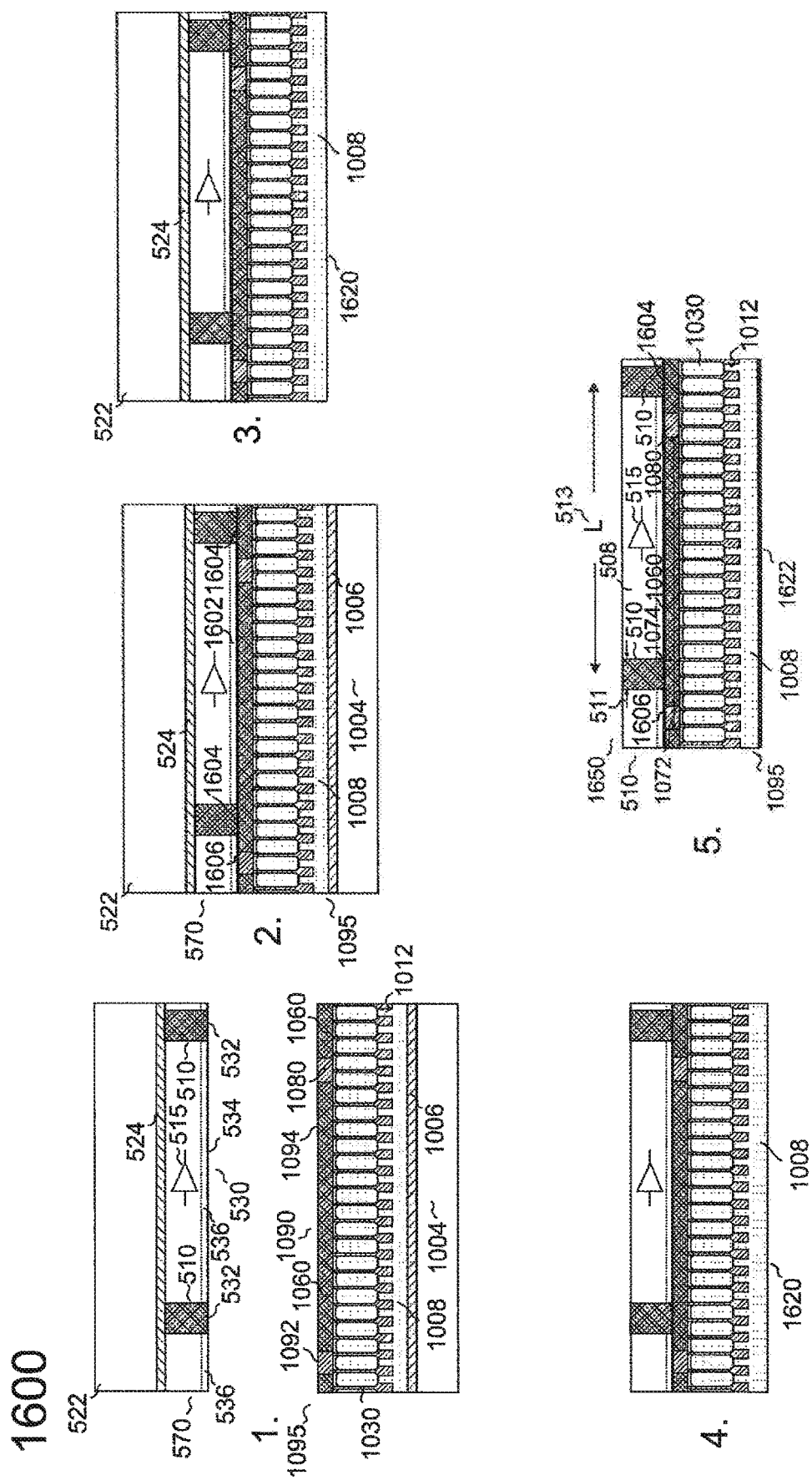
FIG. 14 is a detector structure of the invention with highly doped regions on epitaxial pillars bonded to a thin readout wafer with highly doped regions.

Referring now to FIG. 14, realization of fifth embodiment 1600 of a monolithic X-ray detector 1650, comprising a SiGe absorber may comprise the following steps, the order of some of which may be interchanged:

1. Providing thinned readout wafer 570 bonded to handling wafer 522 and absorber wafer 1095, and subjecting lower surface 530 of readout wafer 570 with an RMS roughness below about 0.5 nm and smooth upper surface 1090 of absorber wafer 1095 consisting of surface 1092 of insulator 1080 and surface 1094 of conducting cap layer 1060, both with an RMS roughness below about 0.5 nm, to a surface activation step, for example by a combination of wet chemical cleaning and plasma treatment, as a preparation for wafer bonding. Semiconductor surfaces 532 and 534 of readout wafer 570 thereby become oxide-free. Likewise, surface 1094 of conducting cap layer 1060 on absorber wafer 1095 become oxide-free and conducting, while surfaces 1092 of insulator 1080 become activated for insulator-to-semiconductor bonding.

2. Accurately aligning highly doped charge collectors 510 of readout wafer 40, 570 with conducting cap layer 1060 of absorber wafer 50, 1095 by bringing the special wafer alignment features in the form of alignment marks 44, 46; 54, 56 on the two wafers into superposition in the bonding tool, thereby keeping the rotational misalignment of 200 mm wafers within about $(2$-$5) \times 10^4$ degrees and the lateral misalignment within about 0.5-1 µm, similar accuracy being used in case of smaller wafers. Providing wafer bond 1602 between readout wafer 570 and absorber wafer 1095, consisting of highly conducting covalent semiconductor bonds 1604 between highly conducting, heavily doped charge collectors 510 of readout wafer 570 and highly conducting cap layer 1060 of absorber wafer 1095, and of poorly conducting or insulating semiconductor-to-insulator bonds 1606 between highly resistive Si layer 508 of readout wafer 570 and insulating dielectric 1080 of absorber wafer 1095. Poorly conducting bonds 1606 serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1604. Alternatively, when conducting cap layer 1060 is metallic, covalent semiconductor bond 1604 between heavily doped charge collectors 510 and conducting cap layer 1060 is replaced by a semiconductor-to-metal bond.

3. Removing Si substrate 1004 for example by grinding or RIE or a combination of the two, whereby oxide box 1006 may act as an etch stop. Oxide box 1006 may subsequently be removed for example in a modified RIE step in which exposed surface 1620 of Si layer 1008 may in turn act as an etch stop. In an aspect of the fifth embodiment 1600 of a monolithic X-ray detector Si layer 1008 along with the defective region of SiGe crystals 1030 close to the interface with Si pillars 1012 may also be removed. Removing of about 2-10 µm of the SiGe crystals is considered to be sufficient for most relevant widths of SiGe crystals 1030. If wafer 1002 is a Si wafer with standard thickness, said wafer may similarly be partially or completely removed, in the latter case together with the defective region of SiGe crystals 1030 close to the interface with Si pillars 1012.

4. Partially or completely removing handling wafer 522 for example by grinding or RIE or a combination of the two, whereby oxide layer 524 may act as an etch stop. Oxide layer 524 may subsequently be removed for example in a modified RIE step to expose the CMOS stack of readout wafer 570.

5. Providing X-ray detector 1650 by metallizing surface 1620 of Si layer 1008, or the surface of partially or completely removed Si thick wafer 902, with metal layer 1622 adapted to act as a back contact as well as optional guard rings. If in addition to the Si layers, also the 2-10 µm thick defective SiGe region close to the interface with Si pillars 1012 has been removed, the exposed planarized SiGe surface may likewise be metallized. X-ray detector 1650 may subsequently undergo a number of additional processing steps, including for example dicing, attaching to a carrier board communicating with off-pixel readout electronics, and tiling to larger detector size, thereby avoiding dead zones between individual detectors upon stitching.

Figure 15:
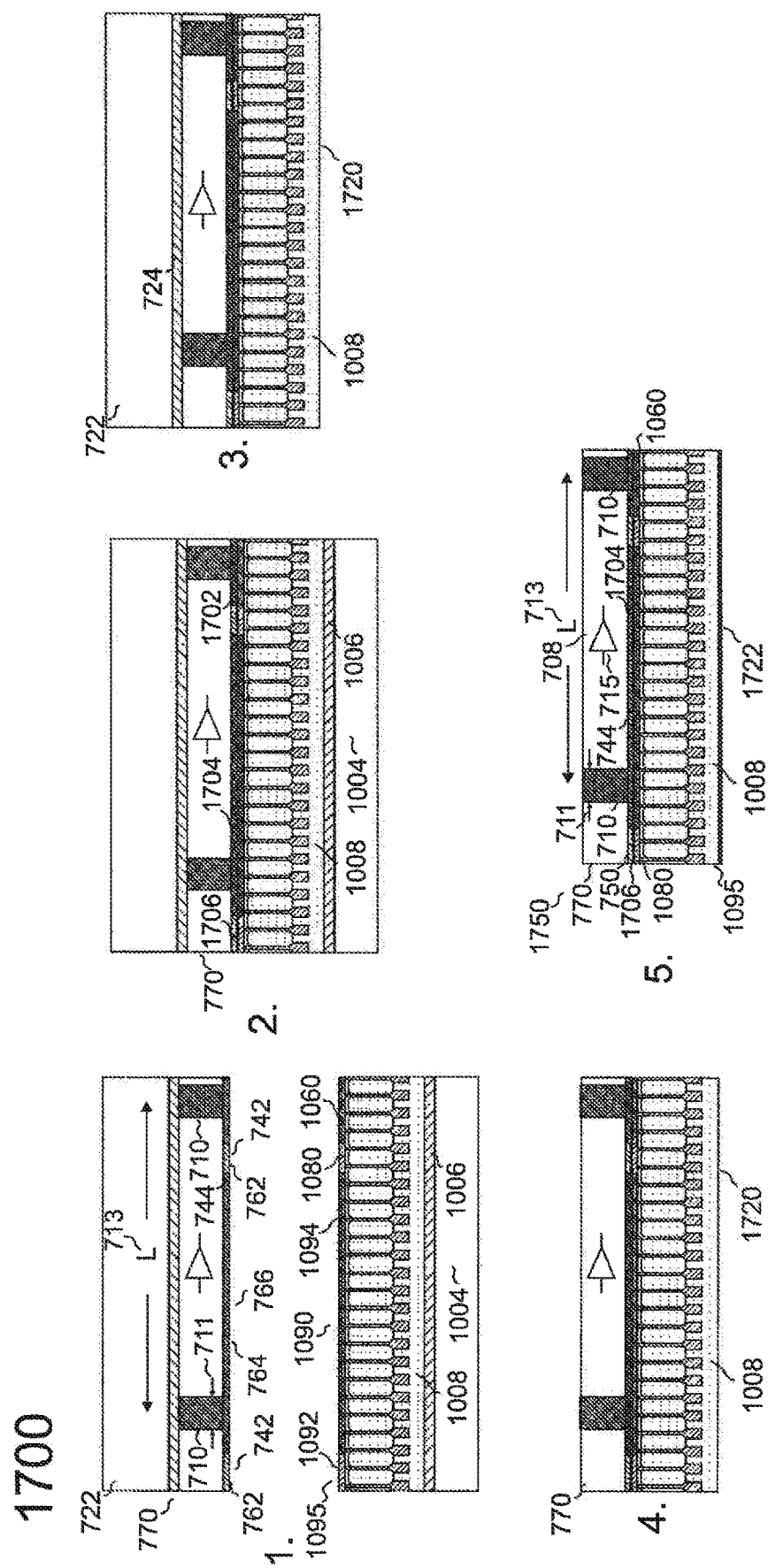
FIG. 15 is a detector structure of the invention with metallized epitaxial pillar regions bonded to metal regions on a thin readout wafer.

Referring now to FIG. 15, realization of sixth embodiment 1700 of a monolithic X-ray detector 1750, comprising a SiGe absorber may comprise the following steps, the order of some of which may optionally be interchanged:

1. Providing thinned readout wafer 770 the CMOS stack of which on top of Si surface 720 is bonded to handling wafer 722 and providing absorber wafer 1095 with insulating layers 1080 and with metal layers 1060 forming ohmic contact 1064 with heavily doped regions 1040 on top of SiGe crystals 1030. Subjecting smooth and flat surface 766 of readout wafer 770 with an RMS roughness below about 0.5 nm, consisting of insulating oxide surfaces 762 and conducting metal surfaces 764, and smooth upper surface 1090 of absorber wafer 1095 with an RMS roughness below about 0.5 nm, consisting of insulator surfaces 1092 and metal surfaces 1094, to a surface activation step, for example by a combination of wet chemical cleaning and plasma treatment, as a preparation for wafer bonding. Metal surfaces 764 of readout wafer 770 thereby become oxide-free and conducting and ready for metal-to-metal bonding. Likewise, metal surfaces 1094 of absorber wafer 1095 become oxide-free and conducting and ready for metal-to-metal bonding.

2. Accurately aligning conducting metal surfaces 764 of readout wafer 40, 770 with conducting metal layers 1060 of absorber wafer 50, 1095 by bringing the special wafer alignment features in the form of alignment marks 44, 46; 54, 56 on the two wafers into superposition in the bonding tool, thereby keeping the rotational misalignment of 200 mm wafers within about $(2-5) \times 10^4$ degrees and the lateral misalignment within about 0.5-1 µm, similar accuracy being used in case of smaller wafers. Providing wafer bond 1702 between readout wafer 770 and absorber wafer 1095 consisting of highly conducting metal-to-metal bonds 1704 between conducting metal surfaces 764 of readout wafer 770 and conducting metal surfaces 1094 of absorber wafer 1095 and of poorly conducting or insulating insulator-to-insulator bonds 1706 between insulator surfaces 762 and 1092 of readout and absorber wafer, respectively. Poorly conducting bonds 1706 serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1704.

3. Partially or completely removing Si substrate 1004 for example by grinding or RIE or a combination of the two, whereby oxide box 1006 may act as an etch stop. Oxide box 1006 may subsequently be removed for example in a modified RIE step in which exposed surface 1720 of Si layer 1008 may in turn act as an etch stop. In an aspect of the sixth embodiment 1700 of a monolithic X-ray detector Si substrate 1004 along with the defective region of SiGe crystals 1030 close to the interface with Si pillars 1012 may be completely removed. Removing of about 2-10 µm of the SiGe crystals is considered to be sufficient for most relevant widths of SiGe crystals 1030. If wafer 1002 is a Si wafer with standard thickness, said wafer may similarly be partially or completely removed, in the latter case together with the defective region of SiGe crystals 1030 close to the interface with Si pillars 1012.

4. Partially or completely removing handling wafer 722 for example by grinding or RIE or a combination of the two, whereby oxide layer 724 may act as an etch stop. Oxide layer 724 may subsequently be removed for example in a modified RIE step to expose the surface of the CMOS stack on top of surface 720 of readout wafer 770.

5. Providing X-ray detector 1750 by metallizing surface 1720 of Si layer 1008, or the surface of partially or completely removed Si thick wafer 1002, with metal layer 1722 adapted to act as a back contact as well as optional guard rings. If in addition to the Si layers, also the 2-10 µm thick defective SiGe region close to the interface with Si pillars 1012 has been removed, the exposed planarized SiGe surface may likewise be metallized. X-ray detector 1750 may subsequently undergo a number of additional processing steps, including for example dicing, attaching to a carrier board communicating with off-pixel readout electronics, and tiling to larger detector size, thereby avoiding dead zones between individual detectors upon stitching.

Figure 16:
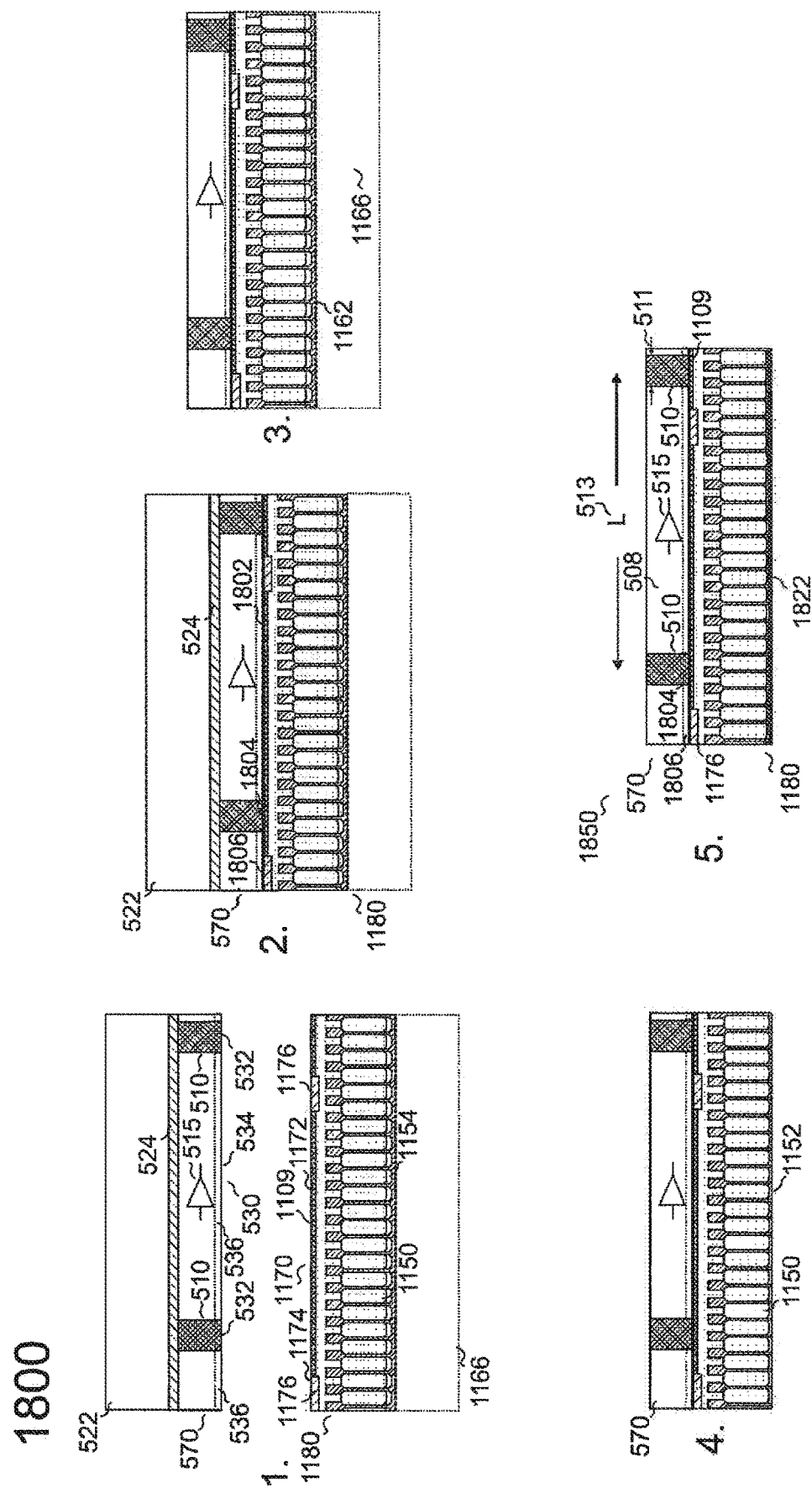
FIG. 16 is a detector structure of the invention comprising epitaxial pillars on a thin substrate which is bonded to a thin readout wafer.

Referring now to FIG. 16, realization of seventh embodiment 1800 of a monolithic X-ray detector 1850, comprising a SiGe absorber may comprise the following steps, the order of some of which may be interchanged:

1. Providing thinned readout wafer 570 the CMOS stack of which on top of Si surface 520 is bonded to handling wafer 522, and whose surface 530 is flat and smooth with an RMS roughness below about 0.5 nm. Providing absorber wafer 1180 with insulating regions 1176 and conducting regions 1109 with flat and smooth surface 1170 with an RMS roughness below about 0.5 nm. Subjecting smooth and flat surface 530 of readout wafer 570, consisting of conducting surfaces 532 of heavily doped charge collectors 510 and surfaces 534 of high resistivity layer 508, and smooth surface 1170 of absorber wafer 1180, consisting of surfaces 1172 of conducting regions 1109 and insulator surfaces 1174, to a surface activation step, for example by a combination of wet chemical cleaning and plasma treatment, as a preparation for wafer bonding. Semiconductor surfaces 532 and 534 of readout wafer 570 thereby become oxide-free, conducting and ready for wafer bonding. Likewise, surfaces 1172 of conducting regions 1109 of absorber wafer 1180 become oxide-free, conducting and ready for wafer bonding.

2. Accurately aligning conducting heavily doped plugs 510 of readout wafer 40, 570 with conducting regions 1109 of absorber wafer 50, 1180 by bringing the special wafer alignment features in the form of alignment marks 44, 46; 54, 56 on the two wafers into superposition in the bonding tool, thereby keeping the rotational misalignment of 200 mm wafers within about $(2-5) \times 10^4$ degrees and the lateral misalignment within about 0.5-1 μm, similar accuracy being used in case of smaller wafers. Providing wafer bond 1802 between readout wafer 570 and absorber wafer 1180 consisting of conducting covalent semiconductor bonds 1804 between conducting semiconductor surfaces 532 of readout wafer 570 and conducting semiconductor surfaces 1172 of absorber wafer 1180 and of poorly conducting or insulating insulator-to-semiconductor bonds 1806 between semiconductor surfaces 534 of readout 570 and insulator surfaces 1174 of absorber wafer 1180. Poorly conducting bonds 1806 serve the purpose of electrically isolating neighbouring pixels from each other. Their resistance is higher by at least a factor of about $10^3$-$10^4$, or preferably $10^4$-$10^6$, or even more preferably $10^6$-$10^8$ with respect to that of highly conducting bonds 1804.

3. Partially or completely removing handling wafer 522 for example by grinding or RIE or a combination of the two, whereby oxide layer 524 may act as an etch stop. Oxide layer 524 may subsequently be removed for example in a modified RIE step in which exposed surface 520 of Si layer 508 may in turn act as an etch stop.

4. Removing handling wafer 1166 for example by grinding or RIE or a combination of the two, whereby oxide layer 1162 may act as an etch stop. Oxide layer 1162 may subsequently be removed for example in a modified ME step to expose surface 1152 of SiGe crystals 1150.

5. Providing X-ray detector 1850 by metallizing surface 1152 of SiGe layer crystals 1150 with metal layer 1822 adapted to act as a back contact as well as optional guard rings. X-ray detector 1850 may subsequently undergo a number of additional processing steps, including for example dicing, attaching to a carrier board communicating with off-pixel readout electronics, and tiling to larger detector size, thereby avoiding dead zones between individual detectors upon stitching.

The following points summarize the invention and aspects thereof:

1. A monolithic CMOS integrated pixel detector (101, 101', 201, 201', 301, 301', 301", 1310, 1310', 1410, 1550, 1650, 1750, 1850) for the detection of electromagnetic radiation configured for backside illumination, comprising a silicon readout wafer (102, 102', 202, 202', 302, 302', 302", 570, 670, 770) made from silicon of a first doping type, comprising CMOS pixel readout electronics (115, 115', 215, 215', 315, 315', 315", 515, 615, 715) processed in a thin silicon layer (106, 106', 206, 206', 306, 306', 306", 508, 618, 708) and including highly conducting doped regions of a second doping type acting as charge collectors (110, 110', 210, 210', 310, 310', 310", 312, 312', 510, 604, 610, 710, 744) spaced at the pixel size which communicate with the readout electronics;

said readout wafer being bonded by wafer bonds (108, 108', 122, 122', 208, 208', 209, 209', 222, 222', 308, 308', 308", 309, 309', 309", 1304, 1304', 1306, 1306', 1404, 1406, 1512, 1514, 1604, 1606, 1704, 1706, 1804, 1806) to an absorber wafer (104, 104', 204, 204', 304, 304', 304", 850, 850', 850", 960, 1095, 1180, 1250) made from at least one single crystal semiconductor material, the absorber wafer also comprising highly conducting doped regions (112, 112', 212, 212', 312", 326, 326', 326", 334, 818, 818', 818", 940, 1060, 1109, 1218);

the monolithic CMOS integrated pixel detector comprises the readout wafer bonded, in an aligned manner, to the absorber wafer; wherein said wafer bonds comprise conducting bonds (108, 108', 208, 208', 308, 308', 1304, 1304', 1404, 1512, 1604, 1704, 1804) between the readout wafer and the absorber wafer and poorly conducting bonds (122, 122', 209, 209', 309, 309', 309", 1306, 1306', 1406, 1514, 1606, 1706, 1806) between the readout wafer and the absorber wafer, the poorly conducting bonds electrically isolating neighboring pixels to force charges generated in the absorber wafer to cross the conducting bonds and to be received by the charge collectors for processing by the pixel readout electronics when the detector is in operation.

2. The monolithic CMOS integrated pixel detector of feature set 1, wherein the conducting bonds between the readout wafer and the absorber wafer are conducting covalent semiconductor bonds (108, 108', 208, 208', 308, 308', 308", 1304, 1304', 1404, 1512, 1604, 1804) and wherein the poorly conducting bonds between the readout wafer and the absorber wafer are bonds between regions at least one of which is a highly resistive or insulating region (120, 120', 220, 220', 226', 320, 320', 320", 508, 605, 762, 808, 808', 1080, 1092, 1176, 1208) and wherein the poorly conducting bonds have a resistance exceeding that of the conducting covalent bonds at least by a factor selected from one of the group of ranges of factors consisting of $10^3$-$10^4$, $10^4$-$10^6$ and $10^6$-$10^8$.

3. The monolithic CMOS integrated pixel detector of feature set 1, wherein the thin silicon layer has a thickness selected from one of the group of thicknesses consisting of 10-30 μm, 5-10 μm and 3-5 μm.

4. The monolithic CMOS integrated pixel detector of feature set 1, wherein the highly conducting doped regions of the readout wafer and the highly conducting doped regions of the absorber wafer have a doping range selected from one of the group of doping ranges consisting of $1 \times 10^{18}$-$1 \times 10^{19}$ cm$^{-3}$, $1 \times 10^{19}$ $1 \times 10^{20}$ cm$^{-3}$ and $1 \times 10^{20}$-$5 \times 10^{20}$ cm$^{-3}$.

5. The monolithic CMOS integrated pixel detector of feature set 1, further including wafer alignment features selected from one of the group of features consisting of wafer notches (42, 52), wafer flats (48, 58) and alignment marks (44, 46; 54, 56).

6. The monolithic CMOS integrated pixel detector of feature set 1 adapted for the detection of X-rays.

7. The monolithic CMOS integrated pixel detector of feature set 6, wherein the pixel size is a size selected from one of the group of pixel sizes consisting of 100-200 μm, 50-100 μm, 20-50 μm and 5-20 μm.

8. The monolithic CMOS integrated pixel detector of feature set 7, wherein the material of at least one single crystal semiconductor material of the absorber wafer is selected from one of the group of materials consisting of Si, Ge, diamond, SiC, GaAs, CdTe or CdZnTe alloys.

9. The monolithic CMOS integrated pixel detector of feature set 8, wherein the at least one single crystal semiconductor material of the absorber wafer is an epitaxial wafer comprising an epitaxial layer on a single crystal substrate.

10. The monolithic CMOS integrated pixel detector of feature set 9, wherein the single crystal substrate is a substrate made from one of the group of materials consisting of Si, Ge, GaAs and InSb.
11. The monolithic CMOS integrated pixel detector of feature set 10, wherein the epitaxial layer is a CdTe or a $Cd_{1-x}Zn_xTe$ alloy layer with x in the range of 5-15%.
12. The monolithic CMOS integrated pixel detector of feature set 10, wherein the epitaxial layer is a $Si_{1-x}Ge_x$ layer with a Ge content x in the range of $0.7 \leq x \leq 0.9$.
13. The monolithic CMOS integrated pixel detector of feature set 1 adapted for the detection of infrared radiation.
14. The monolithic CMOS integrated pixel detector of feature set 13, wherein the pixel size is in the range of 2-40 μm.
15. The monolithic CMOS integrated pixel detector of feature set 14, wherein the at least one single crystal semiconductor material of the absorber wafer is made of at least one of the group of materials consisting of Si, Ge, SiGe alloys, SiGeSn alloys, InAs, InGaAs alloys, InSb, and HgCdTe alloys.
16. The monolithic CMOS integrated pixel detector of feature set 15, wherein the at least one single crystal semiconductor material of the absorber wafer is an epitaxial wafer comprising at least one epitaxial layer on a single crystal substrate.
17. The monolithic CMOS integrated pixel detector of feature set 16, wherein the at least one epitaxial layer is a SiGe, SiGeSn, InGaAs or HgCdTe alloy layer.
18. The monolithic CMOS integrated pixel detector of one of feature sets 15-17, wherein the absorber wafer comprises a charge multiplication layer.
19. The monolithic CMOS integrated pixel detector of one of feature sets 1-18, wherein an at least one alignment feature (42, 48) of the readout wafer (40) is superimposed on an at least one alignment feature (52, 58) of the absorber wafer (50) with the rotational misalignment of the two wafers kept within about 0.1 to 0.2 degrees, and the lateral displacement within about 200-400 μm.
20. The monolithic CMOS integrated pixel detector of one of feature sets 1-18, wherein an at least one alignment feature (44, 46) of the readout wafer (40) is superimposed on an at least one alignment feature (54, 56) of the absorber wafer (50) with the rotational misalignment of 200 mm wafers kept within about $(2-5) \times 10^{-4}$ degrees and the lateral misalignment within about 0.5-1 μm.
21. The monolithic CMOS integrated pixel detector of one of feature sets 1-20, wherein the second doping type is of an opposite doping type to that of the first doping type.
22. The monolithic CMOS integrated pixel detector of one of feature sets 1-20, wherein the second doping type is of a similar doping type to that of the first doping type.
23. A method for forming a monolithic CMOS integrated pixel detector for the detection of electromagnetic radiation, the method comprising
  a. providing a pixel readout electronics (115, 115', 215, 215', 315, 315', 315", 515, 615, 715) by CMOS processing of a silicon readout wafer (102, 102', 202, 202', 302, 302', 302", 570, 670, 770);
  b. forming highly conducting regions (110, 110', 210, 210', 310, 310', 310", 312, 312', 510, 604, 610, 710, 744) in the readout wafer spaced at a pixel size acting as charge collectors and communicating with the pixel readout electronics;
  c. forming at least one alignment feature in the readout wafer (42, 44, 46, 48);
  d. forming an absorber wafer (104, 104', 204, 204', 304, 304', 304", 850, 850', 850", 960, 1095, 1180, 1250) from at least one single crystal semiconductor material;
  e. forming highly conducting doped regions (112, 112', 212, 212', 312", 326, 326', 326", 334, 818, 818', 818", 940, 1060, 1109, 1218) in the absorber wafer;
  f. forming at least one alignment feature in the absorber wafer (52, 54, 56, 58);
  g. bonding a carrier wafer (522, 630, 722) after planarizing the CMOS stack of the readout wafer;
  h. thinning and planarizing the readout wafer;
  i. superimposing the at least one alignment feature of the readout wafer (42, 44, 46, 48) and the absorber wafer (52, 54, 56, 58);
  j. forming wafer bonds (108, 108', 122, 122', 208, 208', 209, 209', 222, 222', 308, 308', 308", 309, 309', 309", 1304, 1304',1306, 1306', 1404, 1406,1512, 1514, 1604, 1606, 1704, 1706, 1804, 1806) comprising conducting bonds (108, 108', 208, 208', 308, 308', 1304, 1304', 1404, 1512, 1604, 1704, 1804) and poorly conducting bonds (122, 122', 209, 209', 309, 309', 309", 1306, 1306', 1406, 1514, 1606, 1706, 1806) between the readout wafer and the absorber wafer; and
  k. partially or completely removing the carrier wafer.
24. The method of feature set 23, wherein the forming of the conducting wafer bonds comprises forming covalent conducting bonds (108, 108', 208, 208', 308, 308', 308", 1304, 1304', 1404, 1512, 1604, 1804) and wherein the forming of poorly conducting bonds between the readout wafer and the absorber wafer comprises forming bonds between regions at least one of which is a highly resistive or insulating region (120, 120', 220, 220', 226', 320, 320', 320", 508, 605, 762, 808, 808', 1080, 1092, 1176, 1208).
25. The method of feature set 24, wherein the forming the absorber wafer from at least one single crystal semiconductor material comprises forming the absorber wafer adapted for X-ray detection from at least one material selected from the group materials consisting of Si, Ge, diamond, SiC, GaAs, CdTe and CdZnTe alloys.
26. The method of feature set 25, wherein forming the absorber wafer comprises forming an epitaxial layer on a single crystal substrate.
27. The method of feature set 26, wherein forming the epitaxial layer on a single crystal substrate comprises forming the epitaxial layer on a substrate selected from one of the group of substrates consisting of Si, Ge, GaAs and InSb.
28. The method of feature set 27, wherein forming the epitaxial layer comprises forming an epitaxial CdTe or $Cd_{1-x}Zn_xTe$ layer with x in the range of 5-15%.
29. The method of feature set 27, wherein forming the epitaxial layer comprises forming an epitaxial $Si_{1-x}Ge_x$ layer with x in the range of $0.7 \leq x \leq 0.9$.
30. The method of one of feature sets 28 and 29, wherein the epitaxial layer is planarized.
31. The method of feature set 24, wherein the forming of the absorber wafer from the at least one single crystal semiconductor material comprises forming the absorber wafer adapted for infrared detection from at least one material selected from the group of materials consisting of Si, Ge, SiGe alloys, SiGeSn alloys, InAs, InGaAs alloys, InSb, and HgCdTe alloys.
32. The method of feature set 30, wherein forming the absorber wafer comprises forming at least one epitaxial layer on a single crystal substrate.
33. The method of feature set 31, wherein forming the at least one epitaxial layer on a single crystal substrate comprises forming the epitaxial layer on one substrate selected from one of the group substrates consisting of Si, Ge, GaAs, InSb, CdTe and CdZnTe.

34. The method of feature set 32, wherein forming the at least one epitaxial layer is a layer selected from one of the group of layers consisting of SiGe, SiGeSn, InGaAs and HgCdTe alloy layers.

35. The method of feature set 33, wherein forming the at least one epitaxial layer comprises forming a charge multiplication layer.

36. The method of one of feature sets 26-35, wherein forming the monolithic CMOS integrated pixel detector includes removing the single crystal substrate (908', 1134').

37. The method of one of feature sets 23 and 35, wherein forming the monolithic CMOS integrated pixel detector further includes forming a metallic back contact (116, 116', 216, 216', 316, 316', 316", 1226, 1308, 1308', 1522, 1622, 1722, 1822).

In an advantage, the invention provides a monolithic CMOS integrated pixel sensor suitable for electromagnetic radiation detection and imaging.

It another advantage, the invention provides a monolithic pixel sensor suitable for electromagnetic radiation detection and imaging, wherein the readout electronics and a single crystalline absorber are juxtaposed on opposite sides of a CMOS processed silicon wafer.

In still another advantage, the invention provides a monolithic CMOS integrated pixel sensor suitable for electromagnetic radiation detection and imaging which is fabricated by low temperature direct wafer bonding of readout and absorber wafers.

In another advantage, the invention provides a monolithic pixel sensor suitable for the detection and imaging of infrared, visible, ultraviolet or soft X-ray radiation which is fabricated by bonding a thin absorber layer onto a CMOS processed wafer with the readout electronics.

In yet another advantage, the invention provides a monolithic pixel sensor suitable for high-energy X-ray detection and imaging which is fabricated by bonding a CMOS processed wafer with the readout electronics onto a high-Z absorber layer.

In another advantage, the invention provides a monolithic pixel sensor suitable for energy-resolved X-ray detection and imaging.

In another advantage, the invention provides a monolithic pixel sensor capable of single-photon detection.

In still another advantage, the invention provides simple processes for the fabrication of monolithic pixel detectors comprising a thin readout wafer covalently bonded to an absorber wafer of the opposite conduction type (i.e. opposite effective doping type).

In another advantage, the invention provides covalently bonded pixel sensors in which defects present at or near the bonding interface do not affect detector leakage.

Many industrial applications of the present invention may be formulated. One skilled in the art will appreciate that the network may include any system for exchanging data, such as, for example, the Internet, an intranet, an extranet, WAN, LAN, wireless network, satellite communications, and/or the like. It is noted that the network may be implemented as other types of networks, such as an interactive television network. The users may interact with the system via any input device such as a keyboard, mouse, kiosk, personal digital assistant, handheld computer, cellular phone and/or the like. Moreover, the system contemplates the use, sale and/or distribution of any goods, services or information having similar functionality described herein.

As will be appreciated by skilled artisans, the present invention may be embodied as a system, a device, or a method.

The present invention is described herein with reference to block diagrams, devices, components, and modules, according to various aspects of the invention. Moreover, the system contemplates the use, sale and/or distribution of any goods, services or information having similar functionality described herein.

The specification and figures should be considered in an illustrative manner, rather than a restrictive one and all modifications described herein are intended to be included within the scope of the invention claimed. Accordingly, the scope of the invention should be determined by the appended claims (as they currently exist or as later amended or added, and their legal equivalents) rather than by merely the examples described above. Steps recited in any method or process claims, unless otherwise expressly stated, may be executed in any order and are not limited to the specific order presented in any claim. Further, the elements and/or components recited in apparatus claims may be assembled or otherwise functionally configured in a variety of permutations to produce substantially the same result as the present invention. Consequently, the invention should not be interpreted as being limited to the specific configuration recited in the claims.

Benefits, other advantages and solutions mentioned herein are not to be construed as critical, required or essential features or components of any or all the claims.

As used herein, the terms "comprises", "comprising", or variations thereof, are intended to refer to a non-exclusive listing of elements, such that any apparatus, process, method, article, or composition of the invention that comprises a list of elements, that does not include only those elements recited, but may also include other elements such as those described in the instant specification. Unless otherwise explicitly stated, the use of the term "consisting" or "consisting of" or "consisting essentially of" is not intended to limit the scope of the invention to the enumerated elements named thereafter, unless otherwise indicated. Other combinations and/or modifications of the above-described elements, materials or structures used in the practice of the present invention may be varied or adapted by the skilled artisan to other designs without departing from the general principles of the invention.

The patents and articles mentioned above are hereby incorporated by reference herein, unless otherwise noted, to the extent that the same are not inconsistent with this disclosure.

Other characteristics and modes of execution of the invention are described in the appended claims.

Further, the invention should be considered as comprising all possible combinations of every feature described in the instant specification, appended claims, and/or drawing figures which may be considered new, inventive and industrially applicable.

Copyright may be owned by the Applicant(s) or their assignee and, with respect to express Licensees to third parties of the rights defined in one or more claims herein, no implied license is granted herein to use the invention as defined in the remaining claims. Further, vis-à-vis the public or third parties, no express or implied license is granted to prepare derivative works based on this patent specification, inclusive of the appendix hereto and any computer program comprised therein.

Additional features and functionality of the invention are described in the claims appended hereto. Such claims are hereby incorporated in their entirety by reference thereto in this specification and should be considered as part of the application as filed.

Multiple variations and modifications are possible in the embodiments of the invention described here. Although certain illustrative embodiments of the invention have been shown and described here, a wide range of changes, modifications, and substitutions is contemplated in the foregoing disclosure. While the above description contains many specific details, these should not be construed as limitations on the scope of the invention, but rather exemplify one or another preferred embodiment thereof. In some instances, some features of the present invention may be employed without a corresponding use of the other features. Accordingly, it is appropriate that the foregoing description be construed broadly and understood as being illustrative only, the spirit and scope of the invention being limited only by the claims which ultimately issue in this application.

Addendum

The following US patent documents, foreign patent documents, and Additional Publications are incorporated herein by reference thereto, as if fully set forth herein, and relied upon:

US Patent Documents

| | | | |
|---|---|---|---|
| 8,237,126 | B2 | August 2012 | von Känel et al. |
| 62/295720 | | Febuary 2016 | von Känel |
| 5,438,215 | | August 1995 | Tihanyi |

Other Patent Documents

| | | | |
|---|---|---|---|
| EP0571135 | A2 | November 1993 | Collins et al. |
| PCT/IB2017/001032 | | August 2016 | von Känel |
| WO 2016/097850 | A1 | June 2016 | von Känel |

Additional Publications medipix.web.cern.chdectris.ch
nist.gov/pml/data/ffast
canberra.corn
irginiasemi.com/pdf/generalpropertiesSi62002.pdf
https://www.evgroup.com/fileadmin/media/products/bonding/Permanent_Bonding/combond/EVG_ComBond_Brochure.pdf
R. C. Alig et al., "Scattering by ionization and phonon emission in semiconductors", Physical Review B 22, 5565-5582 (1980)
R. C Alig, "Scattering by ionization and phonon emission in semiconductors. IL Monte Carlo calculations", Physical Review B 27, 968-977 (1983)
S. Kasap et al., "Amorphous and polycrystalline photoconductors for direct conversion flat panel X-ray image sensors", Sensors 11, 5112 (2011)
G. W. Deptuch et al., "Vertically integrated circuits at Fermilab", IEEE Trans. Nucl. Sci. 57, 2178-2186 (2010)
T. Akatsu et al., "Dislocation structure in low-angle interfaces between bonded Si(001) wafers", J. Material Science 39, 3031-3039 (2004)
S. Bengtsson et al., "Interface charge control of directly bonded silicon structures", Journal of Applied Physics 66, 1231-1239 (1989)
W. Shockley et al., "Statistics of the recombinations of holes and electrons", Phys. Rev. 87, 835-842 (1952)
C. Flötgen. et al., "Novel surface preparation methods for covalent and conductive bonded interfaces fabrication", ECS Transactions 64, 103-110 (2014)
I. P. Ferain et al., "Low temperature exfoliation process in hydrogen-implanted germanium layers", J. Appl. Phys. 107, 054315 (2010)
M. C. Veale et al., "Chromium compensated gallium arsenide detectors for X-ray and γ-ray spectroscopic imaging", Nucl. Instr. Meth. Phys. Res, A 752, 6-14 (2014)
S. Del Sordo et al., "Progress in the development of CdTe and CdZnTe Semiconductor radiation detectors for astrophysical and medical applications", Sensors 2009, 9, 3491-3526
C. V. Falub et al., "Scaling hetero-epitaxy from layers to three-dimensional crystals", Science 335, 1330-1334 (2012)
F. Isa et al., "From plastic to elastic stress relaxation in highly mismatched SiGe/Si Heterostructures", Acta Materialia 114, 97-105 (2016)
F. Isa et al., "Enhancing elastic stress relaxation in SiGe/Si heterostructures by Si pillar necking", Appl. Phys. Lett. 109, 182112 (2016)
F. Zappa et al., "Principles and features of single-photon avalanche diode arrays", Sensors and Actuators A 140, 103-412 (2007)

What is claimed is:

1. A monolithic CMOS integrated pixel detector with a pixel size L for the detection of electromagnetic radiation configured for backside illumination, comprising a thin silicon readout wafer made from silicon of a first doping type with a front side and a backside, comprising a CMOS pixel readout electronics on the front side and highly doped regions of a second doping type acting as charge collectors spaced at the pixel size L which communicate with the readout electronics;
    said thin silicon readout wafer being bonded on the backside by covalent bonds to an absorber wafer made from at least one single crystal semiconductor material of the first doping type, the absorber wafer also comprising highly doped regions of the second doping type; the monolithic CMOS integrated pixel detector comprises the thin silicon readout wafer bonded, in an aligned manner, to the absorber wafer; wherein said covalent bonds comprise conducting covalent bonds providing ohmic contacts between said highly doped regions of the second doping type of the readout wafer and said highly doped regions the second doping type of the absorber wafer and poorly conducting covalent bonds between the readout wafer and the absorber wafer, the poorly conducting covalent bonds electrically isolating neighboring pixels to force charges generated in the absorber wafer to cross the ohmic contacts and to be received by said charge collectors for processing by the pixel readout electronics.

2. The monolithic CMOS integrated pixel detector of claim 1, wherein the poorly conducting covalent bonds between the thin silicon readout wafer and the absorber wafer are bonds between regions at least one of which is a highly resistive or insulating region and wherein the poorly conducting covalent bonds have a resistance exceeding that of the conducting covalent bonds at least by a factor selected from one of the group of ranges of factors consisting of $10^3$-$10^4$, $10^4$-$10^6$ and $10^6$-$10^8$.

3. The monolithic CMOS integrated pixel detector of claim 1, wherein the thin silicon readout wafer has a thickness selected from one of the group of thicknesses consisting of 10-30 µm, 5-10 µm and 3-5 µm.

4. The monolithic CMOS integrated pixel detector of claim 1, wherein highly doped regions of the thin silicon readout wafer and highly doped regions of the absorber wafer form said conducting covalent bonds and have a doping range selected from one of the group of doping ranges consisting of $1\times10^{18}$-$1\times10^{19}$ cm$^{-3}$, $1\times10^{19}$-$1\times10^{20}$ cm$^{-3}$ and $1\times10^{20}$-$5\times10^{20}$ cm$^{-3}$ so that defects at the bonding interface are located in highly doped regions.

5. The monolithic CMOS integrated pixel detector of claim 1, further including wafer alignment features selected from one of the group of features consisting of wafer notches, wafer flats and alignment marks.

6. The monolithic CMOS integrated pixel detector of claim 1 adapted for the detection of X-rays.

7. The monolithic CMOS integrated pixel detector of claim 6, wherein the pixel size is a size selected from one of the group of pixel sizes consisting of 100-200 µm, 50-100 µm, 20-50 µm and 5-20 µm.

8. The monolithic CMOS integrated pixel detector of claim 7, wherein a material of the at least one single crystal semiconductor material of the absorber wafer is selected from one of the group of materials consisting of Si, Ge, diamond, SiC, GaAs, CdTe and CdZnTe alloys.

9. The monolithic CMOS integrated pixel detector of claim 8, wherein the at least one single crystal semiconductor material of the absorber wafer is an epitaxial wafer comprising an epitaxial layer on a single crystal substrate.

10. The monolithic CMOS integrated pixel detector of claim 9, wherein the single crystal substrate is a substrate made from one of the group of materials consisting of Si, Ge, GaAs and InSb.

11. The monolithic CMOS integrated pixel detector of claim 10, wherein the epitaxial layer is a CdTe or a $Cd_{1-x}Zn_xTe$ alloy layer with x in the range of 5-15%.

12. The monolithic CMOS integrated pixel detector of claim 10, wherein the epitaxial layer is a layer with a Ge content x in the range of $0.7 \leq x \leq 0.9$.

13. The monolithic CMOS integrated pixel detector of claim 1 adapted for the detection of infrared radiation.

14. The monolithic CMOS integrated pixel detector of claim 13, wherein the pixel size is in the range of 2-40 µm.

15. The monolithic CMOS integrated pixel detector of claim 14, wherein the at least one single crystal semiconductor material of the absorber wafer is made of at least one of the group of materials consisting of Si, Ge, SiGe alloys, SiGeSn alloys, InAs, InGaAs alloys, InSb, and HgCdTe alloys.

16. The monolithic CMOS integrated pixel detector of claim 15, wherein the at least one single crystal semiconductor material of the absorber wafer is an epitaxial wafer comprising at least one epitaxial layer on a single crystal substrate.

17. The monolithic CMOS integrated pixel detector of claim 16, wherein the at least one epitaxial layer is an alloy layer selected from one of the group of alloy layers consisting of a SiGe, SiGeSn, InGaAs and HgCdTe alloy layer.

18. The monolithic CMOS integrated pixel detector of claim 15, wherein the absorber wafer comprises a charge multiplication layer.

19. The monolithic CMOS integrated pixel detector of claim 1, wherein an at least one alignment feature of the readout wafer superimposed on an at least one alignment feature of the absorber wafer which causes the rotational misalignment of the two wafers to be within about 0.1 to 0.2 degrees, and the lateral displacement within about 200-400 µm.

20. The monolithic CMOS integrated pixel detector of claim 1, wherein an at least one alignment feature of the readout wafer superimposed on an at least one alignment feature of the absorber wafer causes the rotational misalignment of 200 mm wafers to be within about $(2-5)\times10^4$ degrees and the lateral misalignment within about 0.5-1 µm.

21. The monolithic CMOS integrated pixel detector of claim 1, wherein the second doping type is of an opposite doping type to that of the first doping type.

22. The monolithic CMOS integrated pixel detector of claim wherein the second doping type is of a similar doping type to that of the first doping type.

23. A method for forming a monolithic CMOS integrated pixel detector of claim 1 for the detection of electromagnetic radiation, the method comprising
   a) providing a pixel readout electronics by CMOS processing a front side of a silicon readout wafer;
   b) forming highly doped regions in the silicon readout wafer spaced at the pixel size acting as charge collectors and communicating with the pixel readout electronics;
   c) forming at least one alignment feature in the silicon readout wafer;
   d) forming an absorber wafer from at least one single crystal semiconductor material;
   e) forming highly doped regions in the absorber wafer;
   f) forming at least one alignment feature in the absorber wafer;
   g) bonding a carrier wafer on a CMOS stack of the silicon readout wafer;
   h) thinning and planarizing the silicon readout wafer to provide a thin silicon readout wafer;
   i) superimposing the at least one alignment feature of the thin silicon readout wafer and the absorber wafer;
   j) forming covalent wafer bonds comprising conducting bonds and poorly conducting bonds between the backside of the readout wafer and the absorber wafer; and
   k) partially or completely removing the carrier wafer.

24. The method of claim 23, wherein the forming of the conducting wafer bonds comprises forming covalent conducting bonds and wherein the forming of poorly conducting bonds between the readout wafer and the absorber wafer comprises forming bonds between regions at least one of which is a highly resistive or insulating region.

25. The method of claim 24, wherein the forming the absorber wafer from at least one single crystal semiconductor material comprises forming the absorber wafer adapted for X-ray detection from at least one material selected from the group of materials consisting of Si, Ge, diamond, SiC, GaAs, CdTe and CdZnTe alloys.

26. The method of claim 25, wherein forming the absorber wafer comprises forming an epitaxial layer on a single crystal substrate.

27. The method of claim 26, wherein forming the epitaxial layer on a single crystal substrate comprises forming the epitaxial layer on a substrate selected from one of the group of substrates consisting of Si, Ge, GaAs and InSb.

28. The method of claim 27, wherein forming the epitaxial layer comprises forming an epitaxial CdTe or $Cd_{1-x}Zn_xTe$ layer with x in the range of 5-15%.

29. The method of claim 27, wherein forming the epitaxial layer comprises forming an epitaxial $Si_{1-x}Ge_x$ layer with x in the range of $0.7 \leq x \leq 0.9$.

30. The method of claim 28, wherein the epitaxial layer is planarized.

31. The method of claim 24, wherein the forming of the absorber wafer from the at least one single crystal semiconductor material comprises forming the absorber wafer adapted for infrared detection from at least one material selected from the group of materials consisting of Si, Ge, SiGe alloys, SiGeSn alloys, InAs, InGaAs alloys, InSb, and HgCdTe alloys.

32. The method of claim 31, wherein forming the absorber wafer comprises forming at least one epitaxial layer on a single crystal substrate.

33. The method of claim 32, wherein forming the at least one epitaxial layer on a single crystal substrate comprises forming the epitaxial layer on one substrate selected from one of the group of substrates consisting of Si, Ge, GaAs, InSb, CdTe and CdZnTe.

34. The method of claim 33, wherein forming the at least one epitaxial layer is a layer selected from one of the group of layers consisting of SiGe, SiGeSn, InGaAs and HgCdTe alloy layers.

35. The method of claim 34, wherein forming the at least one epitaxial layer comprises forming a charge multiplication layer.

36. The method of claim 26, wherein forming the monolithic CMOS integrated pixel detector includes removing the single crystal substrate.

37. The method of claim 23, wherein forming the monolithic CMOS integrated pixel detector further includes forming a metallic back contact.

38. The method of claim 29, wherein the epitaxial layer is planarized.

* * * * *